United States Patent
Futase

(10) Patent No.: US 10,297,312 B1
(45) Date of Patent: May 21, 2019

(54) RESISTIVE MEMORY CELL PROGRAMMED BY METAL ALLOY FORMATION AND METHOD OF OPERATING THEREOF

(71) Applicant: SANDISK TECHNOLOGIES LLC, Plano, TX (US)

(72) Inventor: Takuya Futase, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/833,192

(22) Filed: Dec. 6, 2017

(51) Int. Cl.
*G11C 13/00* (2006.01)
*H01L 45/00* (2006.01)
*H01L 27/24* (2006.01)

(52) U.S. Cl.
CPC ...... *G11C 13/0009* (2013.01); *G11C 13/0007* (2013.01); *G11C 13/0011* (2013.01); *G11C 13/0033* (2013.01); *G11C 13/0069* (2013.01); *H01L 27/2463* (2013.01); *H01L 45/08* (2013.01); *H01L 45/1253* (2013.01); *H01L 45/146* (2013.01); *G11C 2013/0083* (2013.01); *G11C 2213/32* (2013.01); *G11C 2213/72* (2013.01); *H01L 27/2409* (2013.01)

(58) Field of Classification Search
CPC .......................... G11C 13/0011; H01L 45/146
USPC .......................................................... 365/148
See application file for complete search history.

(56) References Cited

U.S. PATENT DOCUMENTS

| | | | |
|---|---|---|---|
| 5,915,167 A | 6/1999 | Leedy | |
| 7,426,128 B2 | 9/2008 | Scheuerlein | |
| 7,706,169 B2 | 4/2010 | Kumar | |
| 7,706,177 B2 | 4/2010 | Petti | |
| 9,343,507 B2 | 5/2016 | Takaki | |
| 9,627,057 B2 * | 4/2017 | Nazarian | G11C 13/0069 |
| 9,754,665 B2 | 9/2017 | Chen et al. | |
| 9,806,256 B1 * | 10/2017 | Wu | H01L 45/124 |

(Continued)

FOREIGN PATENT DOCUMENTS

| | | |
|---|---|---|
| WO | WO 2007/004843 A1 | 1/2007 |
| WO | WO 2011/008910 A1 | 1/2011 |
| WO | WO 2011/149823 A1 | 12/2011 |
| WO | WO 2011/159583 A1 | 12/2011 |
| WO | WO 2012/012261 A1 | 1/2012 |

OTHER PUBLICATIONS

Govoreanu, B. et al., "Vacancy-Modulated Conductive Oxide Resistive RAM (VMCO-RRAM): An Area-Scalable Switching Current, Self-Compliant, Highly Nonlinear and Wide On/Off-Window Resistive Switching Cell," IEDM13, pp. 256-259, 10.2.1-10.2.4, (2013).
Govoreanu, B. et al. "A-VMCO: A Novel Forming-Free, Self-Rectifying, Analog Memory Cell with Low-Current Operation, Nonfilamentary Switching and Excellent Variability," 2015 Symposium on VLSI Technology Digest of Technical Papers, pp. T132-T133, (2015).

(Continued)

*Primary Examiner* — Son L Mai
(74) *Attorney, Agent, or Firm* — The Marbury Law Group, PLLC

(57) ABSTRACT

A resistive memory cell includes a barrier layer containing at least one of silicon and germanium, and a metal oxide layer including an oxide of a metal element that provides a reversible chemical reaction under a bidirectional electrical bias at an interface with the barrier material layer. The reversible chemical reaction is selected from a silicidation reaction between the barrier material layer and the metal element, a germanidation reaction between the barrier material layer and the metal element, oxidation of the metal element, and reduction of the metal element.

27 Claims, 34 Drawing Sheets

(56) References Cited

U.S. PATENT DOCUMENTS

| | | |
|---|---|---|
| 9,923,140 B2 * | 3/2018 | Wu .................... H01L 45/146 |
| 2007/0008773 A1 | 1/2007 | Scheuerlein |
| 2011/0016062 A1 | 1/2011 | Olsen et al. |
| 2011/0286265 A1 | 11/2011 | Mokhlesi et al. |
| 2011/0310655 A1 | 12/2011 | Kreupl et al. |
| 2013/0043455 A1 | 2/2013 | Bateman |
| 2017/0221559 A1 | 8/2017 | Chen et al. |
| 2017/0309324 A1 * | 10/2017 | Kumar ................ G11C 11/4091 |
| 2017/0309819 A1 * | 10/2017 | Wu .................... H01L 45/146 |

OTHER PUBLICATIONS

Govoreanu, B. et al. "Advanced A-VMCO Resistive Switching Memory Through Inner Interface Engineering with Wide (>$10^2$) On/Off Window, Tunable µA-Range Switching Current and Excellent Variability," 2016 Symposium on VLSI Technology Digest of Technical Papers, 2 pages, (2016).

U.S. Appl. No. 15/611,029, filed Jun. 1, 2017, SanDisk Technologies.

Subhechha, S. et al., "Extensive Reliability Investigation of a-VMCO Nonfilamentary RRAM: Relaxation, Retention and Key Differences to Filamentary Switching," IRPS 2016, pp. 6C-2-1 to 6C-2-5, (2016).

* cited by examiner

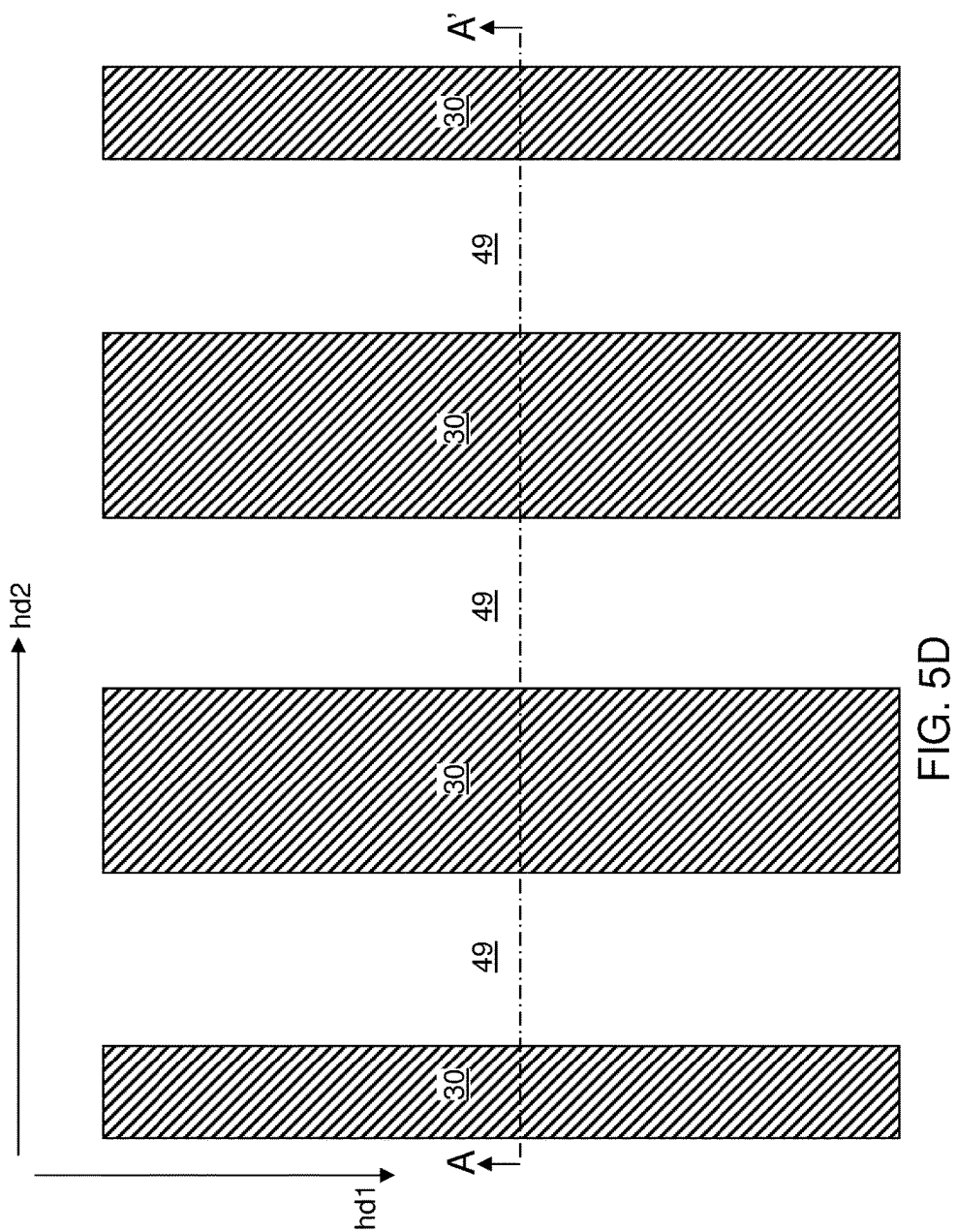

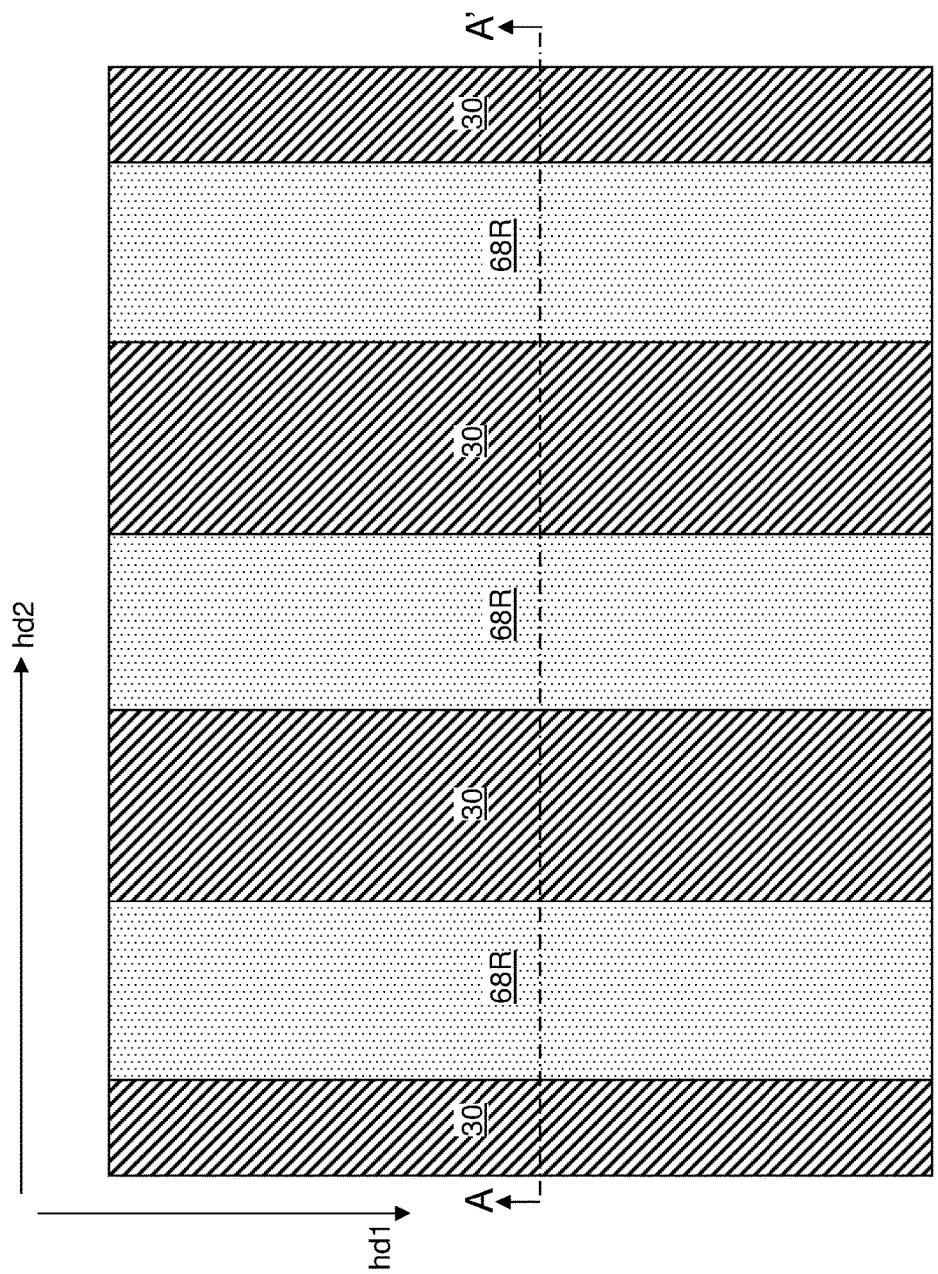

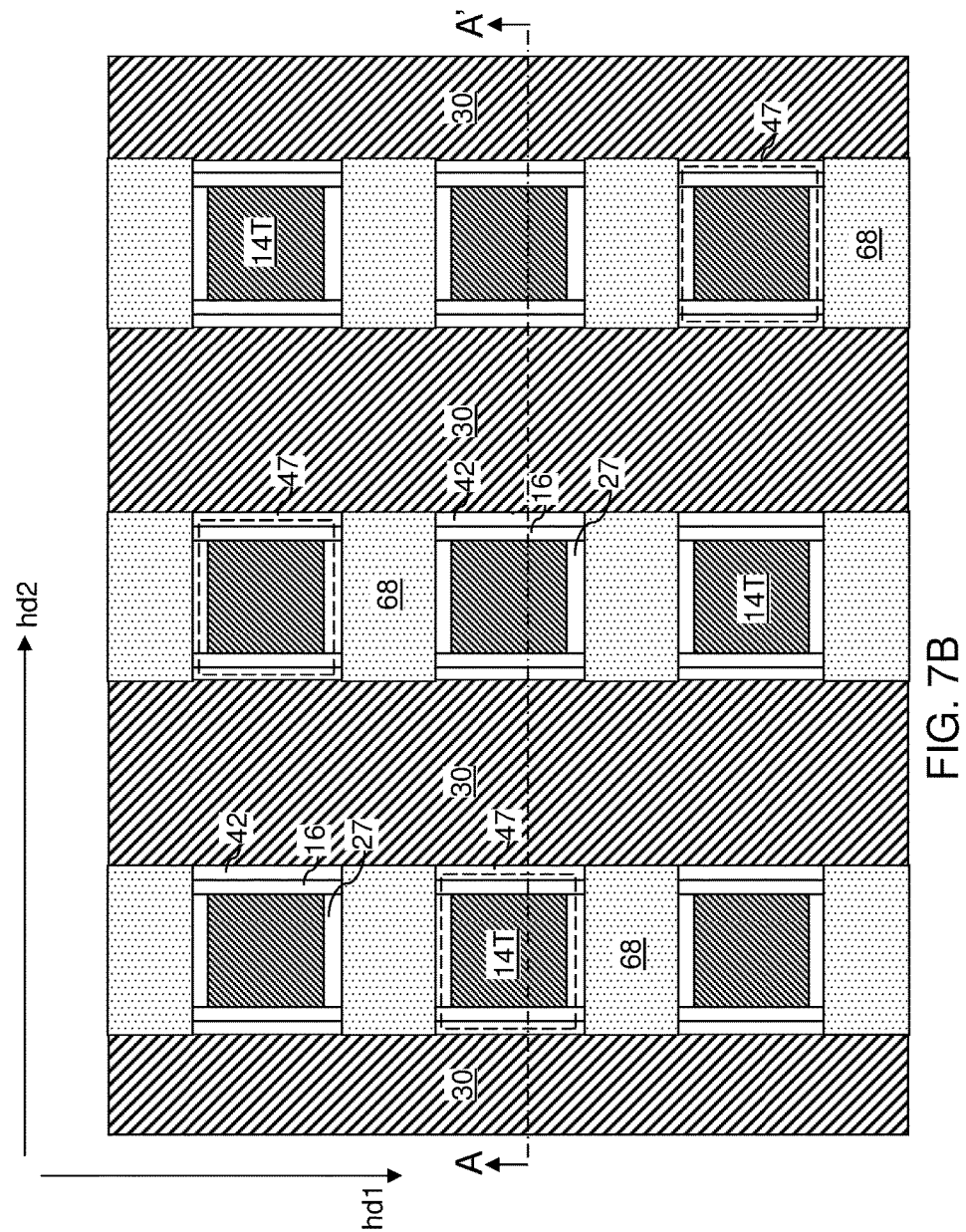

RESISTIVE MEMORY CELL PROGRAMMED BY METAL ALLOY FORMATION AND METHOD OF OPERATING THEREOF

FIELD

The present disclosure relates generally to the field of semiconductor devices and specifically to methods of programming a resistive memory element and a resistive memory cell programmed by reversible metal alloy formation.

BACKGROUND

Resistive memory devices are non-volatile memory devices employing non-volatile and reversible changes in resistance in a thin film with application of electrical voltage bias. As a "non-volatile" memory device, data stored in the resistive memory element does not change the value even when the power is turned off. In other words, the stored value of the data in any functional resistive memory device remains the same until the resistive memory element is reprogrammed, for example, in an erase operation or in a programming operation. The data stored in the non-volatile memory device can be reversed only when an electrical bias is applied in a direction that changes the resistive state of the memory device.

The resistive memory element is typically provided as a thin film, which is a solid-state material. Data can be stored in a resistive memory element by changing the resistance of the thin film. The thin film is referred to as a memory film or a read/write film. Examples of resistive random access memory (ReRAM) devices are described in World Intellectual Property Organization (WIPO) Publication No. WO2007004843 A1 to Hong et al. and U.S. Patent Application Publication No. 2013/0043455 A1 to Bateman.

SUMMARY

According to an aspect of the present disclosure, a resistive memory cell includes a barrier layer containing at least one of silicon and germanium, and a metal oxide layer including an oxide of a metal element that provides a reversible chemical reaction under a bidirectional electrical bias at an interface with the barrier material layer. The reversible chemical reaction is selected from a silicidation reaction between the barrier material layer and the metal element, a germanidation reaction between the barrier material layer and the metal element, oxidation of the metal element, and reduction of the metal element.

According to another aspect of the present disclosure, a method of operating an array of resistive memory cells comprises providing an array of resistive memory cells, wherein each resistive memory cell within the array comprises a barrier material layer containing at least one of silicon or germanium electrically connected to a respective first electrode, and a metal oxide layer including an oxide of a metal element that provides a reversible chemical reaction under a bidirectional electrical bias at an interface with the barrier material layer electrically connected to a respective second electrode, wherein the reversible chemical reaction is selected from silicidation reaction between the barrier material layer and the metal element, germanidation reaction between the barrier material layer and the metal element, oxidation of the metal element, and reduction of the metal element, performing a reset operation that induces a high resistance state on a first plurality of resistive memory cell within the array at least by applying a positive bias voltage pulse to the respective second electrode relative to the respective first electrode, and performing a set operation that induces a low resistance state on a second plurality of resistive memory cells within the array at least by applying a negative bias voltage pulse to the respective second electrode relative to the respective first electrode. At least one of an absolute value of amplitude and duration of the positive bias voltage pulses employed during the reset operation is greater than that employed during the set operation.

According to another aspect of the present disclosure, a method of operating a resistive memory cell comprising a barrier material layer containing at least one of silicon and germanium and a metal oxide layer contacting the barrier material layer comprises programming the memory cell into a high resistance reset state by applying a positive bias voltage pulse to the memory cell to generate an endothermic silicidation or germanidation forward reaction between the barrier material layer and a metal element of the metal oxide layer, and programming the memory cell into a low resistance set state by applying a negative bias voltage pulse to the memory cell to generate an exothermic reverse reaction.

BRIEF DESCRIPTION OF THE DRAWINGS

FIG. 5D is a horizontal cross-sectional view of the first exemplary structure of FIG. 5A along the horizontal plane D-D'. The vertical plane A-A' is the plane of the cross-section for FIG. 5A.

FIG. 6B is a horizontal cross-sectional view of the exemplary structure of FIG. 6A along the horizontal plane B-B'. The vertical plane A-A' is the plane of the cross-section for FIG. 6A.

FIG. 7B is a horizontal cross-sectional view of the exemplary structure of FIG. 7A along the horizontal plane B-B'. The vertical plane A-A' is the plane of the cross-section for FIG. 7A.

DETAILED DESCRIPTION

Figure 1:
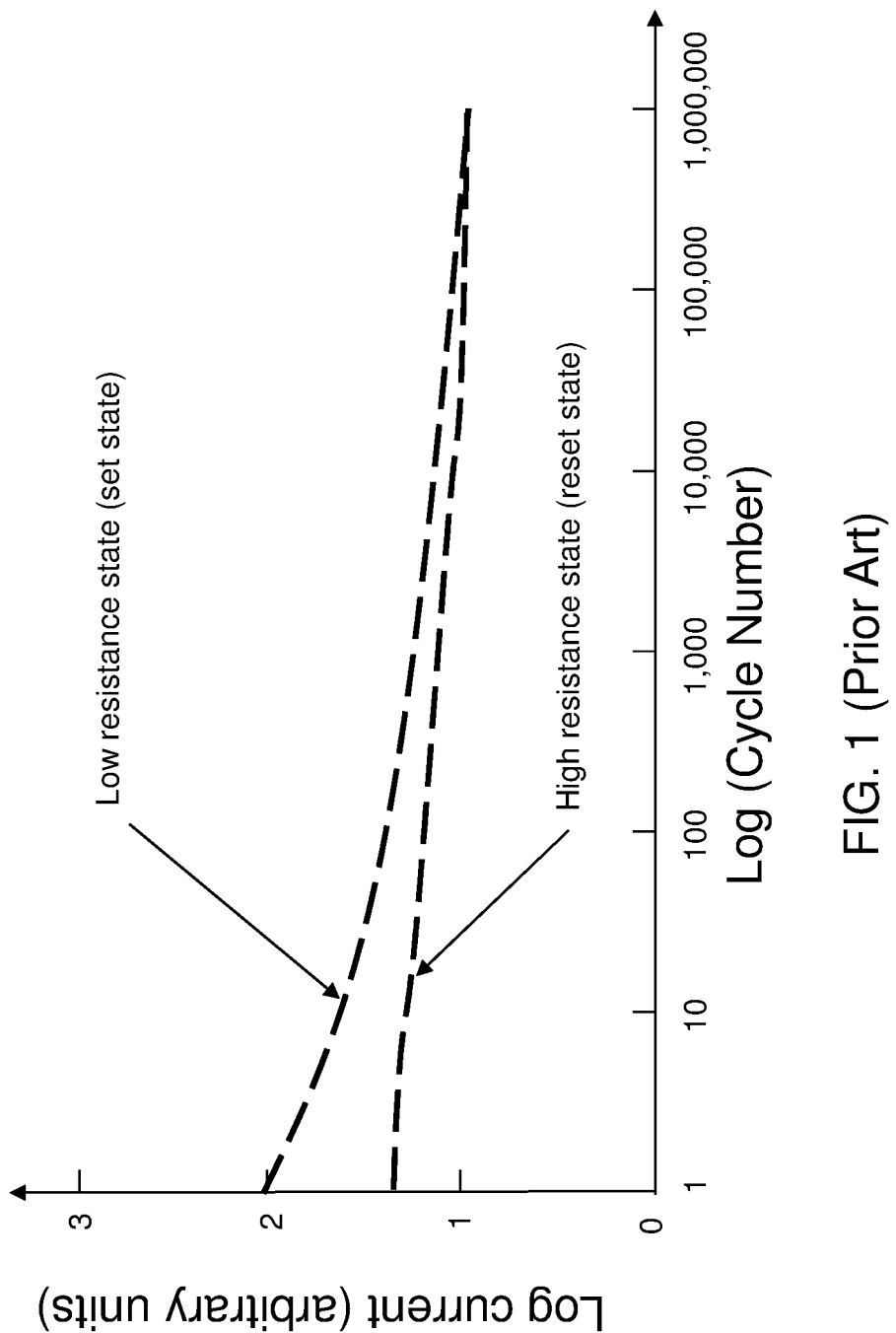
FIG. 1 is a graph schematically illustrating degradation of sense margin of a prior art resistive memory cell during cycling through set and reset operations.

As discussed above, the present disclosure is directed to methods of programming a resistive memory element and a resistive memory cell programmed by reversible metal alloy formation, the various aspects of which are described below. The embodiments of the disclosure can be employed to form various semiconductor devices including at least one memory device.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "volatile memory device" refers to memory device that does not store date for over 10 minutes when external power to the device is turned off. In one embodiment, the memory device uses a periodic refresh of stored data to maintain the value of the stored data the same during its operation.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. A "semiconducting material" refers to a material having electrical conductivity in a range from $1.0 \times 10^{-6}$ S/cm to $1.0 \times 10^5$ S/cm. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

The various three-dimensional memory devices of the present disclosure can include a memory device, such as a memory device employing a resistive memory element, and can be fabricated employing the various embodiments described herein. It is understood that a criss-cross array of memory elements that can be accessed by any access scheme can be employed for the resistive memory devices of the present disclosure, and the exemplary structures of the present disclosure are described herein merely provide non-limiting examples of implementation of the memory devices of the present disclosure.

Cycling failures of a resistive memory cell can be caused by cell breakdown, current drifts (which can be either current increase or current decrease, or window closure. Cell breakdown can be caused by high current accumulation in the cell. To prevent cell breakdown, therefore, on currents and off currents of resistive memory cells need to be reduced. Current decrease drifts can be caused by weak set pulses under weak reset pulses. Current increase drifts can be caused by strong set pulses under weak reset pulses.

Referring to FIG. 1, degradation of sense margin during cycling of a resistive memory cell is schematically illustrated. In this case, the resistance of the low resistance state drifts up, reducing the sense current for the low resistance state with continued cycling of the resistive memory cell. Incremental step pulse programming (ISPP) may avoid such cycling failures. However, ISPP has the drawback of prolonging the operation time. In addition, ISPP has not improved endurance significantly because ISPP does not address the root cause of cycling failures.

According to an aspect of the present disclosure, a method of switching the states of a resistive memory cell to enhance sense window of a programmed resistive memory cell after reset (high resistance state) programming and after set (low resistance state) programming is provided.

Figure 2:
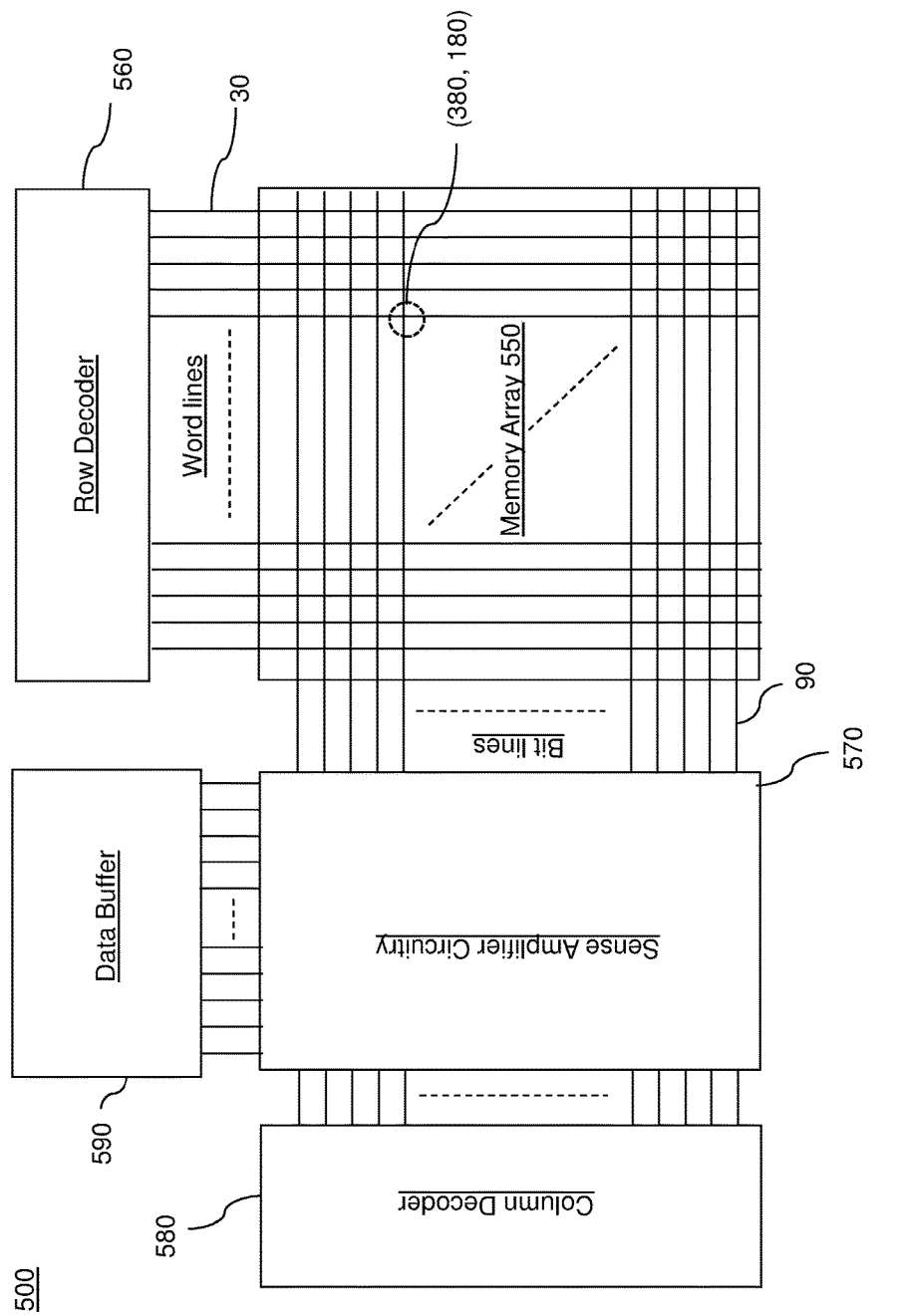
FIG. 2 is a schematic diagram of a memory device including memory cells of the present disclosure in an array configuration.

Referring to FIG. 2, a schematic diagram is shown for a resistive memory device including resistive memory cells of the present disclosure in an array configuration. The memory device can be configured as a resistive random access memory device. As used herein, a "random access memory device" refers to a memory device including memory cells that allow random access, i.e., access to any selected memory cell upon a command for reading the contents of the selected memory cell. As used herein, a "resistive random access memory device" refers to a random access memory device in which the memory cells include a resistive memory element.

The resistive memory array of FIG. 2 is a cross-point array of resistive memory elements 180, each of which is accessed by selecting a first electrically conductive line among a plurality of first electrically conductive lines 30, and by selecting a second electrically conductive line 90 among a plurality of second electrically conductive lines 90. In one embodiment, the first electrically conductive lines 30 can be word lines, and the second electrically conductive lines 90 can be bit lines.

The resistive random access memory device 500 of the present disclosure includes a memory array region 550 containing an array of the respective resistive memory elements 180 and optional selector elements 380 located at the intersection of the respective word lines 30 and bit lines 90. The device 500 may also contain a row decoder 560 connected to the word lines 30, a sense amplifier and data refresh circuitry 570 connected to the bit lines 90, a column decoder 580 connected to the bit lines 90 and a data buffer 590. Multiple instances of the resistive memory element 180 are provided in an array configuration that forms the random access memory device 500. It should be noted that the location of the elements is schematic and the elements may be arranged in a different configuration (e.g., with the word line 30 rows extending left to right in this figure and the bit line 90 columns extending top to bottom in this figure).

The sense amplifier circuitry 570 may include sense circuitry configured to measure a resistive state of each of the resistive memory elements 180 through respective bit lines. The row decoder 560 activate one of the word lines 30 at a time. The activated word line corresponds to the row of selected memory elements 180.

Figure 3:
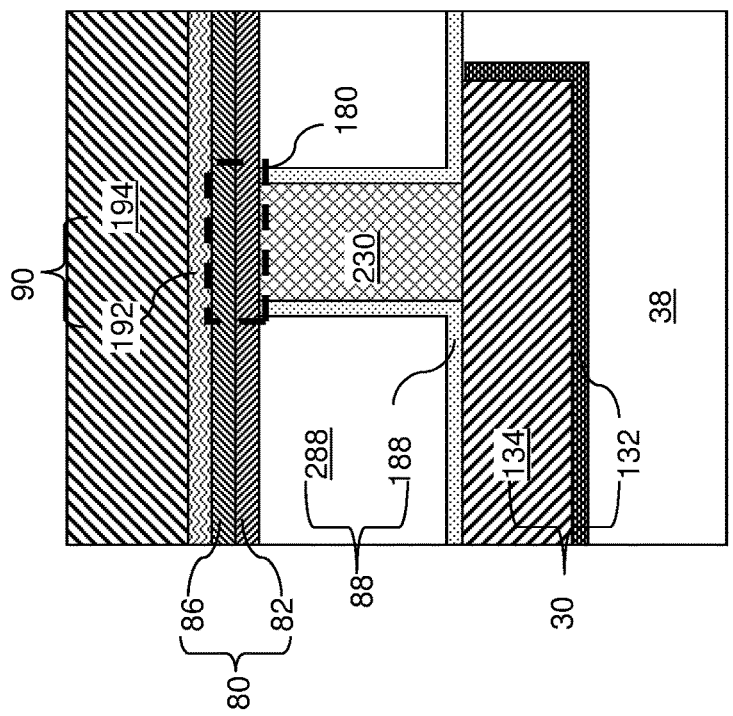
FIG. 3 is a first exemplary embodiment of the memory cell of the present disclosure.
Figure 5A:
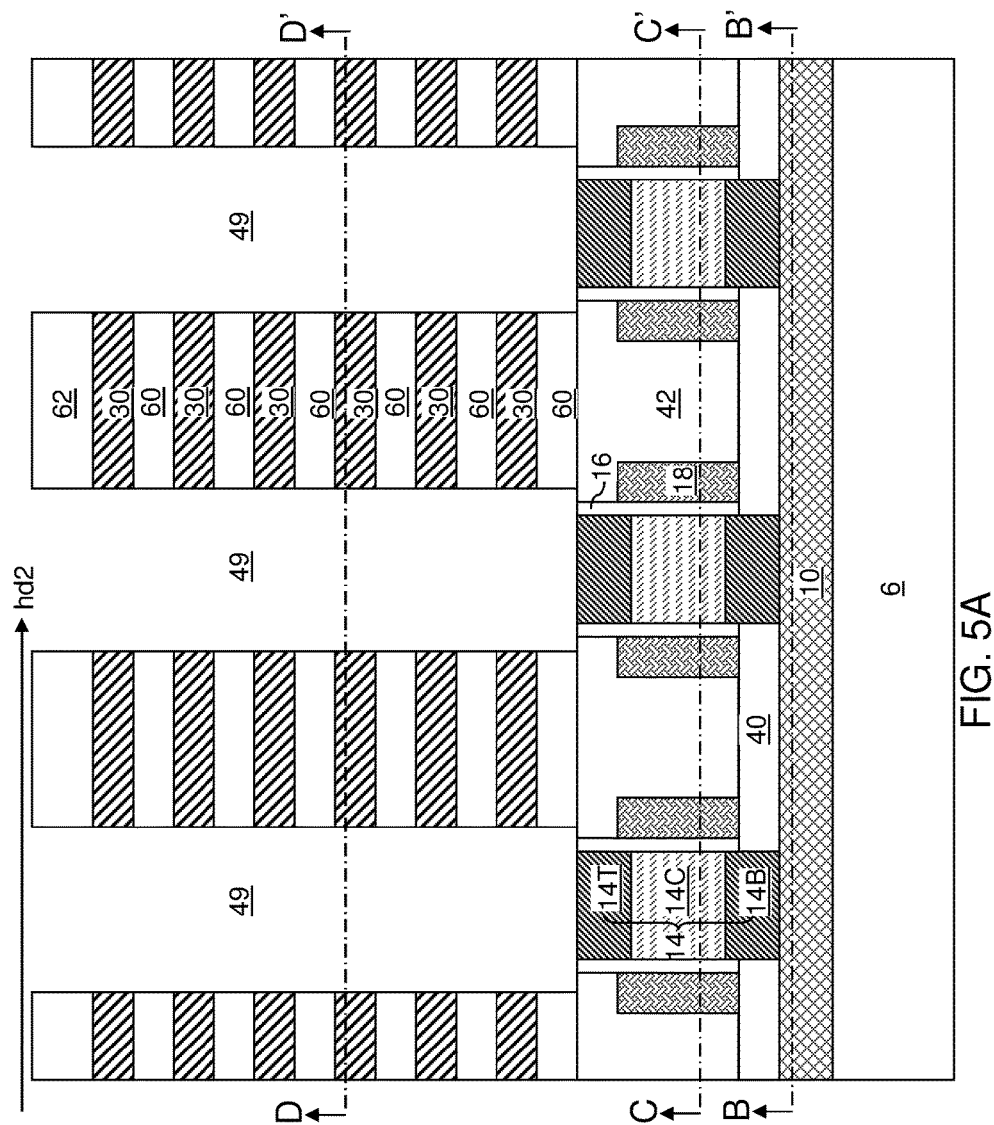
FIG. 5A is a vertical cross-sectional view of a first exemplary structure for forming a resistive random access memory device after formation of bit line access transistors, a dielectric fill layer, and a patterned alternating stack of insulating layers and conductive material layers according to an embodiment of the present disclosure.
Figure 5B:
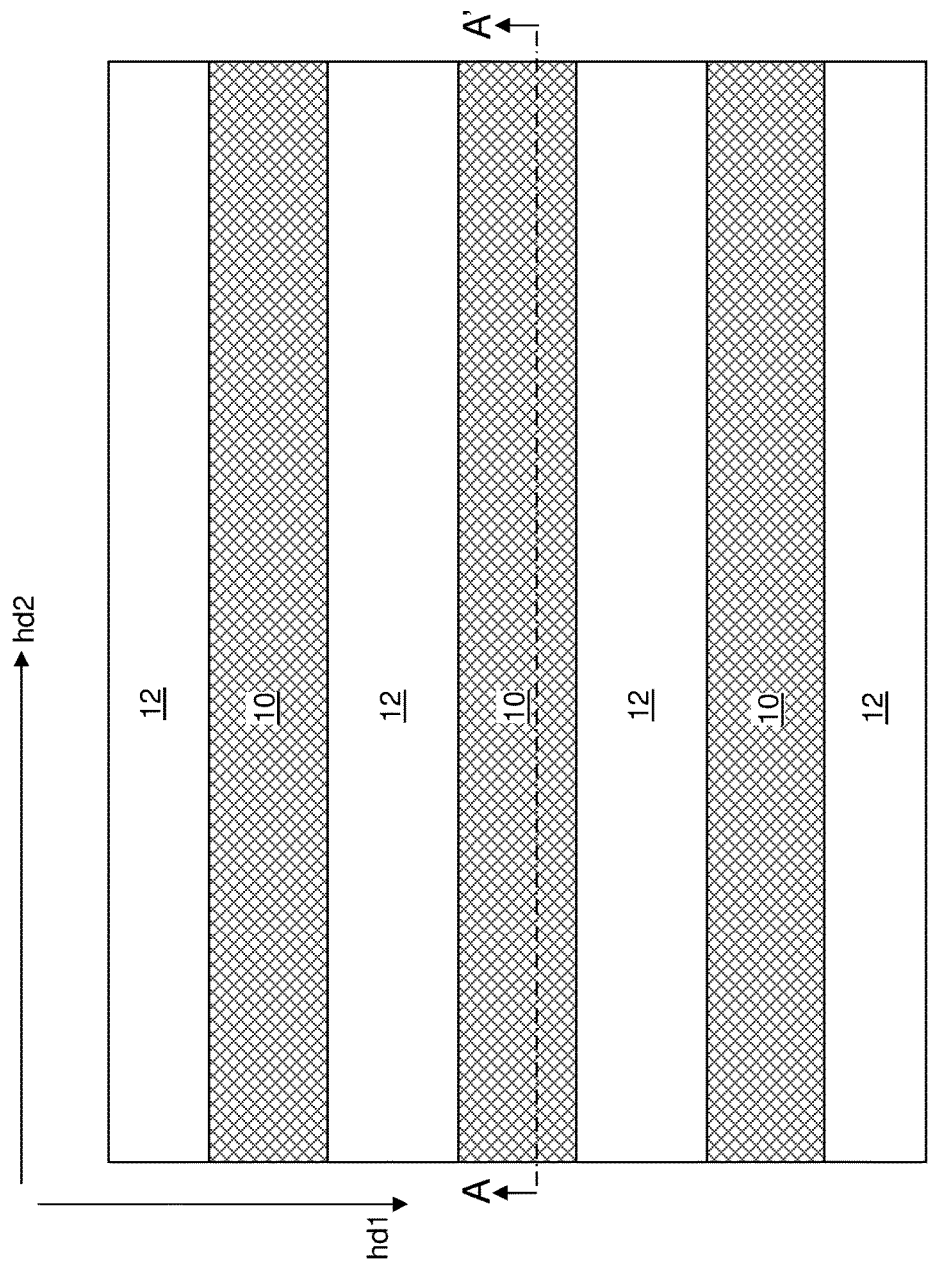
FIG. 5B is a horizontal cross-sectional view of the first exemplary structure of FIG. 5A along the horizontal plane B-B'. The vertical plane A-A' is the plane of the cross-section for FIG. 5A.
Figure 5C:
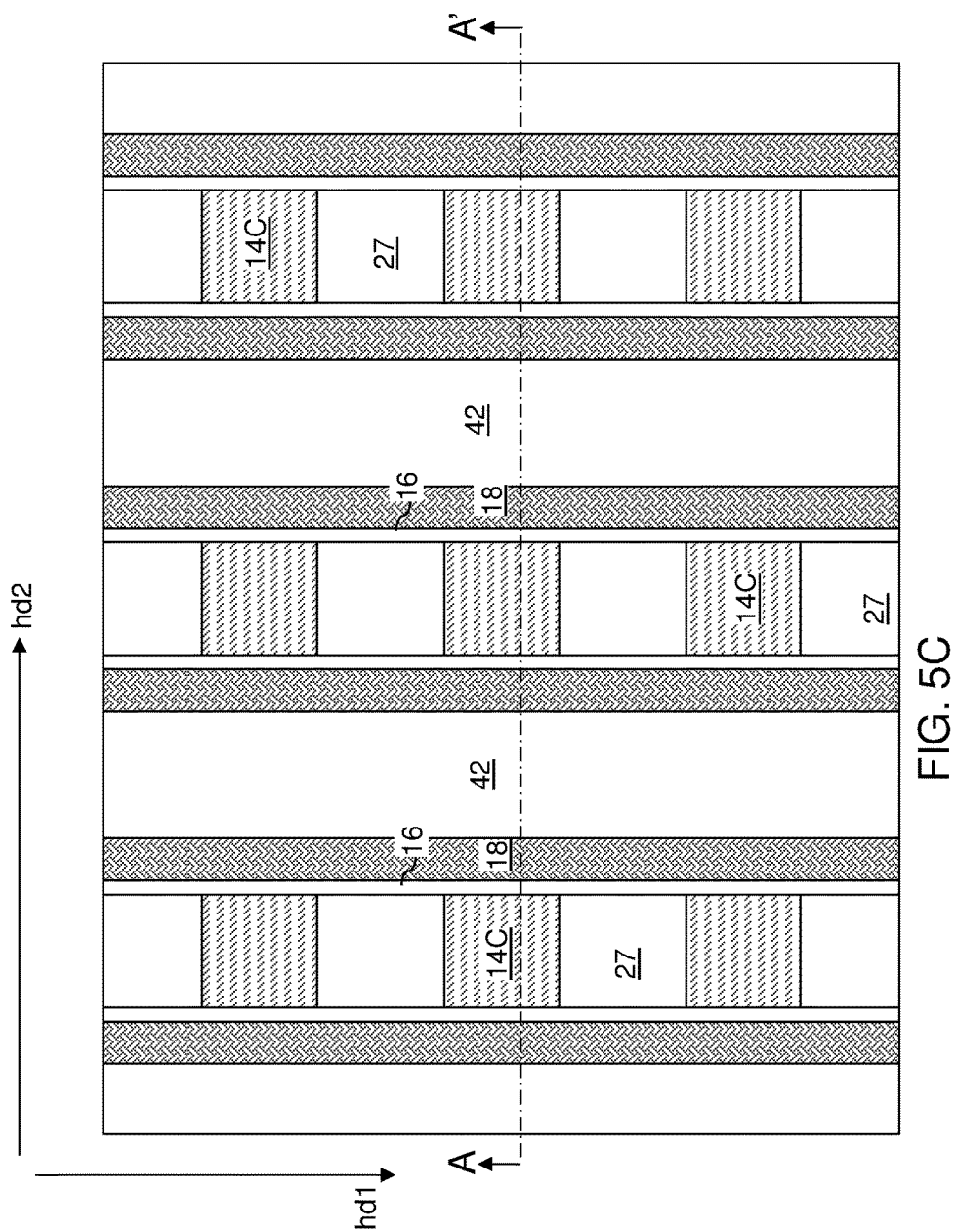
FIG. 5C is a horizontal cross-sectional view of the first exemplary structure of FIG. 5A along the horizontal plane C-C'. The vertical plane A-A' is the plane of the cross-section for FIG. 5A.

Referring to FIG. 3, a first exemplary embodiment of the memory cell of the present disclosure is illustrated. A resistive memory elements 180 of the present disclosure can be embodied as a portion of a resistive memory layer stack 80. Each resistive memory element 180 can be accessed by selecting a first electrically conductive line among a plurality of first electrically conductive lines 30 embedded in a first dielectric material layer 38, and by selecting a second electrically conductive line 90 among a plurality of second electrically conductive lines 90 embedded in a second dielectric material layer. The first dielectric material layer 38 and the second dielectric material layer are spaced from each other by a combination of a dielectric matrix layer 88 and a resistive memory layer stack 80. A two-dimensional array of conductive via structures 230 may be embedded within the dielectric matrix layer 88 at cross points at which the first electrically conductive lines 30 (e.g., word lines) intersect the second electrically conductive lines 90 (e.g., bit lines).

The first electrically conductive lines 30 can extend along a first horizontal direction, thereby forming a one-dimensional array of parallel electrically conductive lines that extend along the first horizontal direction. The first electrically conductive lines 30 can include any conductive material known in the art, such as tungsten, copper, aluminum, a conductive metal nitride, or a combination thereof. For example, each first electrically conductive line 30 can include a conductive metallic liner 132 including a conductive metallic nitride (such as TiN) and a conductive fill material portion 134 including a metal (such as W).

The second electrically conductive lines 90 can extend along a second horizontal direction that is different from the first horizontal direction. The second electrically conductive lines 90 can form a one-dimensional array of parallel electrically conductive lines that extend along the second horizontal direction. The second electrically conductive lines 90 can include any conductive material known in the art, such as tungsten, copper, aluminum, a conductive metal nitride, or a combination thereof. For example, each second electrically conductive line 90 can include a conductive metallic liner 192 including a conductive metallic nitride (such as TiN) and a conductive fill material portion 194 including a metal (such as W).

The dielectric matrix layer 88 includes at least one dielectric material. The dielectric matrix layer 88 can include an interlayer dielectric (ILD) layer 288, and optionally, a dielectric liner 188. The interlayer dielectric layer 288 includes a dielectric material such as silicon oxide or organosilicate glass. The dielectric liner 188 includes a dielectric material such as silicon nitride and/or a dielectric metal oxide.

The two-dimensional array of conductive via structures 230 can be formed by depositing a conductive material (such as W, Cu, Al, a heavily doped semiconductor material, a metal-semiconductor alloy, or combinations thereof) and patterning the conductive material into a periodic array of pillar structures. Subsequently, the optional dielectric liner 188 and the interlayer dielectric layer 288 can be deposited over the two-dimensional array of conductive via structures 230 and planarized to provide a planar surface. Alternatively, the device shown in FIG. 3 may be fabricated upside down. In this case, the second electrically conductive lines 90 and the second dielectric material layer can be formed first, and the resistive memory layer stack 80 can be formed subsequently. The interlayer dielectric layer 288 can be formed on the surface of the resistive memory layer stack 80, and can be patterned to form a two-dimensional array of via cavities therethrough. After optional deposition and an anisotropic etch of the dielectric liner 188 (of which only vertical portions remain after the anisotropic etch), the two-dimensional array of conductive via structures 230 can be formed in the two-dimensional array of via cavities.

The resistive memory layer stack 80 includes a vertical stack of a barrier material layer 82 as embodied as a planar layer and a metal oxide layer 86 as embodied as another planar layer. Each region of the resistive memory layer stack 80 that overlies or underlies a conductive via structure 230 constitutes a resistive memory element 180. The lateral spacing between each neighboring pair of conductive via structures 230 is selected such that each resistive memory element 180 is sufficiently electrically insulated from neighboring resistive memory element 180 by inherent resistivity of the materials of the resistive memory layer stack 80. In one embodiment, the ratio of the lateral spacing between a neighboring pair of resistive memory elements 180 to the total thickness of the resistive memory layer stack 80 can be in a range from 4 to 100, such as from 6 to 50.

Figure 4:
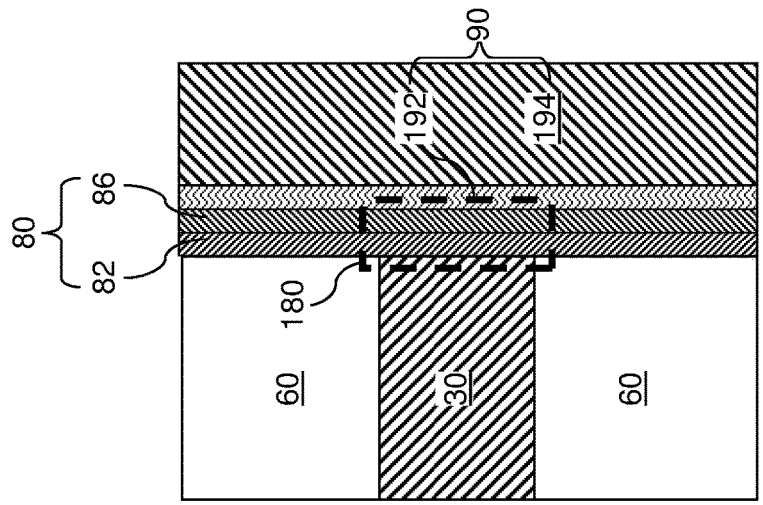
FIG. 4 is a second exemplary embodiment of the memory cell of the present disclosure.

Referring to FIG. 4, a second exemplary embodiment of the memory cell of the present disclosure is illustrated. The resistive memory elements 180 of the present disclosure can be embodied as a three-dimensional array that is accessed by selecting a word line among a plurality of word lines 30 spaced from one another by insulating layers 60, and by selecting a vertical bit line among a plurality of vertical bit lines 90. The word lines 30 and the insulating layers 60 can be formed as an alternating stack of material layers that is patterned to provide vertically coincident sidewalls. A resistive memory layer stack 80 can be formed on the sidewalls of the alternating stack (30, 60) by deposition of material layers.

The resistive memory layer stack 80 includes a lateral stack of a barrier material layer 82 as embodied as a planar layer and a metal oxide layer 86 as embodied as another planar layer. Each region of the resistive memory layer stack 80 that is located at a level of the word lines 30 constitutes a resistive memory element 180. The thickness of the insulating layers 60 is selected such that each resistive memory element 180 is sufficiently electrically insulated from neighboring resistive memory element 180 by inherent resistivity of the materials of the resistive memory layer stack 80. In one embodiment, the ratio of the thickness of the insulating layers 60 to the total thickness of the resistive memory layer stack 80 can be in a range from 4 to 100, such as from 6 to 50.

Each of the word lines 30 and the vertical bit lines 90 includes at least one conductive material. For example, each vertical bit line 90 can include a conductive metallic liner 192 including a conductive metallic nitride (such as TiN) and a conductive fill material portion 194 including a conductive metal (such as W).

According to an aspect of the present disclosure, a memory structure including a resistive memory cell 180 is provided. The resistive memory cell 180 comprises a region of a laminated structure (82, 86) including a barrier material layer 82 containing at least one of silicon and/or germanium and a metal oxide layer 86 including an oxide of a metal element that provides a reversible chemical reaction under a bidirectional electrical bias at an interface with the barrier material layer 82. As used herein, "bidirectional" means providing a first polarity voltage (e.g., positive voltage) to program the resistive memory cell 180 into a first state (e.g., reset state) and providing an opposite polarity voltage (e.g., negative voltage) to program the resistive memory cell into a second state (e.g., a set state).

The barrier material layer 82 may be silicon, germanium, silicon-germanium and alloys of silicon and/or germanium, such as silicon carbide, germanium carbide, metal silicide, metal germanide, etc. The barrier material layer 82 may be amorphous or polycrystalline. In one embodiment, the barrier material layer 82 can include the at least one Group IV element in an amorphous phase, such as amorphous silicon, amorphous germanium, and/or an amorphous alloy of two or more Group IV elements.

The barrier material layer 82 provides a suitable electronic barrier through its energy band gap structure to limit current through each resistive memory cell 180. The thickness of the barrier material layer 82 can be in a range 2 nm to 40 nm, such as from 4 nm to 20 nm, although lesser and greater thicknesses can also be employed.

The metal oxide layer 86 is selected such that the reversible chemical reaction is one of silicidation reaction between the barrier material layer 82 and the metal element, germanidation reaction between the barrier material layer 82 and the metal element, oxidation of the metal element, and reduction of the metal element. Without wishing to be bound by a particular theory, it is believed that the metal element from the metal oxide layer 86 diffuses into the barrier material layer 82 to convert at least an interface portion of the barrier material layer 82 from a semiconductor to a silicide and/or germanide. In one embodiment, the metal element of the metal oxide in the metal oxide layer 86 can be selected from titanium, cobalt, nickel, and vanadium. The thickness of the metal oxide layer 86 can be in a range from 3 nm to 60 nm, such as from 6 nm to 30 nm, although lesser and greater thicknesses can also be employed.

In one embodiment, the metal oxide layer 86 may be an insulating material, semiconducting material or electrically conductive material such as cobalt oxide, nickel oxide, vanadium oxide, stoichiometric titanium dioxide ($TiO_2$) or a slightly sub-stoichiometric metal oxide such as $TiO_{2-x}$, where value of x can be independently selected from greater than zero to 1 (i.e., to form a sub-stoichiometric, oxygen-deficient metal oxide).

In case of silicidation, the barrier material layer 82 includes silicon atoms that combine with metal atoms in the metal oxide layer 86 to form a metal silicide. In case of germanidation, the barrier material layer 82 includes germanium atoms that combine with metal atoms in the metal oxide layer 86 to form a metal germanide. If the barrier material layer 82 includes both silicon and germanium atoms (e.g., a silicon-germanium alloy), then both silicidation and germanidation chemical reasons may be present. In case of oxidation, the barrier material layer 82 includes silicon and/or germanium that combines with oxygen atoms in the metal oxide layer to form a silicon oxide and/or germanium oxide. In case of reduction, the silicon oxide and/or germanium oxide is reduced to lose some or all oxygen during programming (e.g., to leave a depleted oxide or a substantially pure Si and/or Ge semiconductor material).

In one embodiment, the reversible chemical reaction includes a forward endothermic chemical reaction in which the memory cell 180 (e.g., the region of the laminated structure (82, 86)) transitions into a high resistance state under an electrical field from the metal oxide layer 86 toward the barrier material layer 82, and a reverse exothermic chemical reaction in which the memory cell 180 (e.g., the region of the laminated structure (82, 86)) transitions into a low resistance state under an electrical field from the barrier material layer 82 to the metal oxide layer 86. The direction of the electrical field from the metal oxide layer 86 toward the barrier material layer 82 is herein referred to as a forward electrical field direction or a forward bias direction, and the direction of the electrical field from the barrier material layer 82 toward the metal oxide layer 86 is herein referred to as a reverse electrical field direction or a reverse bias direction.

In one embodiment, the memory device can further include: a first electrode (such as a first electrically conductive line 30) electrically connected to the barrier material layer 82 and spaced from the metal oxide layer by the barrier material layer 82, and a second electrode (such as a second electrically conductive line 90) electrically connected to the metal oxide layer 86 and spaced from the barrier material layer by the metal oxide layer 86. In some embodiments, the barrier material layer 82 may directly contact the first electrode. In some embodiments, the metal oxide layer 86 may directly contact the second electrode. Alternatively, the locations of the first and second electrodes (30, 90) can be reversed.

In one embodiment, a positive bias voltage pulse applied to the second electrode relative to the first electrode induces a high resistance state (a reset state) of the memory cell 180 (e.g., region of the laminated structure (82, 86)), and a negative bias voltage pulse applied to the second electrode relative to the first electrode induces a low resistance state (a set state) of the memory cell 180 (e.g., the region of the laminated structure (82, 86)).

In one embodiment, the barrier material layer 82 comprises, and/or consists essentially of, silicon, the metal element within the metal oxide layer 86 has a lower Gibbs energy barrier for reaction with silicon to form a metal silicide than titanium within titanium oxide has Gibbs energy barrier for reaction with silicon to form titanium silicide. In one embodiment, the metal element can be selected from cobalt, nickel, and vanadium, and the metal silicide can be cobalt silicide, nickel silicide, or vanadium silicide. In such cases, the forward chemical reaction of the reversible chemical reaction is silicidation.

In one embodiment, the barrier material layer 82 comprises, and/or consists essentially of, germanium, and the oxide of the metal element is selected from titanium oxide, cobalt oxide, nickel oxide, and vanadium oxide. In this case, the forward chemical reaction of the reversible chemical reaction is germanidation. In one embodiment, the oxide of the metal element includes nickel oxide. Since a nickel germanium alloy (i.e., nickel germanide) forms at a relatively low temperature of about 200 to 300 degrees Celsius, the power consumption is reduced and operating speed is increased.

In one embodiment, the reverse chemical reaction can be disassociation of the silicide and/or germanide into a silicon and/or germanium semiconductor barrier material layer 82. The metal from the silicide and/or germanide (e.g., Ti, Ni and/or Co) diffuses back into the metal oxide layer 86.

In some embodiments, the forward chemical reaction can be oxidation and the reverse chemical reaction can be reduction. Alternatively, the forward chemical reaction can be reduction, and the reverse chemical reaction can be oxidation.

The exemplary structures of FIGS. 3 and 4 are merely illustrative. Variations of the exemplary structures of FIGS. 3 and 4 can be employed, in which orientations of the various elements and/or the exemplary structures are rotated at an arbitrary angle. Further, the various elements of the exemplary structures can be modified provided that an array of resistive memory elements 80 accessible by selection of conductive lines is present in such modifications.

In addition to the exemplary structures illustrated in FIGS. 3 and 4, the resistive memory elements 180 of the present disclosure can be implemented in various additional embodiments. Referring to FIGS. 5A-5D, a first exemplary structure for forming a resistive random access memory device is illustrated, which can be an in-process ReRAM device. As used herein, a "prototype" structure or an "in-process" structure refers to a transient structure that is subsequently modified in the shape or composition of at least one component therein.

The first exemplary structure includes a substrate 6, which includes an insulating layer at an upper portion thereof. In one embodiment, the substrate 6 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm. In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense circuitry (e.g., sense amplifier), input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

Global bit lines 10 are formed over the substrate 6. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the second horizontal direction hd2. A one-dimensional array of the global bit lines 10 and the separator dielectric material portions 12 can extend along the first horizontal direction hd2 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel. Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to access transistors.

Bit line access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14C is a drain region). As used herein, an "active region" refers to a source region or a drain region.

The bit line access transistors can be formed by forming a semiconductor layer stack 14 including a first doped semiconductor layer for forming the bottom active regions 14B, a semiconductor channel material layer for forming the semiconductor channels 14C, and a second doped semiconductor layer for forming the top active regions 14T, which has a same type of doping as the first semiconductor layer. The semiconductor layer stack 14 is patterned employing a combination of lithographic methods and an anisotropic etch such that each patterned portion of the semiconductor layer stack 14 overlies an area of a respective global bit line 10 and is laterally spaced from one another by trenches extending along the second horizontal direction hd2. Subsequently, a dielectric material (such as silicon nitride and/or silicon oxide) is deposited in the trenches and planarized to remove the dielectric material from above rails of the semiconductor layer stack 14 that extend along the second horizontal direction hd2. The remaining portions of the semiconductor layer stack 14 and the planarized dielectric material portions constitute alternating rail structures in which rails of semiconductor layer stack 14 and rails of the planarized dielectric material extend along the second horizontal direction hd2 and alternate along the first horizontal direction hd1.

The remaining portions of the semiconductor layer stack 14 and the planarized dielectric material portions are patterned to form trenches that extend along the first horizontal direction hd1. Each patterned portion of the semiconductor layer stack 14 includes a vertical stack of a bottom active region 14B, a semiconductor channel 14C, and a top active region 14T. Each patterned portion of the dielectric material constitutes a dielectric pillar structure 27, which can be located between a pair of vertical stacks of a bottom active region 14B, a semiconductor channel 14C, and a top active region 14T that are spaced from each other along the first horizontal direction hd1. Each alternating sequence of dielectric pillar structures 27 and vertical stacks of a bottom active region 14B, a semiconductor channel 14C, and a top active region 14T that extend along the first horizontal direction hd1 forms a composite rail structure (14B, 14C, 14T, 27). The composite rail structures (14B, 14C, 14T, 27) are laterally spaced from one another along the second horizontal direction hd2. Top surfaces of the global bit lines 10 and the separator dielectric portions 12 can be physically exposed at the bottom of each trench that laterally extends along the first horizontal direction hd1.

A spacer dielectric layer 40 can be formed at the bottom the trenches by depositing a self-planarizing dielectric material (such as spin-on glass) or by filling the trenches with a dielectric material (such as organosilicate glass), planarizing the deposited dielectric material, and recessing the dielectric material selective to the dielectric pillar structures 27 and the vertical stacks of the bottom active regions 14B, the semiconductor channels 14C, and the top active regions 14T. Each spacer dielectric layer 40 can be formed over of the global bit lines 10 and the separator dielectric material portions 12 such that the top surface of the spacer dielectric layer 40 is located at a target height for placing a bottom edge of gate electrodes 18 to be subsequently formed. For example, the top surface of the spacer dielectric layer 40 can be at a level about the interface between the remaining portions of the first conductivity type semiconductor layer and the channel material layer.

The gate dielectrics 16 and the gate electrodes 18 of the access transistors can be subsequently formed, for example, by depositing a conformal gate dielectric layer (e.g., silicon oxide) and a conformal conductive material layer (e.g., heavily or degenerately doped polysilicon) in the trenches that separate the one-dimensional array of rail structures, and by anisotropically etching the conformal conductive material layer. The remaining vertical portions of the conformal conductive material layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the trenches are filled with at least one dielectric material. Excess portions of the at least one dielectric material can be removed from above the horizontal plane including the top surfaces of the rail structures (which include contiguous portions of the semiconductor layer stack 14 and the dielectric pillar structures 27 that are present between a pair of trenches) by a planarization process, which can employ, for example, chemical mechanical planarization. Each remaining portion of the deposited dielectric material in the trenches constitutes a dielectric rail structure 42.

Each dielectric rail structure 42 extends along the first horizontal direction hd1 parallel to the composite rail structures (14B, 14C, 14T, 27). Each composite rail structure (14B, 14C, 14T, 27) includes remaining portions of the semiconductor layer stack 14 and the dielectric pillar structures 27 between a neighboring pair of dielectric rail structures 42. Each dielectric rail structure 42 can have a substantially vertical bottom portion, or can have a tapered bottom portion in which the width of the dielectric rail structure 42 monotonically or strictly increases as a function of a vertical distance from the substrate 6. In one embodiment, each dielectric rail structure 42 can include at least one dielectric material such as silicon nitride and/or silicon oxide. The dielectric rail structures 42 and the composite rail structures (14T, 14C, 14B, 27) alternate along the second horizontal direction hd2.

Subsequently, an alternating stack of spacer material layers and insulating layers 60 can be formed over the one-dimensional array of the dielectric rail structures 42 and the composite rail structures (14B, 14C, 14T, 27). An insulating cap layer 62 can be formed over the alternating stack. In one embodiment, the spacer material layers can be word lines 30 that remain in a final device structure. In another embodiment, the spacer material layers can be sacrificial material layers that are subsequently replaced electrically conductive layers, as will be described in more detail below. In one embodiment, the insulating cap layer 62 can include a dielectric material that is different from the dielectric material of the insulating layers 60. For example, the insulating layers 60 can include undoped silicate glass (e.g., silicon oxide) or doped silicate glass, and the insulating cap layer 62 can include silicon nitride or a dielectric metal oxide.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

Subsequently, the insulating cap layer 62 and the alternating stack of the word lines 30 and the insulating layers 60 can be patterned to form line trenches 49 that extend along the first horizontal direction hd1. Each line trench 49 can overlie the area of a respective composite rail structure (14B, 14C, 14T, 27). Each contiguous set of remaining portions of the word lines 30 and the insulating layers 60 between a pair of line trenches 49 constitutes an alternating stack (30, 60) that is a rail structure. Each alternating stack (30, 60) overlies a respective dielectric rail structure 42, extends along the first horizontal direction hd1, and is laterally spaced apart from other alternating stacks (30, 60) along the second horizontal direction hd2. Each patterned word line 30 can constitute a word line of a resistive random access memory device. In one embodiment, each alternating stack (30, 60) can have a lesser width along the second horizontal direction hd2 than the underlying dielectric rail structure 42, and can be entirety within the area of the underlying dielectric rail structure 42.

In one embodiment, the word lines 30 comprise a first electrically conductive material. In one embodiment, the first electrically conductive material can include an elemental metal, an intermetallic alloy, and/or a conductive metal nitride.

The thickness of the word lines 30 can be in a range from 5 nm to 60 nm, although lesser and greater thicknesses can also be employed. The thickness of the insulating lines 60 can be in a range from 5 nm to 60 nm, although lesser and greater thicknesses can also be employed. The thickness of the insulating cap layer 62 can be in a range from 5 nm to 300 nm, although lesser and greater thicknesses can also be employed.

A pair of a word line 30 and an insulating layer 60 can constitute a unit of repetition in the alternating stack (30, 60) of the word lines 30 and the insulating layers 60. The total number of repetitions can be in a range from 8 to 1,024, although lesser and greater number of repetitions can also be employed. Thus, a plurality of alternating stacks (30, 60) of insulating layers 60 and word lines 30 is formed over a substrate 6. Each of the insulating layers 60 and the word lines 30 extends along the first horizontal direction (i.e., the word line direction) hd1. The alternating stacks (30, 60) are laterally spaced from one another along the second horizontal direction hd2 (i.e., the global bit line direction).

Figure 6A:
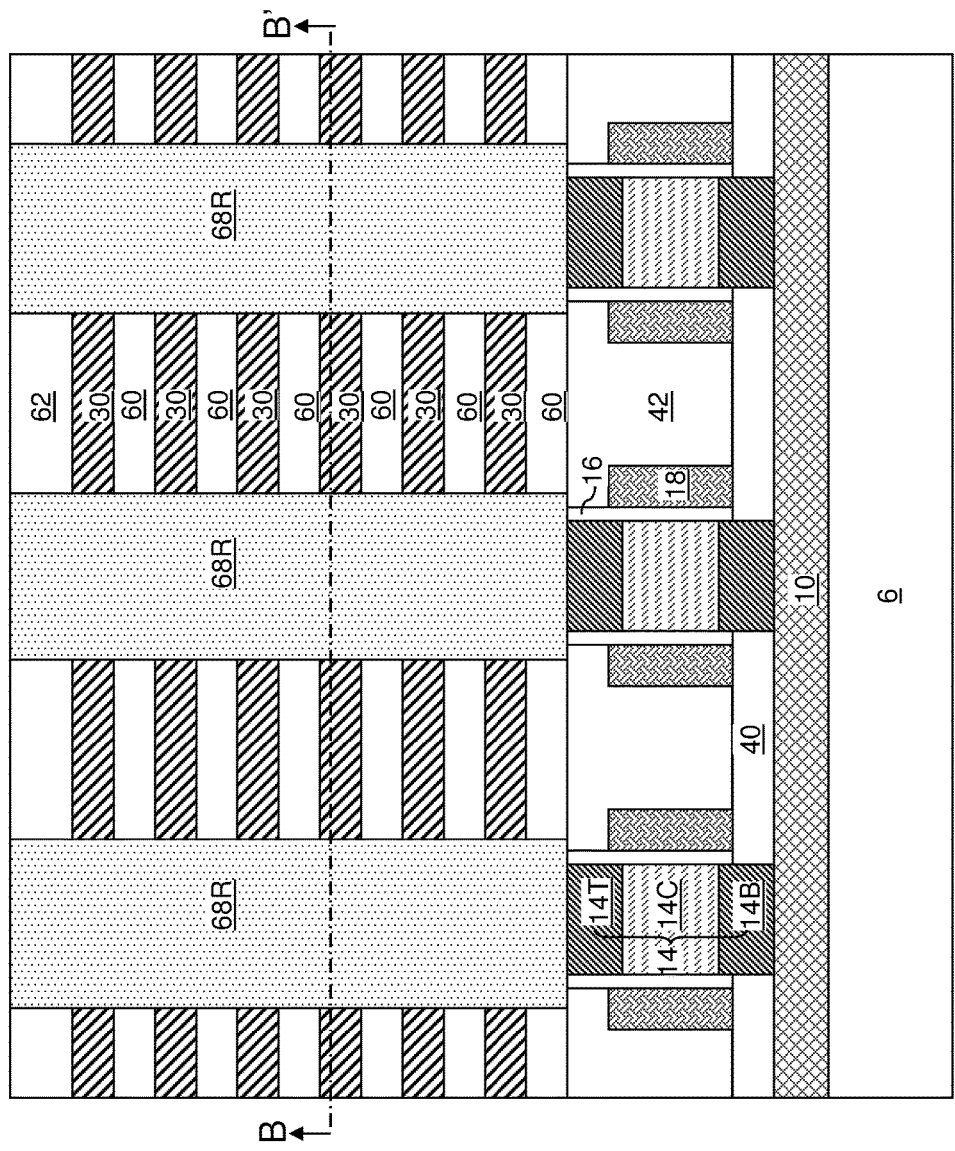
FIG. 6A is a vertical cross-sectional view of the first exemplary structure after formation of dielectric trench fill structures according to an embodiment of the present disclosure.

Referring to FIGS. 6A and 6B, a dielectric material is deposited to fill the line trenches 49. The dielectric material can be removed from above a horizontal plane including the top surfaces of the insulating cap layers 62. Each remaining portion of the dielectric material filling a line trench 49 constitutes a dielectric rail structure, which is herein referred to as separator rail structures 68R. Each separator rail structure 68R extends along the first horizontal direction hd1. The alternating stacks (30, 60) and the separator rail structures 68R can form a one-dimensional array that extends along the second horizontal direction hd2. In one embodiment, the alternating stacks (30, 60) and the separator rail structures 68R can have a periodicity that is equal to the sum of the width of an alternating stack (30, 60) and the width of a separator rail structure 68R. The separator rail structures 68R includes a dielectric material such as doped silicate glass, undoped silicate glass (e.g., silicon oxide), silicon nitride, organosilicate glass, or porous derivatives thereof. In an illustrative example, the insulating layers 60 can include undoped silicate glass (e.g., $SiO_2$) or doped silicate glass, the insulating cap layers 62 can include silicon nitride or a dielectric metal oxide, and the separator rail structures 68R can include doped silicate glass, undoped silicate glass, or organosilicate glass.

Figure 7A:
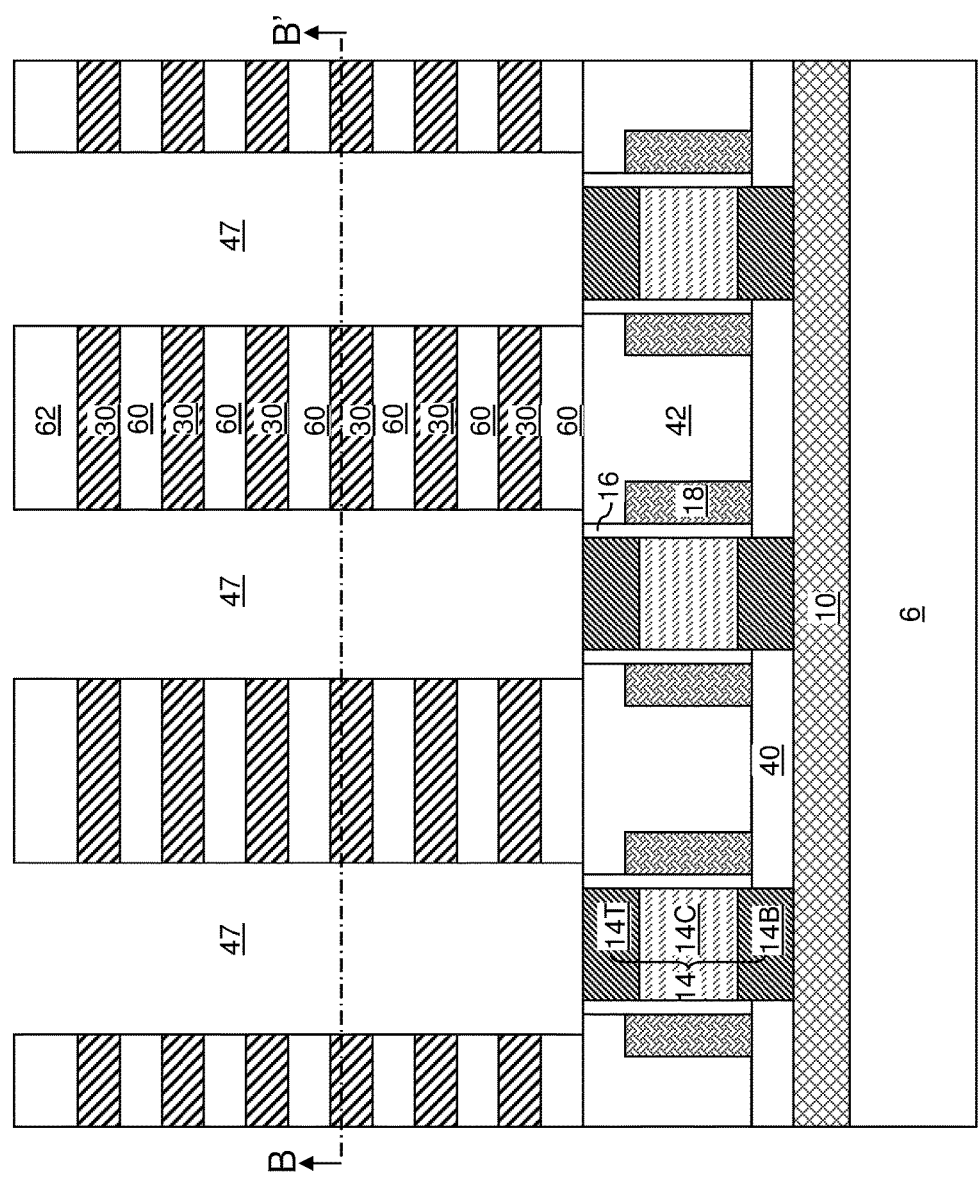
FIG. 7A is a vertical cross-sectional view of the first exemplary structure after formation of dielectric pillar structures and bit line openings according to an embodiment of the present disclosure.

Referring to FIGS. 7A and 7B, bit line cavities 47 can be formed by patterning the separator rail structures 68R into separator pillar structures 68. Specifically, a photoresist layer (not shown) can be applied over the insulating cap layers 62 and the separator rail structures 68R, and can be lithographically patterned to form linear portions that overlie areas of the separator dielectric material portions 12. Line trenches extending along the second horizontal direction hd2 and overlying areas of the global bit lines 10 are formed between remaining portions of the photoresist layer.

An anisotropic etch that removes the dielectric material of the separator rail structures 68R selective to the dielectric material of the insulating cap layers 62 can be performed to remove portions of the separator rail structures 68R that are not covered by a combination of the photoresist layer portions and insulating cap layers 62. Bit line cavities 47 having rectangular horizontal cross-sectional areas and extending through the alternating stacks (30, 60) to top surfaces of the top active regions 14T can be formed, thereby separating the separator rail structures 68R into separator pillar structures 68. The bit line cavities 47 can form a two-dimensional rectangular array. The separator pillar structures 68 can form another two-dimensional rectangular array having the same periodicity as the two-dimensional rectangular array of the bit line cavities 47.

While an embodiment in which the area of each bit line cavity 47 is greater than the area of an underlying top active region 14T, embodiments are expressly contemplated herein in which the area of each bit line cavity 47 is substantially the same as, or is less than, the area of an underlying top active region 14T. Further, the geometrical center of each bit line cavity 47 may be located on a vertical line passing through the geometrical center of an underlying vertical stack of a bottom active region 14B, a semiconductor channel 14C, and a top active region 14T, or may be laterally offset from the vertical line due to an overlay variation during the patterning processes employed to form pattern the alternating stacks (30, 60) and the separator pillar structures 68.

Figure 8A:
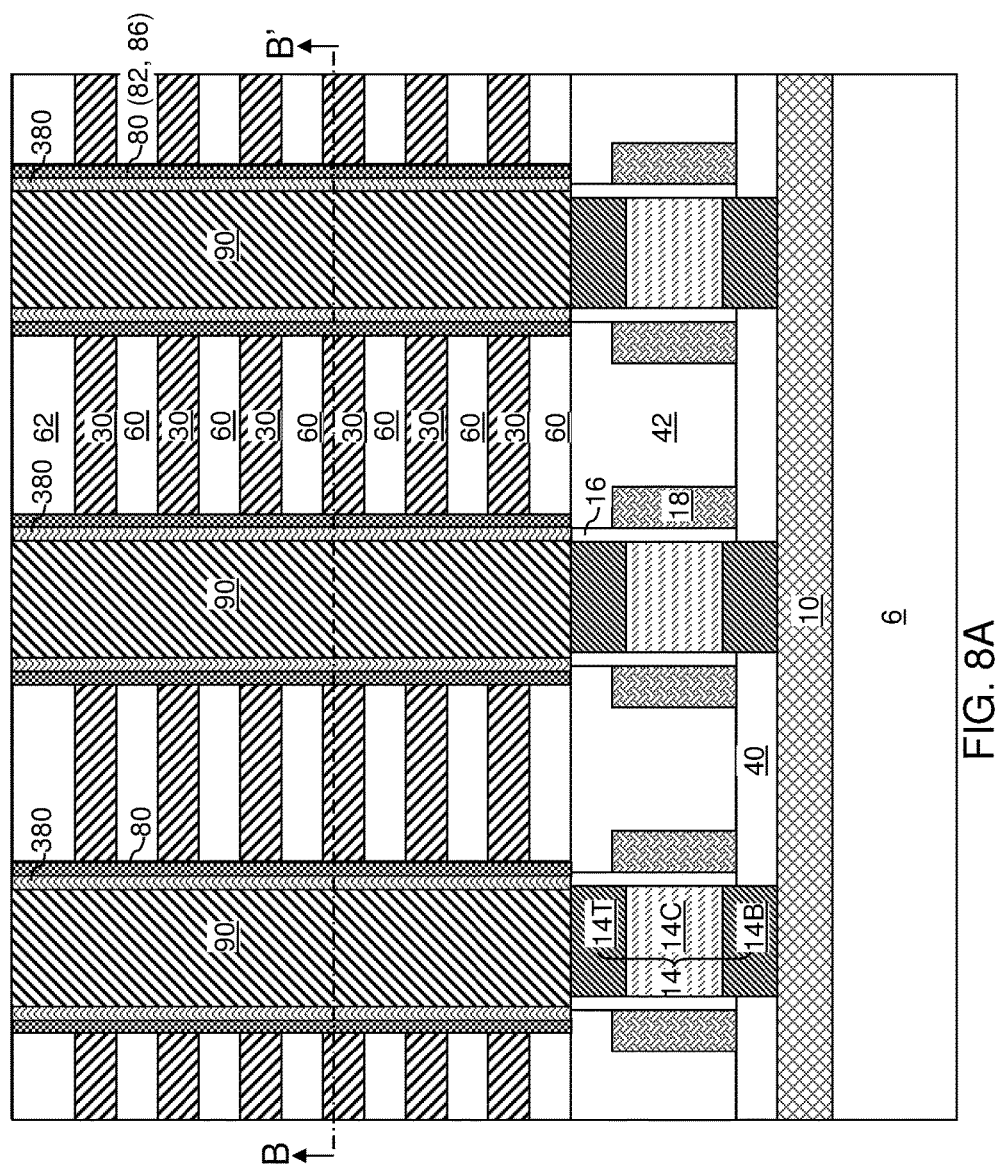
FIG. 8A is a vertical cross-sectional view of the first exemplary structure after formation of resistive memory layers and bit line structures according to an embodiment of the present disclosure.
Figure 8B:
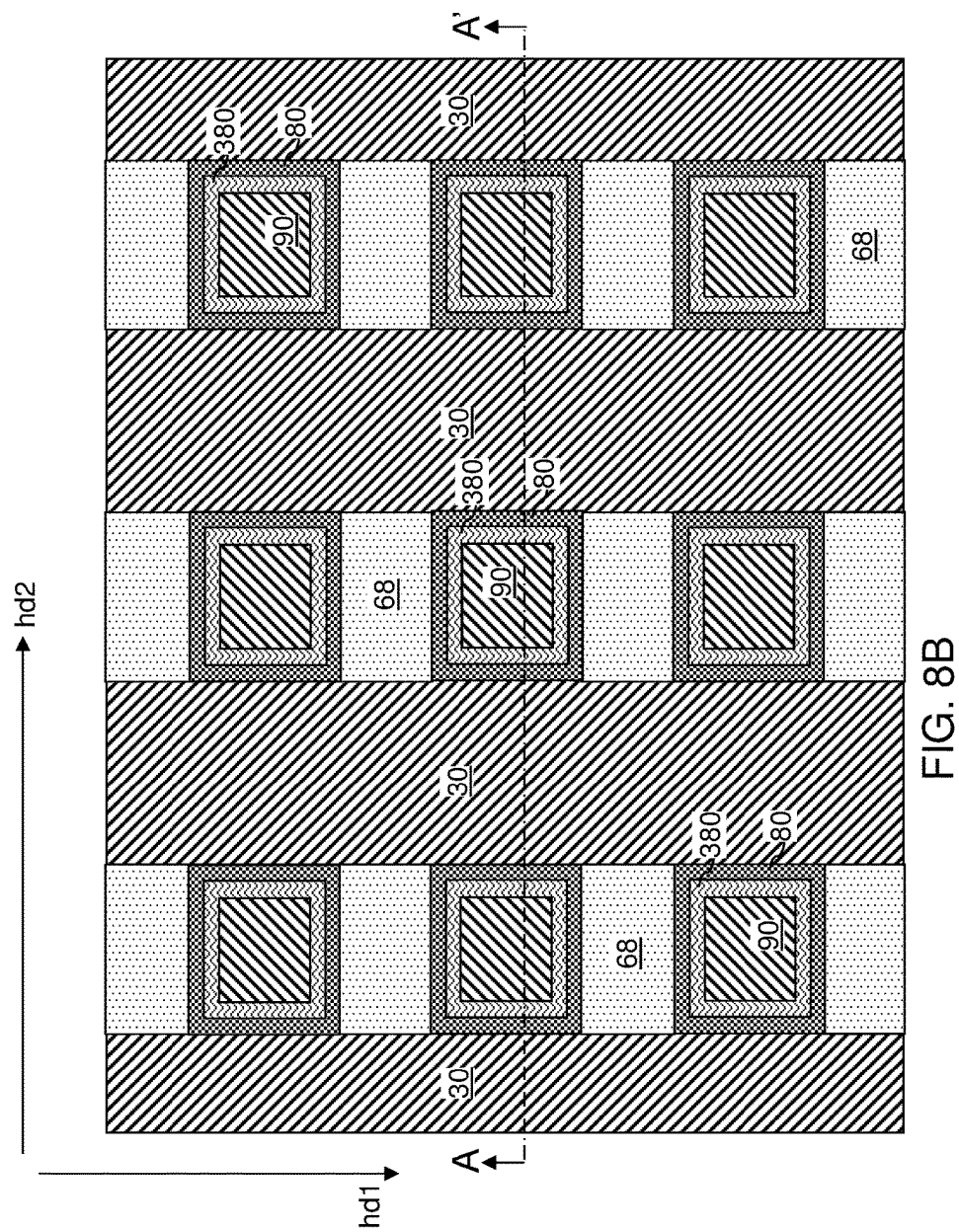
FIG. 8B is a horizontal cross-sectional view of the exemplary structure of FIG. 8A along the horizontal plane B-B'. The vertical plane A-A' is the plane of the cross-section for FIG. 8A.

Referring to FIGS. 8A and 8B, a resistive memory layer stack 80 and a selector element (i.e., a steering element) 380 can be formed on each sidewall of the bit line cavities 47. For example, a continuous resistive memory material layer and a continuous selector element layer can be deposited as continuous layers, and can be anisotropically etched to remove horizontal portions thereof. Each remaining vertical portion of the continuous resistive memory material layer constitutes a resistive memory layer stack 80, and each remaining vertical portion of the continuous selector element layer constitutes a selector element 380. The resistive memory layer stack 80 includes a lateral stack of a barrier material layer 82 as embodied as a planar layer and a metal oxide layer 86 as embodied as another planar layer as described above. The barrier material layer 82 can be the same as the barrier material layers 82 of FIGS. 3 and 4. The metal oxide layer 86 can be the same as the metal oxide layer 86 of FIGS. 3 and 4. Each resistive memory layer stack 80 can be topologically homeomorphic to a torus, and each selector element 380 can be topologically homeomorphic to a torus. As used herein, an element is "topologically homeomorphic to a torus" if the element has a geometrical shape that can be continuously stretched to match a torus without creating or destroying a new hole.

The selector element 380 is optional. Thus, depending on the configuration of specific resistive random access memory, the selector element 380 may, or may not, be present. Generally speaking, selector elements known in the art can be optionally employed in conjunction with the resistive memory layer stacks 80 of the present disclosure.

The selector elements 380, if employed, can include at least one semiconductor element that provides a non-linear current-voltage characteristic. For example, the selector element layer can include at least one diode therein. In one embodiment, each diode can include a heavily doped n-doped semiconductor region (i.e., n+ region) having n-type dopants at an atomic concentration greater than $5.0 \times 10^{19}/cm^3$, and a lightly or lighter doped p-doped semiconductor region (i.e., p- or p region) including p-type dopants at an atomic concentration less than $5.0 \times 10^{19}/cm^3$. In one embodiment, the n-doped semiconductor regions can be embodied as discrete n-doped barrier material portions. In another embodiment, the n-doped semiconductor regions can be embodied as portions of a continuous n-doped semiconductor material layer. In one embodiment, each n-doped semiconductor region can be incorporated as a portion of a second electrode.

While the present disclosure is described employing an embodiment in which the materials of the resistive memory layer stacks 80 are deposited first, and the materials of the selector elements 380 are subsequently deposited, embodiments are expressly contemplated herein in which the order of deposition of the materials is reversed. In this case, outer sidewalls of the selector elements 380 can contact sidewalls of the alternating stacks (30, 60) and sidewalls of the separator pillar structures 68, and inner sidewalls of the selector elements 380 can contact outer sidewalls of the resistive memory layer stacks 80.

At least one conductive material is deposited in each remaining volume of the bit line cavities 47 to form vertical bit lines 90 (e.g., local bit lines). The at least one conductive material can include an elemental metal (e.g., W, Ti, etc.), an intermetallic alloy, a conductive doped semiconductor material, and/or a conductive compound including at least one metal and at least one non-metal element such as a conductive metal nitride (e.g., TiN). Excess portions of the at least one conductive material can be removed from above the top surface of the insulating cap layers 62, for example, by a planarization process (such as chemical mechanical planarization and/or a recess etch).

The word lines 30 and the global bit lines 10, and optionally, the vertical bit lines 90 can be suitably electrically wired for operation as a resistive random access memory device.

Figure 9A:
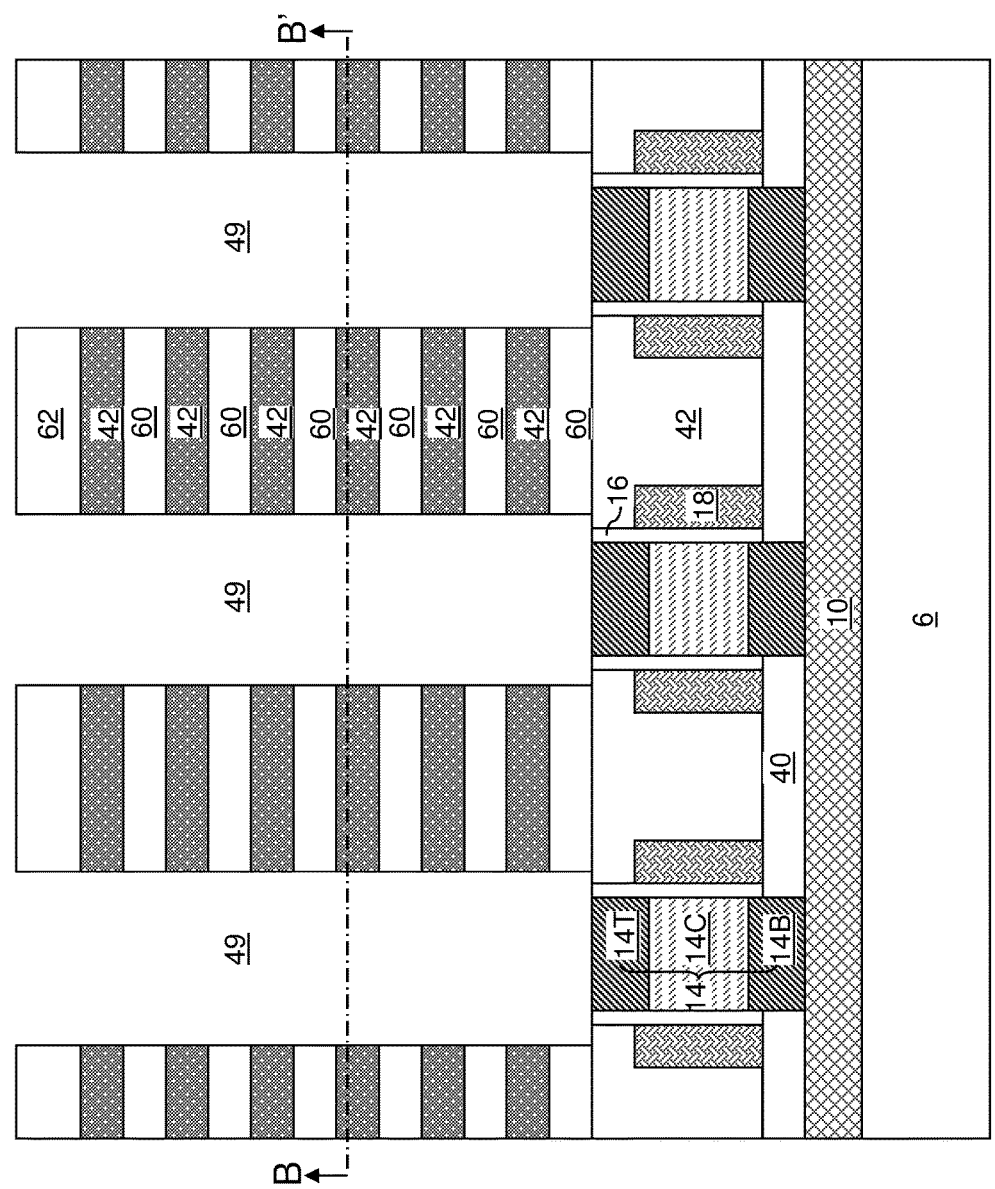
FIG. 9A is a vertical cross-sectional view of a second exemplary structure for forming a resistive random access memory device after formation of bit line access transistors, a dielectric fill layer, and a patterned alternating stack of insulating layers and sacrificial material layers according to an embodiment of the present disclosure.
Figure 9B:
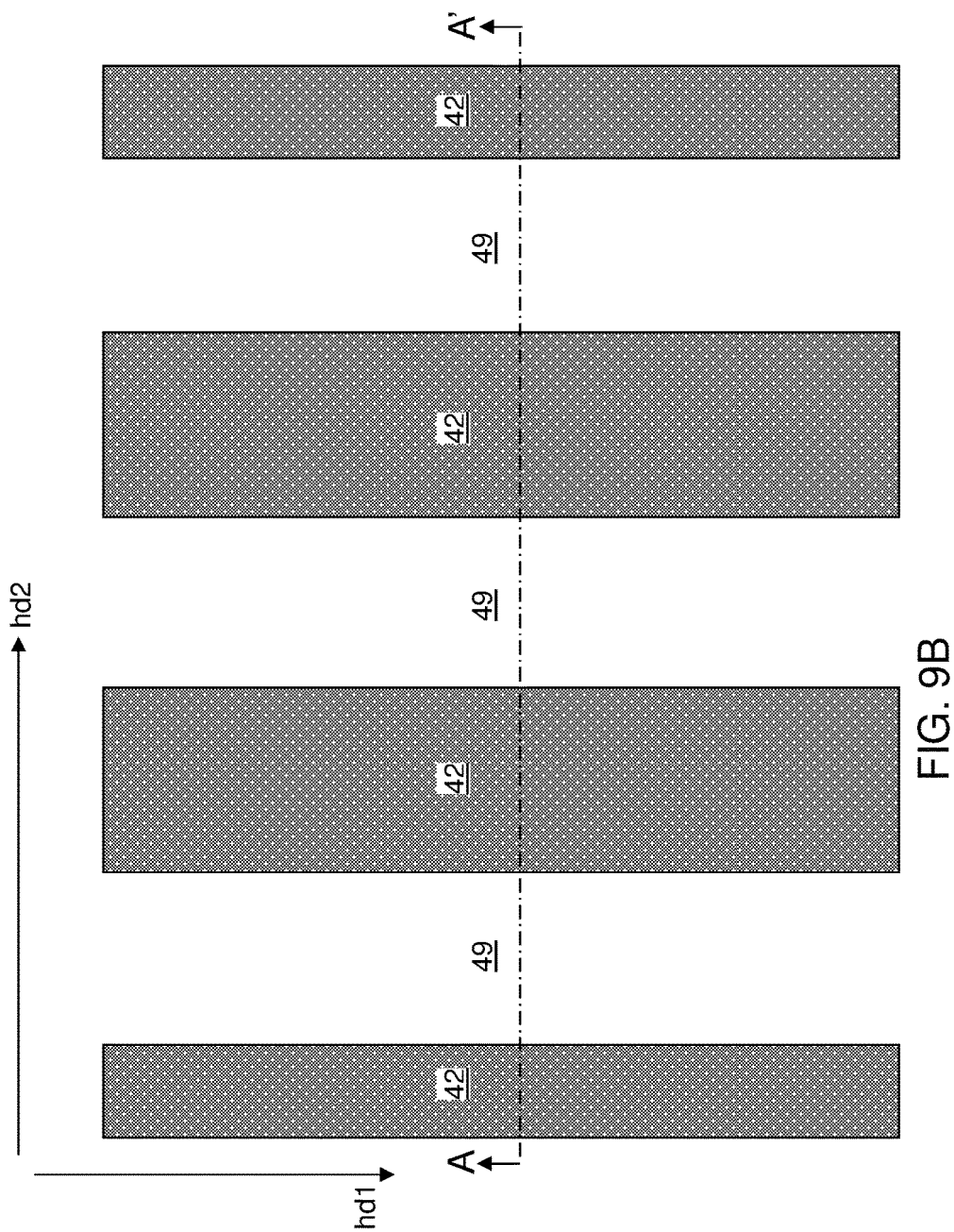
FIG. 9B is a horizontal cross-sectional view of the second exemplary structure of FIG. 9A along the horizontal plane B-B'. The vertical plane A-A' is the plane of the cross-section for FIG. 9A.

Referring to FIGS. 9A and 9B, a second exemplary structure according to an embodiment of the present disclosure can be derived from the first exemplary structure of FIGS. 5A-5D by replacing the word lines 30 with sacrificial material layers 42. The sacrificial material layers 42 have a different composition than the insulating layers 60 and the insulating cap layers 62 (as patterned from a continuous blanket layer into multiple insulating cap layers 62 upon formation of the line trenches 49). In one embodiment, the sacrificial material layers 42 can include germanium, a silicon-germanium alloy, amorphous or polycrystalline silicon, or silicon nitride. In case the sacrificial material layers 42 include silicon nitride, the insulating layers 60 and the insulating cap layers 62 can include undoped silicate glass (e.g., silicon oxide), and the separator pillar structures 68 to be subsequently formed can include organosilicate glass or doped silicate glass.

Figure 10A:
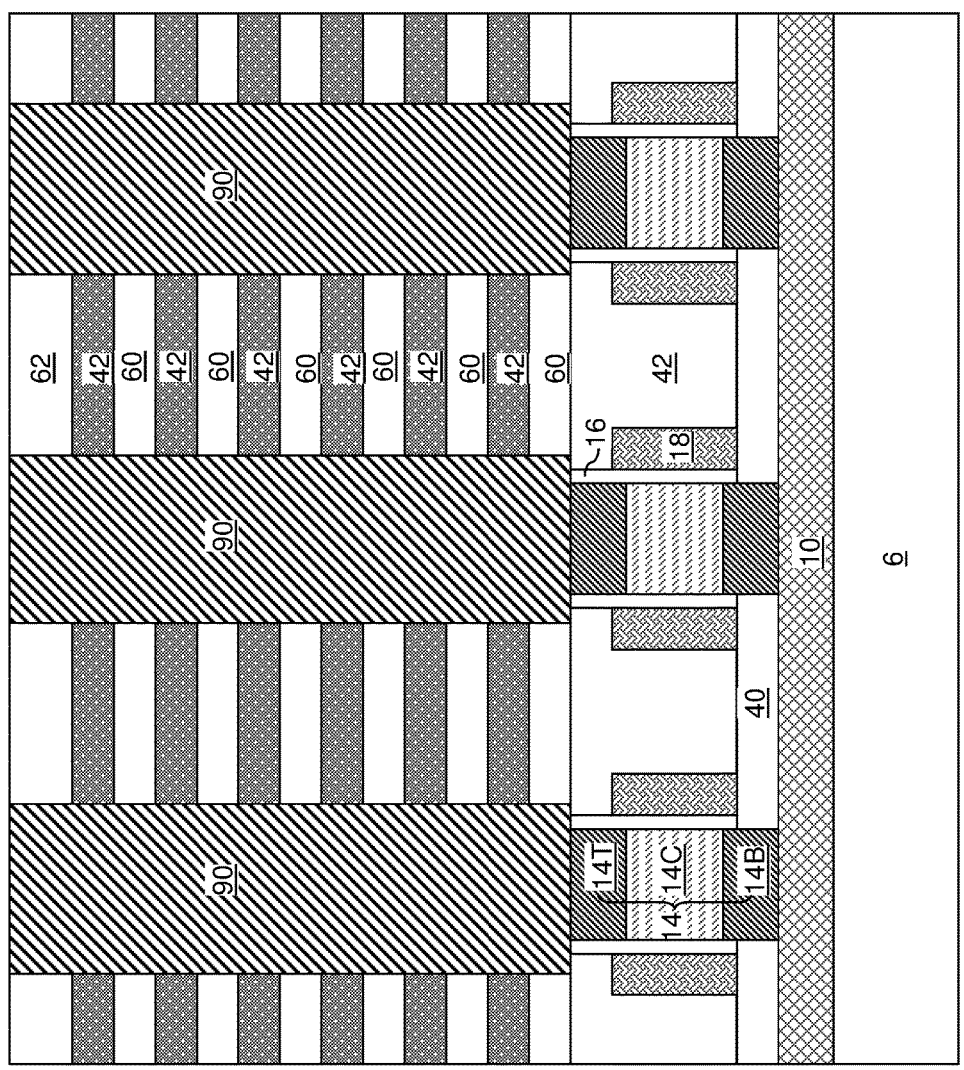
FIG. 10A is a vertical cross-sectional view of the second exemplary structure after formation of bit line structures according to an embodiment of the present disclosure.
Figure 10B:
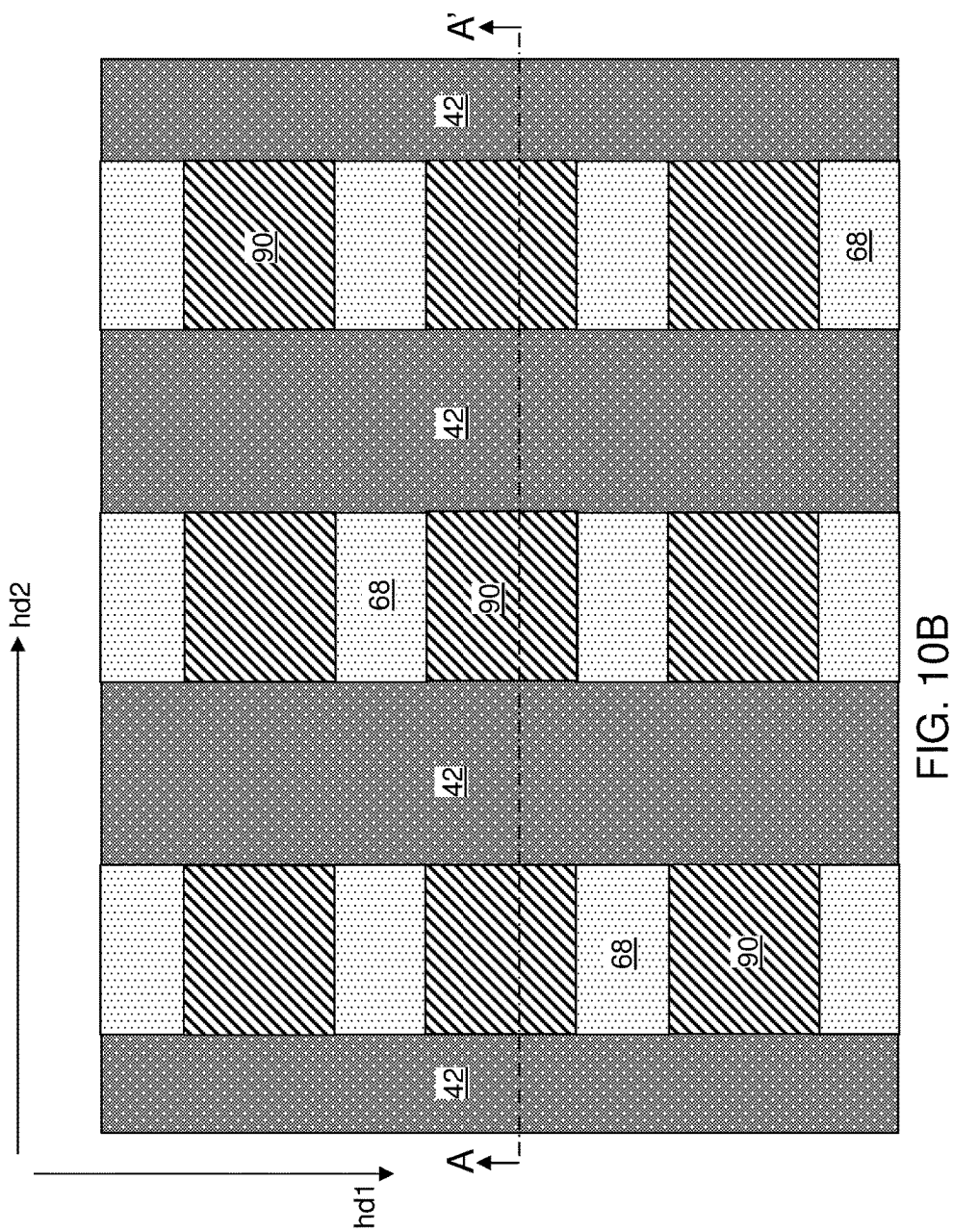
FIG. 10B is a horizontal cross-sectional view of second exemplary structure of FIG. 10A along the horizontal plane B-B'. The vertical plane A-A' is the plane of the cross-section for FIG. 10A.

Referring to FIGS. 10A and 10B, the processing steps of FIGS. 6A, 6B, 7A, and 7B can be performed to form bit line cavities 47 and separator pillar structures 68. Subsequently, the processing steps for forming the resistive memory layer stacks 80 and the optional selector elements 380 may be performed. The resistive memory layer stack 80 includes a lateral stack of a barrier material layer 82 as embodied as a planar layer and a metal oxide layer 86 as embodied as another planar layer as described above. Vertical bit lines 90 can be formed by deposition of at least one conductive material in the bit line cavities 47 employing the processing steps of FIGS. 8A and 8B. While the present disclosure is described employing an embodiment in which formation of the resistive memory layer stacks 80 and the optional selector elements 380 is omitted at this processing step, embodiments are expressly contemplated herein in which resistive memory layer stacks 80 and/or selector elements 380 are formed prior to formation of the vertical bit lines 90. In this case, subsequent processing sequence can be appropriately modified to avoid duplicate formation of resistive memory layer stacks 80 and/or selector elements 380.

Figure 11:
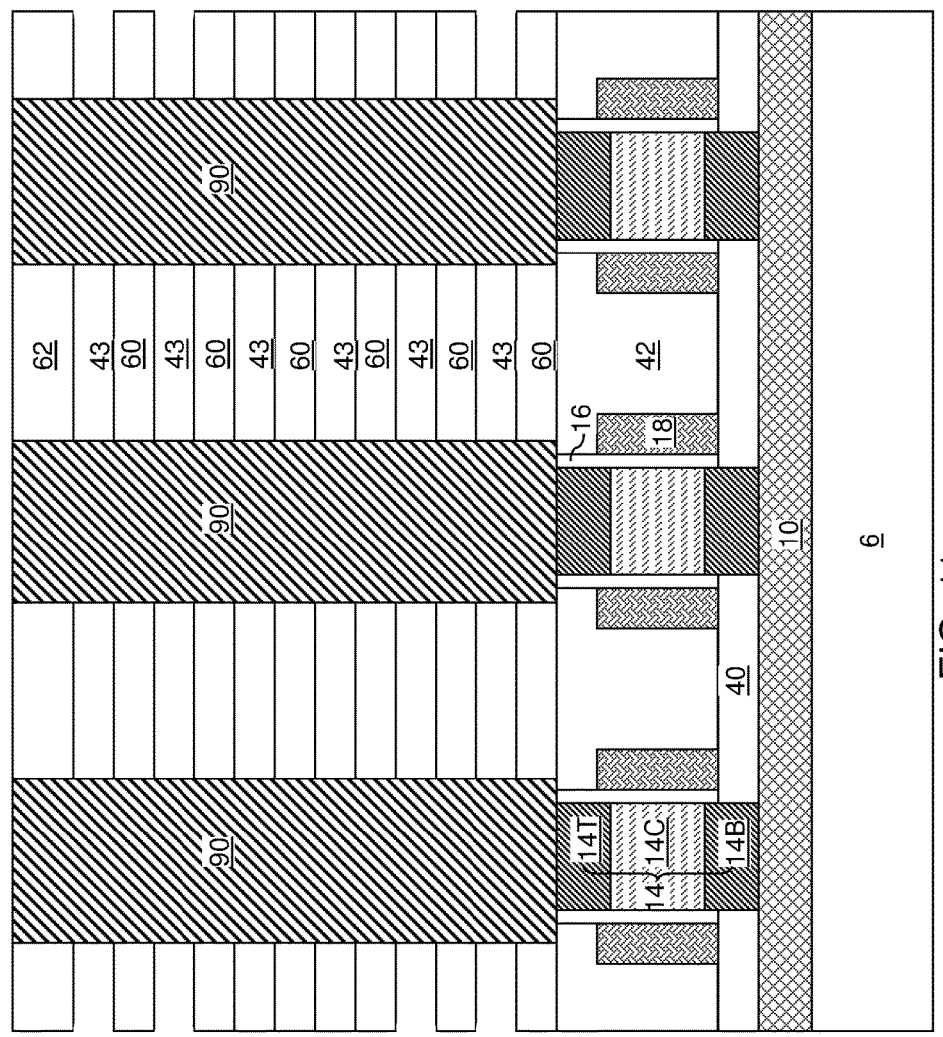
FIG. 11 is a vertical cross-sectional view of the second exemplary structure after formation of lateral recesses by removing the sacrificial material layers according to an embodiment of the present disclosure.

Referring to FIG. 11, an access trench (not shown) extending through the insulating cap layers 62 and the alternating stacks (42, 60) can be formed. An etchant that etches the material of the sacrificial material layers 42 selective to the material of the insulating layers 60, the insulating cap layers 62, and the vertical bit lines 90 (or resistive memory layer stacks 80 or selector elements 380 that contact sidewalls of the alternating stacks (42, 60)) can be introduced into the access trench. For example, if the sacrificial material layers 42 include germanium or a silicon-germanium alloy, a wet etch employing a combination of hydrogen peroxide and ammonium hydroxide can be employed to remove the sacrificial material layers 42. If the sacrificial material layers 42 include silicon nitride, a wet etch employing hot phosphoric acid can be employed to remove the sacrificial material layers 42. If the sacrificial material layers 42 include amorphous or polycrystalline silicon, a wet etch employing potassium hydroxide can be employed to remove the sacrificial material layers 42. Lateral recesses 43 can be formed in volumes from which the sacrificial material layers 42 are removed.

Figure 12:
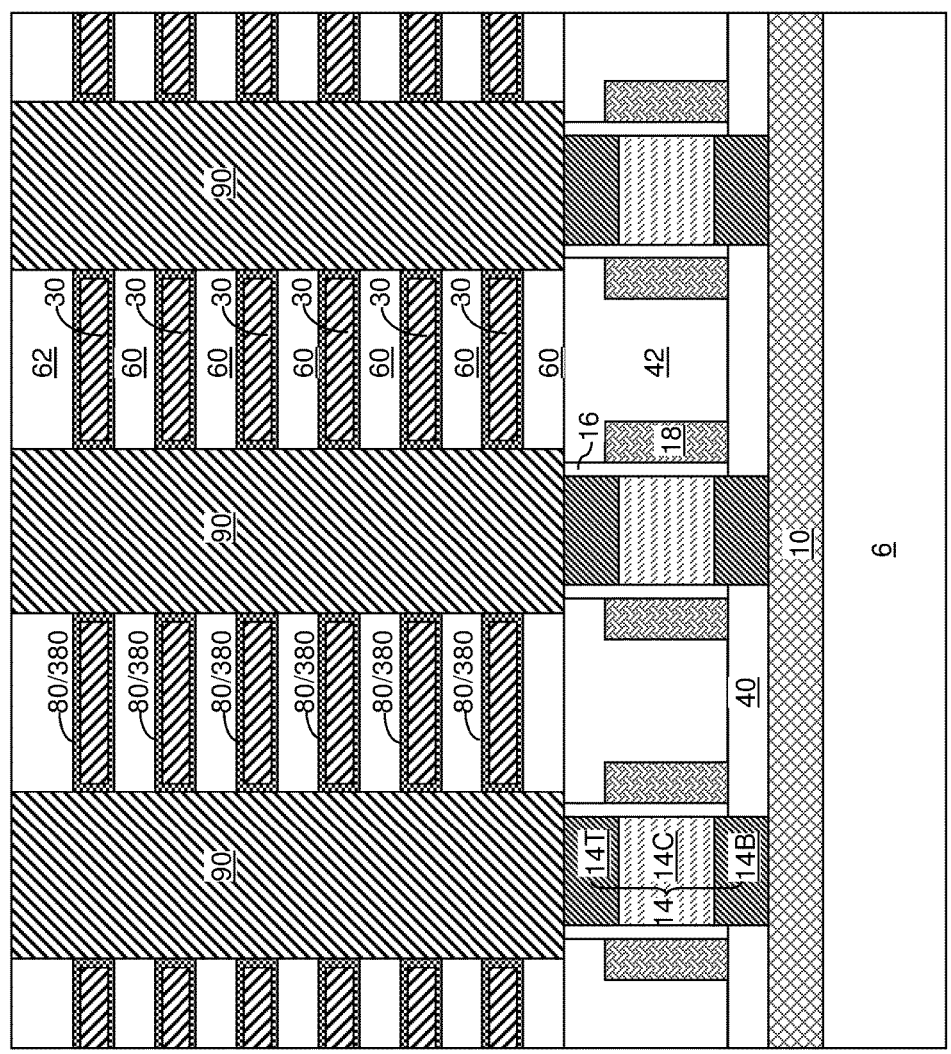
FIG. 12 is a vertical cross-sectional view of the second exemplary structure after formation of resistive memory layers and electrically conductive layers that constitute word lines of a resistive random access memory device according to an embodiment of the present disclosure.
Figure 13A:
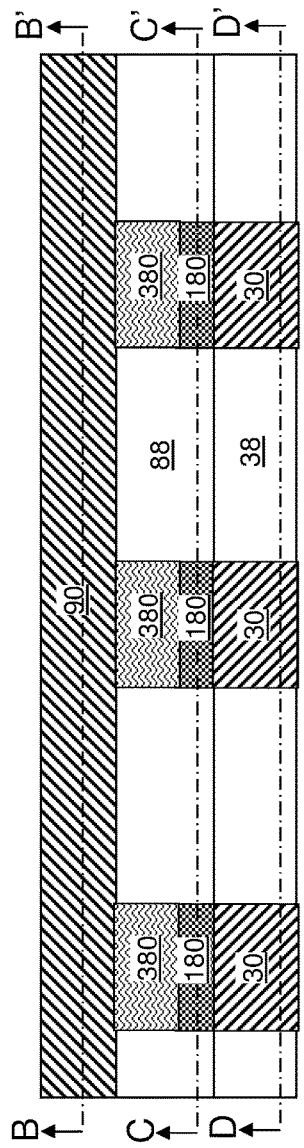
FIG. 13A is a vertical cross-sectional view of a third exemplary structure including a resistive random access memory device that includes a rectangular grid array of resistive memory elements and optional selector elements according to an embodiment of the present disclosure.
Figure 13B:
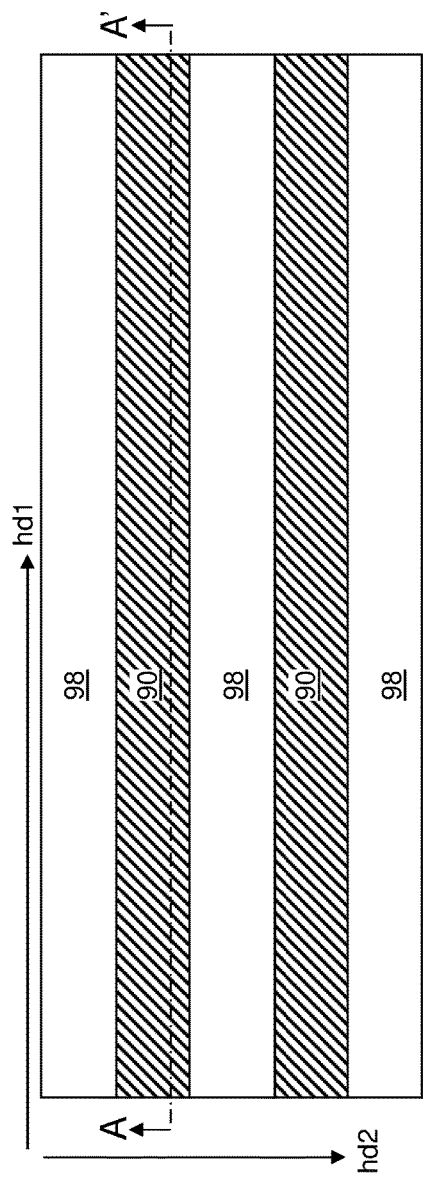
FIG. 13B is a horizontal cross-sectional view of the third exemplary structure of FIG. 13A along the horizontal plane B-B'. The vertical plane A-A' is the plane of the cross-section for FIG. 13A.
Figure 13C:
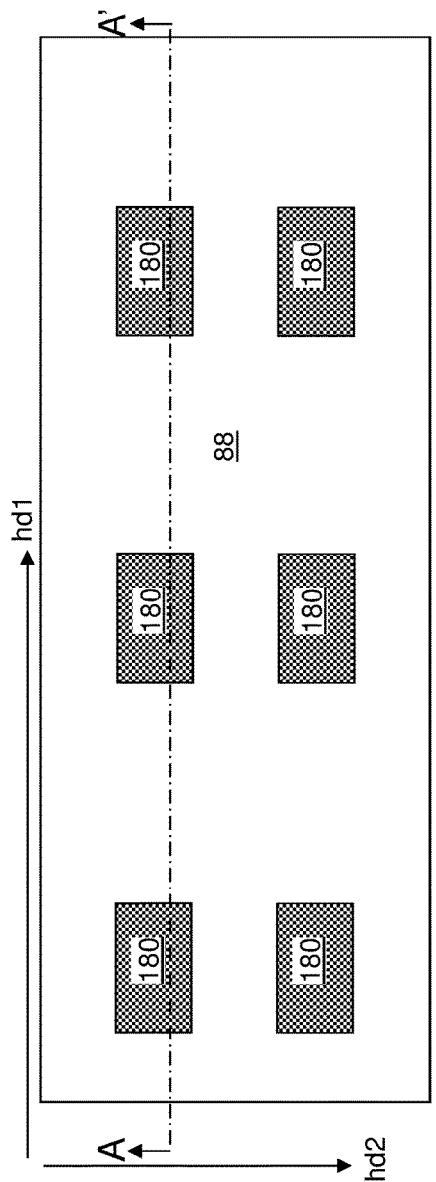
FIG. 13C is a horizontal cross-sectional view of the third exemplary structure of FIG. 13A along the horizontal plane C-C'. The vertical plane A-A' is the plane of the cross-section for FIG. 13A.
Figure 13D:
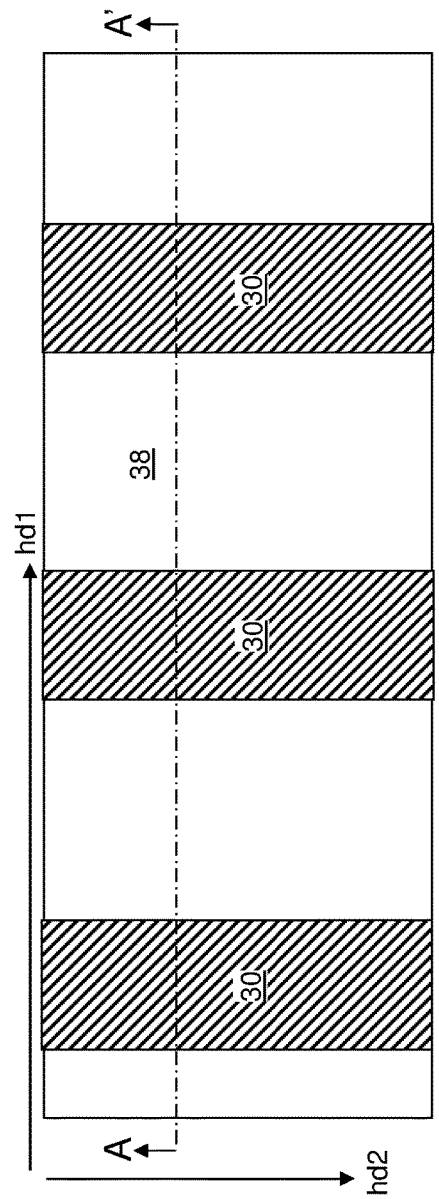
FIG. 13D is a horizontal cross-sectional view of the third exemplary structure of FIG. 13A along the horizontal plane D-D'. The vertical plane A-A' is the plane of the cross-section for FIG. 13A.

Referring to FIG. 12, if the resistive memory layer stacks 80 and/or the selector elements 380 are not previously formed within the bit line cavities 47, the resistive memory layer stacks 80 and/or the selector elements 380 can be formed in the lateral recesses 43 by deposition of suitable material layers. As discussed above, formation of selector elements 380 is optional. At least one conductive material can be deposited in remaining volumes of the lateral recesses 43 to form word lines 30, which can function as word lines of a resistive random access memory device.

Referring to FIGS. 13A-13D, a third exemplary structure is illustrated, which includes an array of resistive memory elements 180 in a cross-point array configuration. Electrically conductive lines 30 having the same composition as the electrically conductive lines 30 of the first and second exemplary structures can be formed at a first level. The electrically conductive lines 30 can extend along a first horizontal direction hd1 and can be laterally spaced from one another along a second horizontal direction hd2 by portions of a first dielectric material layer 38.

Each resistive memory element 180 can have the same layer stack as the resistive memory layer stacks 80 of the first and second exemplary structures. Each resistive memory element 180 can be in a two-dimensional array configuration with a first periodicity along the first horizontal direction hd1 and a second periodicity along the second horizontal direction hd2, which may, or may not, be perpendicular to the first horizontal direction hd1. Optionally, a selector element 380 can be formed over (e.g., directly on or separated by an intervening layer), or under, each resistive memory element 180. Each selector element 380 can have the same layer stack as the selector element 380 of the first and second exemplary structures.

The resistive memory elements 180 and the selector elements 380 can be formed by deposition of material layers over a combination of the electrically conductive lines 30 and the first dielectric material layer 38, and by patterning the stack of material layers. Subsequently, a dielectric matrix layer 88 including a dielectric material (such as silicon oxide) can be deposited and planarized to physically expose a top surface of vertical stacks of a resistive memory element 180 and a selector element 380. Each vertical stack of a resistive memory element 180 and a selector element 380 may have the resistive memory element 180 on top, or the selector element 380 on top.

A second dielectric material layer 98 and horizontal bit lines 90 can be formed over the vertical stacks of a resistive memory element 180 and a selector element 380. The horizontal bit lines 90 can have the same composition as the vertical bit lines 90 of the first and second exemplary structures. The second dielectric material layer 98 includes a dielectric material such as silicon oxide. The electrically conductive lines 30 and the horizontal bit lines 90 form a grid array (e.g., cross bar array), and each vertical stack of a resistive memory element 180 and a selector element 380 can be located at the intersection point of the grid array to enable access by a combination of a selected electrically conductive line 30 and a selected horizontal bit line 90. The third exemplary structure can be integrated with a set of peripheral devices for controlling the electrically conductive lines 30 as word lines and the horizontal bit lines 90 as bit lines to provide a resistive random access memory device.

Figure 14:
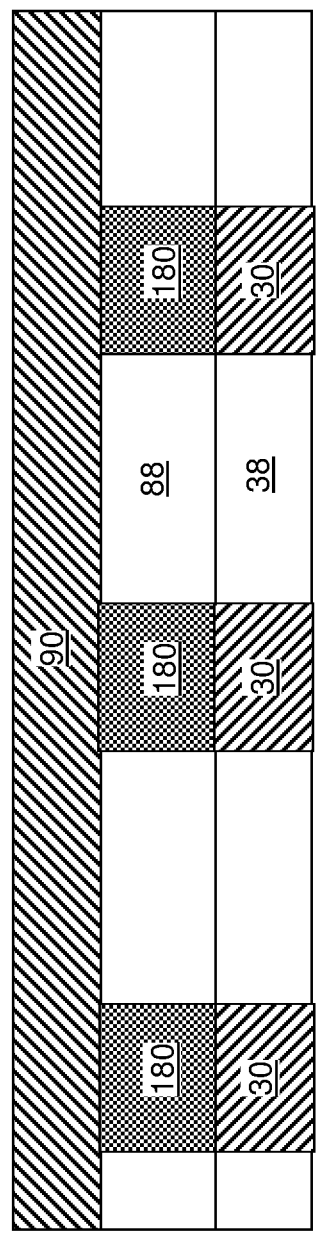
FIG. 14 is a vertical cross-sectional view of a modification of the third exemplary structure according to an embodiment of the present disclosure.

Referring to FIG. 14, a modification of the third exemplary structure is illustrated, which can be derived from the third exemplary structure by omitting the selector elements 380.

Figure 15:
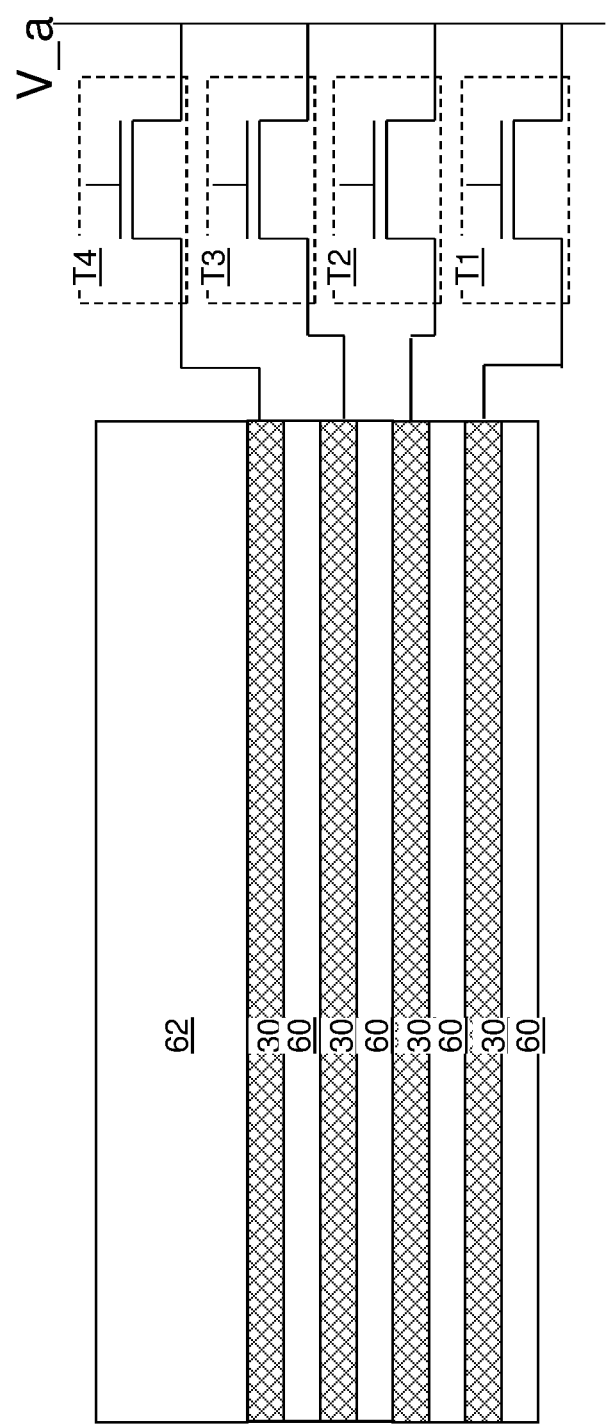
FIG. 15 is a schematic for word line access transistors connected to word lines in a resistive random access memory device.

Referring to FIG. 15, an exemplary peripheral device that can be employed to access the word lines 30 of the first and second exemplary structures (or the electrically conductive lines 30 of the third exemplary structure) as word lines. In this case, access transistors (T1-T4) can be employed, which can electrically bias each of the word lines 30 at a suitable electrical bias voltage (referred to as an access voltage V_a) for accessing a respective set of resistive memory elements. A similar scheme can be employed with the vertical field effect transistors (14B, 14C, 14T, 16, 18).

According to an aspect of the present disclosure, a method of operating a resistive memory cell is provided. Specifically, the reset state of each resistive memory cell can be tailored to provide a target high resistance state (HRS) current level during initial operation of the resistive memory device, which may be performed prior to field use, a product sale, or otherwise during an initial phase of use of the memory device. The target HRS current level can be obtained without inducing excessive current through the resistive memory cell by determining the optimal programming pulse based on iterative HRS current measurement on memory cells that do not meet the specification for the HRS current. Thus, a deep reset state (i.e., a reset state that provides a lower HRS current than the maximum allowable HRS current range) can be obtained at the initial switching operation for each resistive memory cell in memory array. In order to enable the deep reset state for each resistive memory cell, the peripheral circuit is provided with the functionality of determining whether the HRS current is minimized (i.e. within the specification range) for each resistive memory cell during the initial reset optimization process. The initial reset optimization process provides as many reset operations as necessary to ensure that all resistive memory cells provide a HRS current level within the specification range, i.e., lower than the maximum allowable HRS current.

As will be described in more detail below with respect to FIGS. 22 to 24, the initial reset optimization process can include the following stages that can be sequentially performed on each resistive memory cell in a resistive memory device: stage (1) for providing an initial reset pulse to each resistive memory cell in the resistive memory device; stage (2) for identifying a subset of resistive memory cells that provide a higher high resistance state (HRS) current than the predefined maximum for the HRS current specification (i.e., above a predefined maximum or threshold HRS current); and stage (3) for performing a set of operations for reducing the HRS current on each selected resistive memory cell (which includes all resistive memory elements within the identified subset) to levels within the specification (i.e., below the predefined maximum or threshold HRS current). Stage (3) can include multiple steps. The first step of stage (3) can be step (a) for providing a first corrective reset pulse to the selected resistive memory cell (which does not meet the maximum HRS current specification under the initial test at stage (2)). In one embodiment, the duration and the voltage of the first corrective reset pulse may be the same as the duration and the voltage of the initial reset pulse. In other words, the first corrective reset pulse does not need to exceed the duration or the magnitude of the voltage of the initial reset pulse at stage (1). This is because excessively high reset voltage or excessively long duration of a reset pulse has a tendency to cause cell breakdown, which should be avoided. Thus, in one embodiment, excessive reset voltage or duration can be avoided because the breakdown current threshold varies among the resistive memory cells due to the cell-to-cell variations caused by process variations in the fabrication process.

Stage (3) can include a subsequent step (b) for measuring, i.e., reading, the cell current (i.e., a first modified HRS current) after the first corrective reset pulse. The measured value of the first modified HRS current can be temporarily stored within a temporary data storage unit (such as a latch) within the peripheral circuitry. If the measured value of the first modified HRS current is within the specification for the HRS current level, the remaining steps of stage (3) can be omitted for the selected resistive memory cell within the subset, and a next resistive memory cell can be selected from the subset to perform the steps of stage (3) from step (a) onward.

If the measured value of the first modified HRS current is still above the specification range for the HRS current level, step (c) of stage (3) can be performed. Specifically, step (c) is a step for providing a second corrective reset pulse to the selected resistive memory cell (which does not meet the maximum HRS current specification under the initial test at stage (2) or under the measurement at step (b)). The second corrective reset pulse may be the same as the first corrective reset pulse, or may be longer in duration and/or of a higher voltage than the first corrective reset pulse. If the duration or the voltage of the second corrective reset pulse is greater than the duration or the voltage of the first corrective reset pulse, the increment is selected to avoid abrupt increase in energy of the second corrective reset pulse over the first corrective reset pulse.

Stage (3) can include a subsequent step (d) for measuring, i.e., reading, the cell current (i.e., a second modified HRS current) after the second corrective reset pulse. The measured value of the second modified HRS current can be temporarily stored within an additional temporary data storage unit (such as a latch) within the peripheral circuitry. If the measured value of the second modified HRS current is within the specification for the HRS current level, the remaining steps of stage (3) can be omitted for the selected resistive memory cell within the subset, and a next resistive memory cell can be selected from the subset to perform the steps of stage (3) from step (a) onward.

If the measured value of the second modified HRS current is still above the specification range for the HRS current level, step (e) of stage (3) can be performed. Specifically, step (e) is a step for calculating the difference between the first modified HRS current and the second modified HRS current. In some embodiments, a gradient may be calculated by dividing the difference between the first modified HRS current and the second modified HRS current by the changes in condition between the second corrective reset pulse and the first corrective reset pulse.

The next step of stage (3) can be step (f), which is a step for determining programming conditions for reaching a target HRS current level based on the calculated gradient. For example, the processing conditions of the first and second corrective reset pulses can be plotted on the x-axis and the HRS current can be plotted on the y-axis. By drawing a line passing through the two data points from the first and second modified HRS currents and a horizontal line representing the upper limit of the HRS current specification employing a graphic calculator algorithm (or any other algorithm for calculating an intersect of two lines), the conditions for a third corrective programming pulse for reaching the target HRS current level can be determined. The conditions for the third corrective programming pulse may be provided as a time duration of the third corrective programming pulse, the voltage level of the third corrective reset pulse, or a combination thereof. If the graphic calculator algorithm determines that the HRS current specification cannot be reached, a predefined third corrective reset pulse can be employed, which can include a predefined maximum duration and a predefined maximum programming voltage that do not adversely impact reliability of resistive memory cells.

Alternatively, step (f') may be performed in lieu of step (f). Step (f') includes repetitions of steps (c) and (d) until the measured modified HRS current (after the most recent corrective reset pulse) meets the HRS current level specification, or the number of repetitions reaches a predefined limit (a number that can be selected from a range, for example, from 5 to 1,000).

Figure 16:
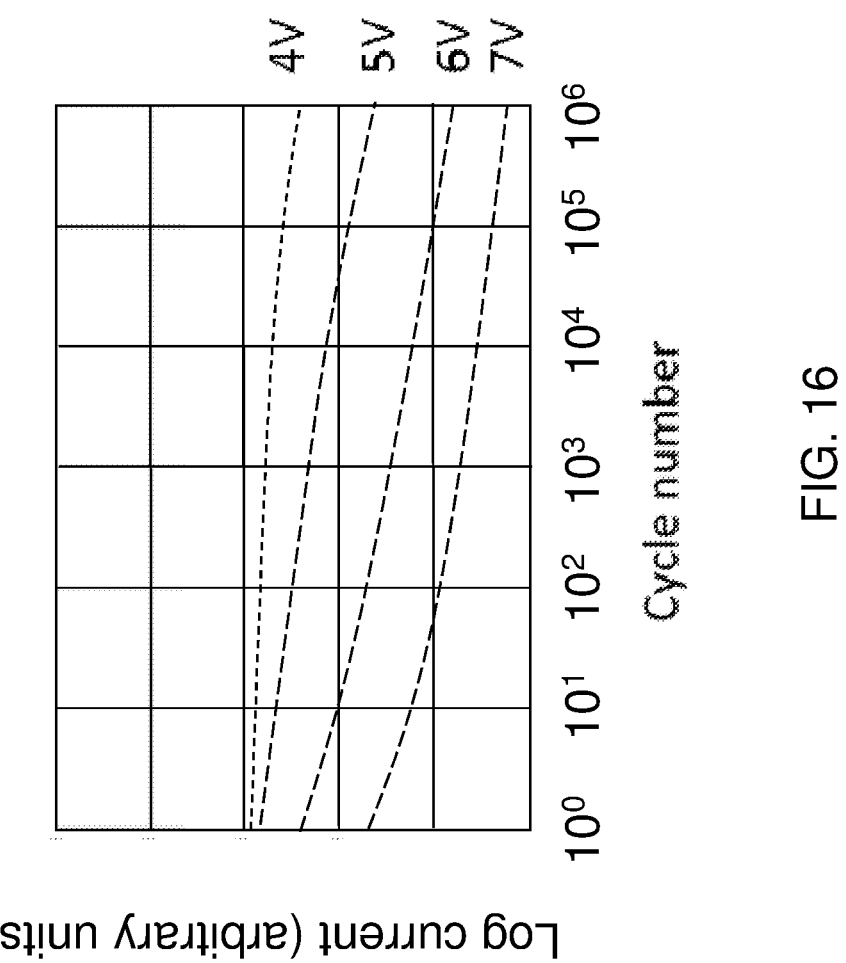
FIG. 16 is an illustration of reduction in the high resistance state current as a function of a reset voltage and repetition of reset cycles according to an embodiment of the present disclosure.

FIG. 16 illustrates a reduction in the high resistance state current as a function of a preselected reset pulse voltage and the total number of repetition of reset pulse cycles. The resistive memory cells employed for the test in FIG. 16 included, from one side to another, a first TiN electrode, an 8 nm thick titanium dioxide layer, an 8 nm thick amorphous silicon layer, and a second TiN electrode. A positive pulse of 10 microsecond duration is applied for each reset pulse to the first TiN electrode. FIG. 16 shows gradual decrease in the HRS current with successive corrective reset pulses. While FIG. 16 illustrates reduction of HRS current as a function of a total number of corrective reset pulses and the methods of the present disclosure can be performed by repeating corrective reset pulses of the same voltage and same duration multiple times, the methods of the present disclosure can also be employed with gradually increasing pulse duration with successive corrective reset pulses and/or with gradually increasing pulse voltage with success corrective reset pulses.

FIG. 16 illustrates that an excessively low corrective reset programming voltage (such as 4 V) did not result in reducing the HRS current level within a reasonable number of corrective reset pulses. In contrast, a high corrective reset programming voltage (such as 7 V) is effective in quickly reducing the HRS current level, but may lead to premature resistive memory cell breakdown. Further, the rate of decrease in the HRS current level reaches saturation as illustrated by the curves for 6 V and 7V. In lieu of many iterations of corrective reset pulses required to reach the target HRS current level (e.g., below 100 nA, such as less than 50 nA, for example 0.05 to 10 nA) by using relatively short duration pulses as illustrated in FIG. 16, a lesser number of iterations of corrective reset pulses employing a longer duration and relative low voltage may be employed to reach the target HRS current level, thereby avoiding a premature breakdown of the resistive memory cells. Alternatively, a smaller number of longer duration and/or higher voltage pulses may be used. In one embodiment, incremental step pulse programming may be employed.

In one embodiment, the resistive memory device may become operational after the initial reset optimization process.

In another embodiment, the resistive memory device may be further tuned by performing an initial set optimization process prior to operational use. The initial set optimization process can include the following stages that can be sequentially performed on each resistive memory cell in the resistive memory device: stage (1) for providing an initial set pulse to each resistive memory cell in the resistive memory device; stage (2) for identifying a subset of resistive memory cells that provide a lower low resistance state (LRS) current than the predefined minimum for the LRS current specification (i.e., below a predefined maximum or threshold LRS current); and stage (3) for performing a set of operations for increasing the LRS current on each selected resistive memory cell (which includes all resistive memory elements within the identified subset) to levels within the specification (i.e., above the predefined maximum or threshold LRS current). Stage (3) can include multiple steps. The first step of stage (3) can be step (a) for providing a first corrective set pulse to the selected resistive memory cell (which does not meet the minimum LRS current specification under the initial test at stage (2)). In one embodiment, the duration and the voltage of the first corrective set pulse may be the same as the duration and the voltage of the initial set pulse. In other words, the first corrective set pulse does not need to exceed the duration or the magnitude of the voltage of the initial set pulse at stage (1). This is because excessively high set voltage or excessively long duration of a set pulse has a tendency to cause cell breakdown, which should be avoided.

Stage (3) can include a subsequent step (b) for measuring, i.e., reading, the cell current (i.e., a first modified LRS current) after the first corrective set pulse. The measured value of the first modified LRS current can be temporarily stored within a temporary data storage unit (such as a latch) within the peripheral circuitry. If the measured value of the first modified LRS current is within the specification for the LRS current level, the remaining steps of stage (3) can be omitted for the selected resistive memory cell within the subset, and a next resistive memory cell can be selected from the subset to perform the steps of stage (3) from step (a) onward.

If the measured value of the first modified LRS current is still below the specification range for the LRS current level, step (c) of stage (3) can be performed. Specifically, step (c) is a step for providing a second corrective set pulse to the selected resistive memory cell (which does not meet the minimum LRS current specification under the initial test at stage (2) or under the measurement at step (b)). The second corrective set pulse may be the same as the first corrective set pulse, or may be longer in duration or of a higher voltage than the first corrective set pulse. If the duration or the voltage of the second corrective set pulse is greater than the duration or the voltage of the first corrective set pulse, the increment is selected to avoid abrupt increase in energy of the second corrective set pulse over the first corrective set pulse.

Stage (3) can include a subsequent step (d) for measuring, i.e., reading, the cell current (i.e., a second modified LRS current) after the second corrective set pulse. The measured value of the second modified LRS current can be temporarily stored within an additional temporary data storage unit (such as a latch) within the peripheral circuitry. If the measured value of the second modified LRS current is within the specification for the LRS current level, the remaining steps of stage (3) can be omitted for the selected resistive memory cell within the subset, and a next resistive memory cell can be selected from the subset to perform the steps of stage (3) from step (a) onward.

If the measured value of the second modified LRS current is still below the specification range for the LRS current level, step (e) of stage (3) can be performed. Specifically, step (e) is a step for calculating the difference between the first modified LRS current and the second modified LRS current. In some embodiments, a gradient may be calculated by dividing the difference between the first modified LRS current and the second modified LRS current by the changes in condition between the second corrective set pulse and the first corrective set pulse.

The next step of stage (3) can be step (f), which is a step for determining programming conditions for reaching a target LRS current level based on the calculated gradient. For example, the processing conditions of the first and second corrective set pulses can be plotted on the x-axis and the LRS current can be plotted on the y-axis. By drawing a line passing through the two data points from the first and second modified LRS currents and a horizontal line representing the lower limit of the LRS current specification employing a graphic calculator algorithm (or any other algorithm for calculating an intersect of two lines), the conditions for a third corrective programming pulse for reaching the target LRS current level can be determined. The conditions for the third corrective programming pulse may be provided as a time duration of the third corrective programming pulse, the voltage level of the third corrective set pulse, or a combination thereof. If the graphic calculator algorithm determines that the LRS current specification cannot be reached, a predefined third corrective set pulse can be employed, which can include a predefined maximum duration and a predefined maximum programming voltage that do not adversely impact reliability of resistive memory cells.

Alternatively, step (f') may be performed in lieu of step (f). Step (f') includes repetitions of steps (c) and (d) until the measured modified LRS current (after the most recent corrective set pulse) meets the LRS current level specification, or the number of repetitions reaches a predefined limit (a number that can be selected from a range, for example, from 5 to 1,000).

In one embodiment, the resistive memory device may be placed in operation after the initial set optimization process. Alternatively, the initial reset optimization process and/or the initial set optimization process can be repeated at least once to ensure that a suitable sense current threshold window exists for extended use of the resistive memory device including, for example, 1,000,000 set and reset operations.

Figure 17:
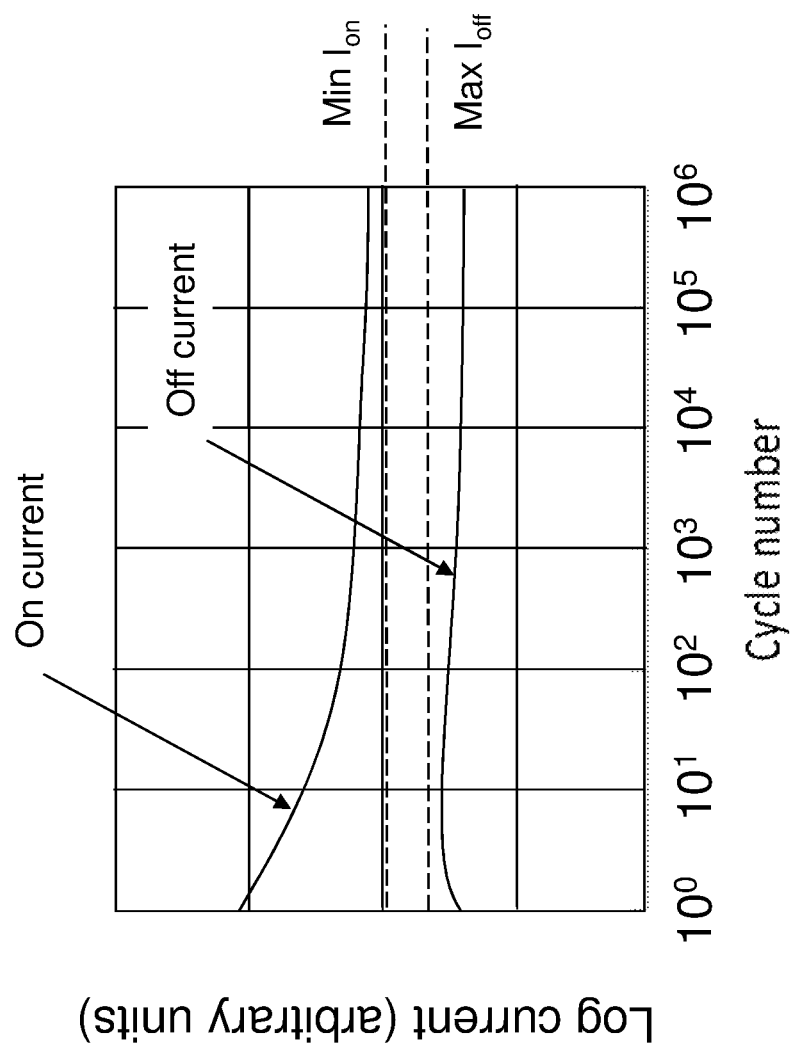
FIG. 17 is a demonstration of a one million set-reset cycle test on a resistive memory cell employing the methods of the present disclosure.

FIG. 17 illustrates that a resistive memory device employing instances of the resistive memory elements described above with respect to FIG. 16 can be optimized through use of the at least one initial reset optimization process and at least one initial set optimization process to provide at least 1,000,000 successful set and reset programming operations while maintaining a sense window based on a on-current to off-current ratio greater than 2.5 throughout the operation. In other words, the on-current to off-current ratio greater than 2.5 can be maintained throughout the 1,000,000 cycling through set and reset operations using single pulses while avoiding cycling failures. It is noted that the high resistance state (HRS) current drift is minimized through use of the optimal corrective reset pulse during the initial reset optimization process. The incremental step pulse programming, if employed, my further increase the sense window.

Generally speaking, the reset pulses are longer in total duration within a reset pulse (which may include a single physical pulse or a series of multiple pulses with a fixed duty cycle in a range from 1% to 99%) and/or greater in magnitude than a set pulse. For example, the reset pulse may have a duration in a range from 1 microsecond to 10 milliseconds, such as 1 to 5 milliseconds, and the set pulse may have a duration in a range from 1 ns to 1000 ns, such as 100 to 500 ns. The reset pulse may have a voltage of about 5 to 7V, such as 6 V, and the set pulse may have a voltage of about −4 to −6V, such as about −5V. The reset operation may employ a higher absolute magnitude of voltage and/or a longer pulse duration and/or a higher number of consecutive pulses per programming than the set operation, because the reset operation is believed to be endothermic while the set operation is believed to be exothermic.

In one embodiment, the set pulses can employ gradually higher voltages as the total number of cycles increases. This is because the set current (i.e., the low resistance state current) drifts downward (decreases) gradually during use of the resistive memory cell as shown in FIG. 17. According to an aspect of the present disclosure, the peripheral circuitry can be programmed to keep track of the average number of set and reset operations within the memory device, and to gradually increase the magnitude of the set programming pulse voltage with use of the memory device, i.e., with the increase in the average number of set and reset operations within the memory device. The gradual adjustment to the set programming voltage can increase the sense window (as measured by the ratio of the minimum low resistance state current to the maximum high resistance state current).

In one embodiment, the total duration of the corrective reset pulses or the corrective set pulses (whether applied as a single pulse or a series of physical pulses per corrective programming) is inversely proportional to the measured gradient in the HRS current or the LRS current, respectively. By adjusting the total duration of the corrective reset pulses or the corrective set pulse, the target current level can be obtained quickly in both corrective reset operations and corrective set operations, thereby helping to avoid cell breakdown in the initial corrective reset operation(s) or in the initial corrective set operation(s).

Figure 18:
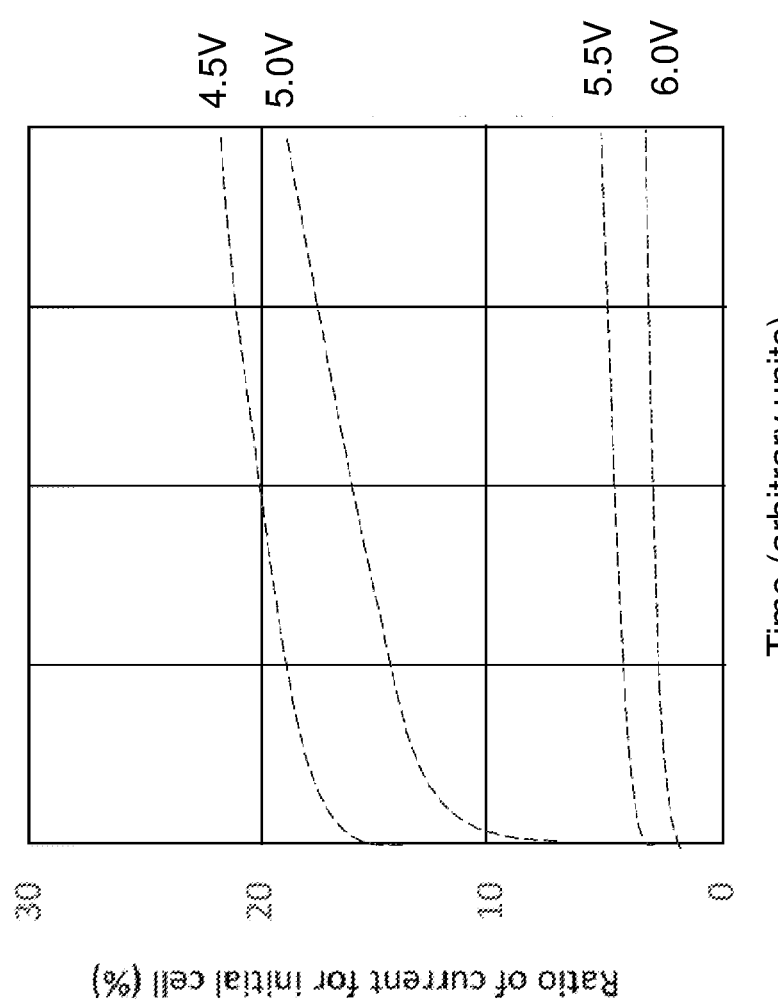
FIG. 18 is a time dependence of the ratio of the low resistance state current to the high resistance state current as a function of time after the initial reset operation.

As far as data retention characteristics are concerned, use of the initial reset optimization process can increase the retention time. Without wishing to be bound by a particular theory, it is believed that the deeper reset state provides slower degradation of the high resistance state, and thus, increases data retention as illustrated in FIG. 18. FIG. 18 illustrates the time dependence of the ratio of the low resistance state current to the high resistance state current as a function of time after the initial reset operation. In FIG. 18, the vertical axis represents the current ratio, i.e., the ratio of the low resistance state current to the high resistance state current. The horizontal axis represents the square root of time (in arbitrary units). By avoiding high voltage operation, the methods of the present disclosure can increase the retention characteristics of the resistive memory cells. The current ratios show significant initial changes in the current ratio followed by a gradual change, which is believed to be caused by a diffusion controlled mechanism with a constant diffusivity of switchant (e.g., the species that diffuse to and from the metal oxide layer, such as the metal ions) regardless of reset voltages. Without wishing to be bound by a particular theory, it is believed that this phenomenon may be attributable to a reset mechanism that depends on the cell stack structure.

According to another aspect of the present disclosure, an ion-migration based resistive memory cell is provided, which employs reversible metal-semiconductor alloy formation and reversible metal oxide formation by a same metal. In one embodiment, a resistive memory cell is provided which includes, from one side to another, a first electrode, a switching layer, a barrier layer, and a second electrode. A reaction occurs between cations in the switching layer (which function as switchants, i.e., physical agents of a switching mechanism) and the material of the barrier layer.

Examples of combinations of the switchant in a switching layer material and the barrier layer material include, but are not limited to, e.g., Ti ions in a $TiO_2$ layer and amorphous silicon in a barrier layer; Ti in a $TiO_2$ layer and amorphous germanium in a barrier layer; and Ti in a $TiO_2$ layer and an amorphous silicon-germanium alloy in a barrier layer. In this case, the material of the switching layer is selected such that the metal of the switching layer is capable of a silicidation reaction and/or a germanidation reaction, and the material of the barrier layer is selected from silicon, germanium, and a silicon-germanium alloy.

Alternatively, any metal other than titanium that forms both a metal oxide and a metal silicide and/or germanide may be employed in lieu of titanium as the cation in the switching layer. In other words, any metal oxide of which metal ions can react in a silicidation reaction and/or a germanidation reaction can be employed as the material of the switching layer. For example, cobalt oxide, nickel oxide, or vanadium oxide may be employed.

The selection of metal oxide and barrier material should obey thermodynamics calculation, which minimizes reset pulse length. This is because the current reset reaction is described in the following equation:

$$MO_x + A = MA + MO_{x-d} - Q \qquad (eq.1),$$

where $MO_x$ is the metal oxide of the switching layer (such as $TiO_2$, cobalt oxide, nickel oxide, tantalum oxide, vanadium oxide, and/or tungsten oxide), A is the semiconductor material of the barrier layer (such as silicon or germanium) or nitrogen in the first electrode, MA is the metal-semiconductor alloy (such as a metal silicide, a metal germanide, or a metal silicide-germanide alloy), $MO_{x-d}$ is an oxygen-deficient metal oxide of the switching layer (such as $TiO_{2-d}$, oxygen-deficient cobalt oxide, oxygen-deficient nickel oxide, or oxygen-deficient vanadium oxide, and Q corresponds to the Gibbs free energy of the reaction. The reset reaction is believed to be endothermic and the set reaction is believed to be exothermic. Thus, more reset energy is required compared with set energy. Therefore, the reset programming of the embodiments of the present disclosure use more energy than the set programming by employing a longer pulse and/or a higher voltage than the set programming.

At one time, it was believed that the positive charged elements, e.g., switchants, were oxygen vacancies in metal oxide switching layer, for example, by B. Govoreanu et al., IEDM 2013 p. 256, VLSI Symposium Tech. Dig. 2015, page T132, and VLSI Symp. Tech. Dig. 2016. During the course of research leading the present disclosure, however, evidence was found that vacancy may not be a mechanism at all or may not be a sole mechanism for a deep reset, as explained below.

Figure 19:
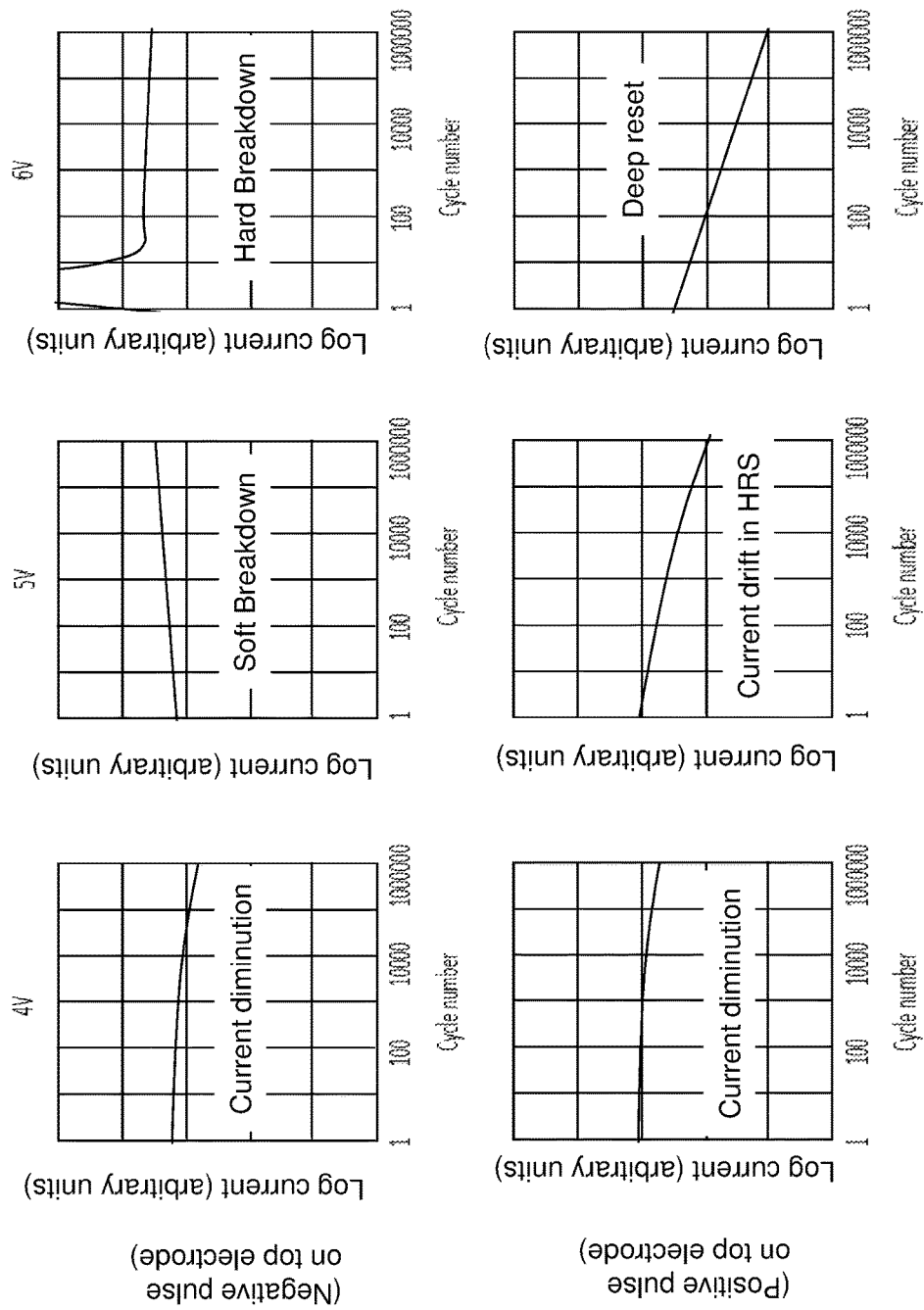
FIG. 19 illustrates the dependence of the high resistance state current as a function of the magnitude and polarity of 1 microsecond reset pulse on a resistive memory cell including an amorphous silicon/titanium oxide stack according to an embodiment of the present disclosure.

FIG. 19 illustrates the dependence of the high resistance state current as a function of the magnitude and polarity of 1 microsecond reset pulse on a resistive memory cell including an amorphous silicon/titanium oxide stack according to an embodiment of the present disclosure. In biases with 4 V, slight current diminutions appeared in both polarities, but deep reset did not appear using bias with higher negative voltages. In contrast, conditions of deep reset were achieved under higher positive voltage bias conditions. This clearly shows that deep reset is not attributable to vacancy modulation (which should not be depended on bias polarities).

Figure 20:
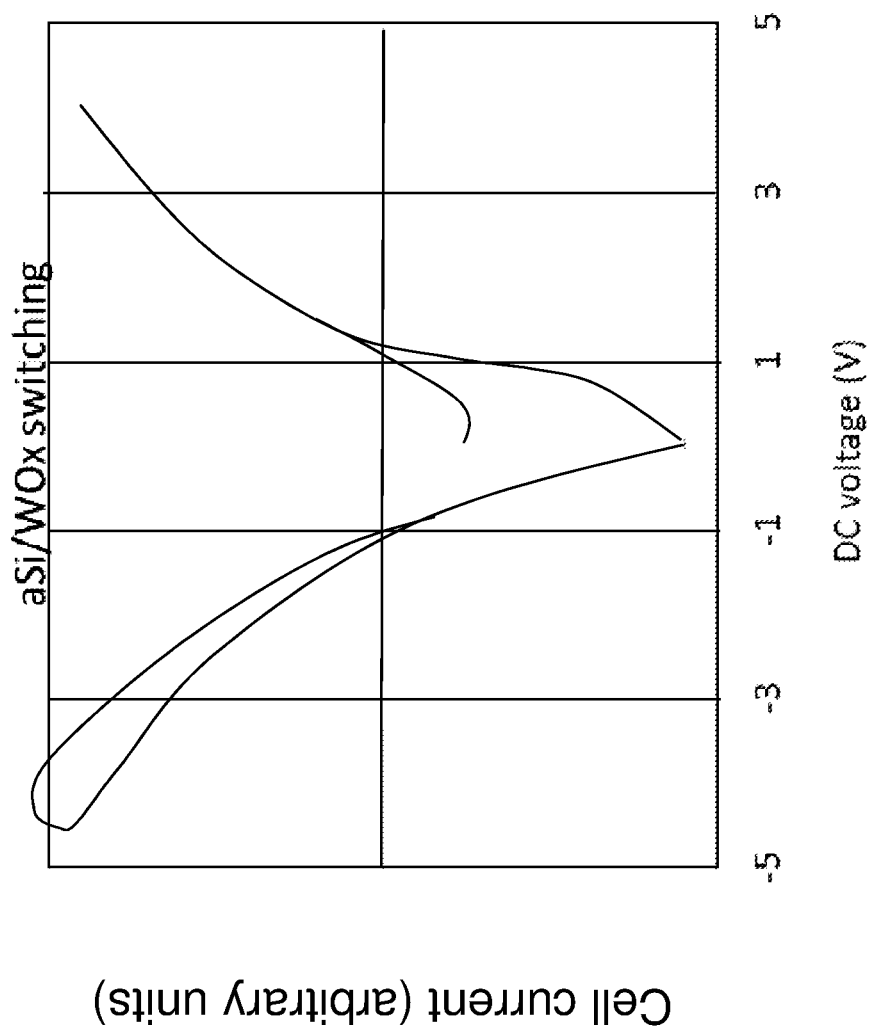
FIG. 20 illustrates switching characteristics of an amorphous silicon/tungsten oxide resistive memory cell according to an embodiment of the present disclosure.

Referring to FIG. 20, switching characteristics of an amorphous silicon/tungsten oxide resistive memory cell according to an embodiment of the present disclosure are illustrated. FIG. 20 shows the I-V curves in a DC sweep for a amorphous silicon/tungsten oxide stack. The reset is caused by negative reset bias.

Figure 21:
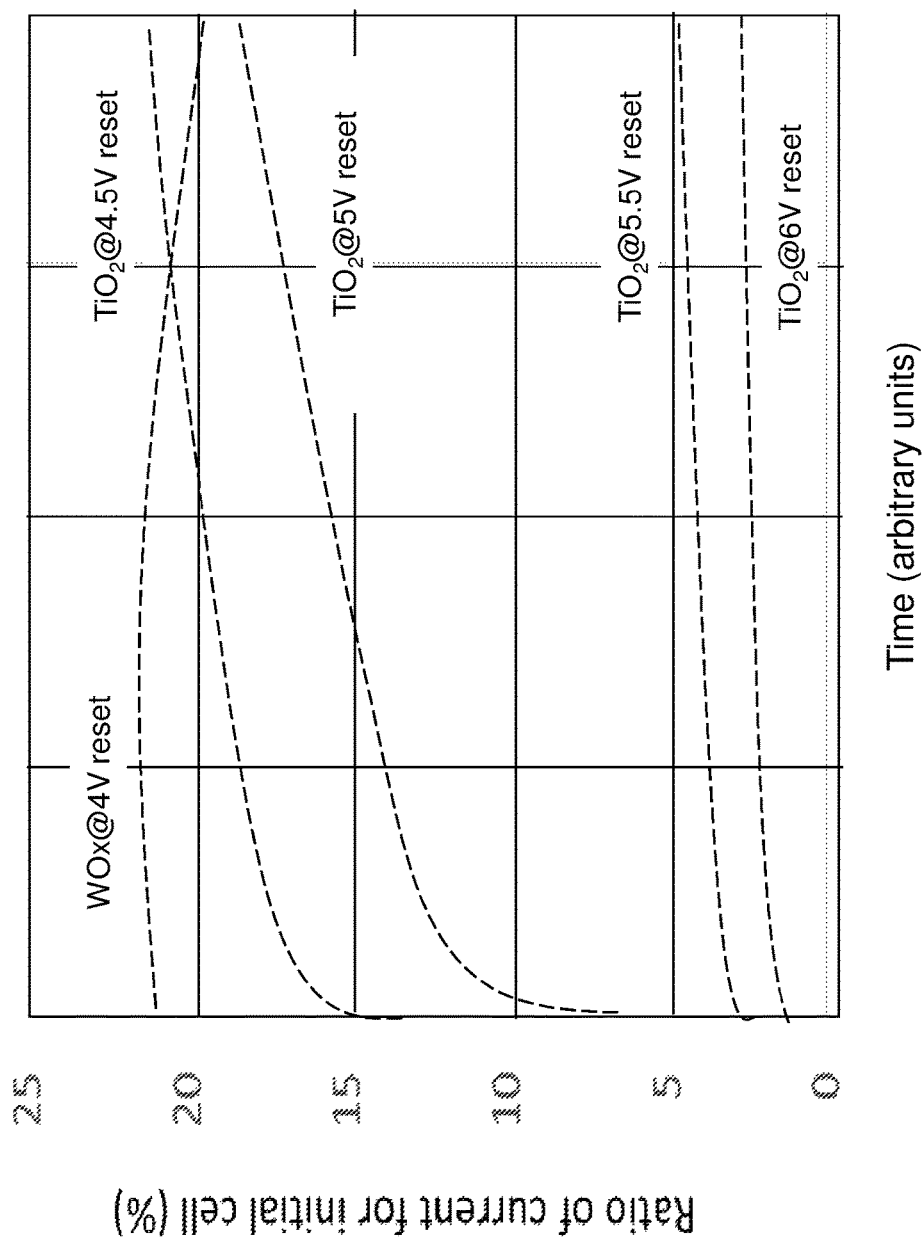
FIG. 21 is a comparison between the time dependence of the ratio of the low resistance state current to the high resistance state current of an amorphous silicon/tungsten oxide resistive memory cell with the time dependence of the ratio of the low resistance state current to the high resistance state current of an amorphous silicon/titanium oxide resistive memory cell as a function of time after the initial reset operation.

FIG. 21 is a comparison between the time dependence of the ratio of the low resistance state current to the high resistance state current of an amorphous silicon/tungsten oxide resistive memory cell with the time dependence of the ratio of the low resistance state current to the high resistance state current of an amorphous silicon/titanium oxide resistive memory cell as a function of time after the initial reset operation. The HRS degradation in the amorphous silicon/tungsten oxide stack is quite different from the corresponding HRS degradation in the amorphous silicon/titanium oxide stack. These indicate that the switchants in the tungsten oxide material is different from the switchants in the titanium oxide material.

Table 1 summarizes the switching features of the four types of resistive memory cells having (i) alumina barrier/titanium oxide metal oxide layer, (ii) amorphous silicon barrier/titanium oxide metal oxide layer, (iii) amorphous silicon barrier/tantalum oxide metal oxide layer, and (iv) amorphous silicon barrier/tungsten oxide metal oxide layer. Due to the different behavior of each type of memory cell after positive and negative bias pulse application, it is believed that the switchant in the memory cells of an embodiment of the present disclosure is metal ion in the switching metal oxide instead of oxygen vacancy.

TABLE 1

Comparison of switching features of the amorphous silicon/tungsten oxide resistive memory cell and the amorphous silicon/titanium oxide resistive memory cell.

| Pulse type to the first electrode | $TiO_2/Al_2O_3$ | $TiO_2$/amorphous silicon | $TaO_x$/amorphous silicon | $WO_x$/amorphous silicon |
|---|---|---|---|---|
| Positive bias pulse | unknown | Deep reset | Slight current diminution | Only breakdown |
| Negative bias pulse | Reset | Slight current diminution | Slight current diminution | Reset |

According to another aspect of the present disclosure, a method of operating an array of resistive memory cells is provided. An array of resistive memory cells as described above can be employed. For example, each resistive memory cell within the array comprises a region of a laminated structure (82, 86) including a barrier material layer 82 containing silicon and/or germanium and electrically connected to a respective first electrode (such as a first electrically conductive line 30) either by being electrically shorted or through a selector element 380, and a metal oxide layer 86 including an oxide of a metal element that provides a reversible chemical reaction under a bidirectional electrical bias at an interface with the barrier material layer and electrically connected to a respective second electrode (such as a second electrically conductive line 90) either by being electrically shorted or through a selector element 380. The reversible chemical reaction can be selected from silicidation reaction between the barrier material layer 82 and the metal element, germanidation reaction between the barrier material layer 82 and the metal element, oxidation of the metal element, and reduction of the metal element. A reset operation that induces a high resistance state can be performed on at least one memory cell 180, such as a first plurality of resistive memory cells 180 within the array at least by applying a positive bias voltage pulse to the respective second electrode 90 relative to the respective first electrode 30. A set operation that induces a low resistance state on at least one memory cell 180, such as a second plurality of resistive memory cells 180 within the array at least by applying a negative bias voltage pulse to the respective second electrode 90 relative to the respective first electrode 30.

The reset operation can be effected by inducing a forward endothermic chemical reaction in which the memory cell 180 (e.g., a region of the laminated structure (82, 86)) transitions into a high resistance state under an electrical field from the metal oxide layer 86 toward the barrier material layer 82. The set operation can be effected by inducing a reverse exothermic chemical reaction in which the memory cell 180 (e.g., a region of the laminated structure (82, 86)) transitions into a low resistance state under an electrical field from the barrier material layer 82 to the metal oxide layer 86. According to an embodiment of the present disclosure, the asymmetric heat absorption or heat emission during the endothermic reaction and the exothermic reaction, respectively, is counteracted by supplying more energy during the reset operation that employs the forward endothermic chemical reaction, while supplying less energy during the set operation that employs the reverse exothermic chemical reaction. The asymmetric application of energy can be effected by controlling the amplitude and duration of the electrical pulses employed during the reset operation and the set operation. At least one of, and preferably both of an absolute value of amplitude and duration of the electrical pulses employed during the reset operation is greater than that employed during the set operation. In one embodiment, the integral of the amplitude the positive bias voltage pulse over time for the reset operation has a greater absolute value than the integral of the amplitude of the negative bias voltage pulse over time for the set operation.

According to another aspect of the present disclosure, additional programming pulses can be employed to provide a "deep" reset state or a "deep" set state. As used herein, a "deep" reset state refers to a reset state in which the resistance of a resistive memory cell is at, or near, a maximum resistance that can be achieved without inducing breakdown of the resistive memory cell. In contrast, a "shallow" reset state refers to a reset state having a resistance that is significantly lower than the maximum resistance, but is at a level that can be considered to be a reset state. A "deep" set state refers to a set state in which the resistance of a resistive memory cell is at, or near, a minimum resistance that can be achieved without inducing breakdown of the resistive memory cell. A "shallow" set state refers to a set state having a resistance that is significantly greater than the minimum resistance, but is at a level that can be considered to be a set state.

The additional programming pulses of the present disclosure can induce transition from the shallow reset state to the deep reset state. Further, the additional programming pulses of the present disclosure can induce transition from the shallow set state to the deep set state. Transition into the deep reset state and/or transition into the deep set state can be employed to increase the sense margin and endurance of a resistive memory cell, and can be employed in various modes as will be discussed below.

Figure 22:
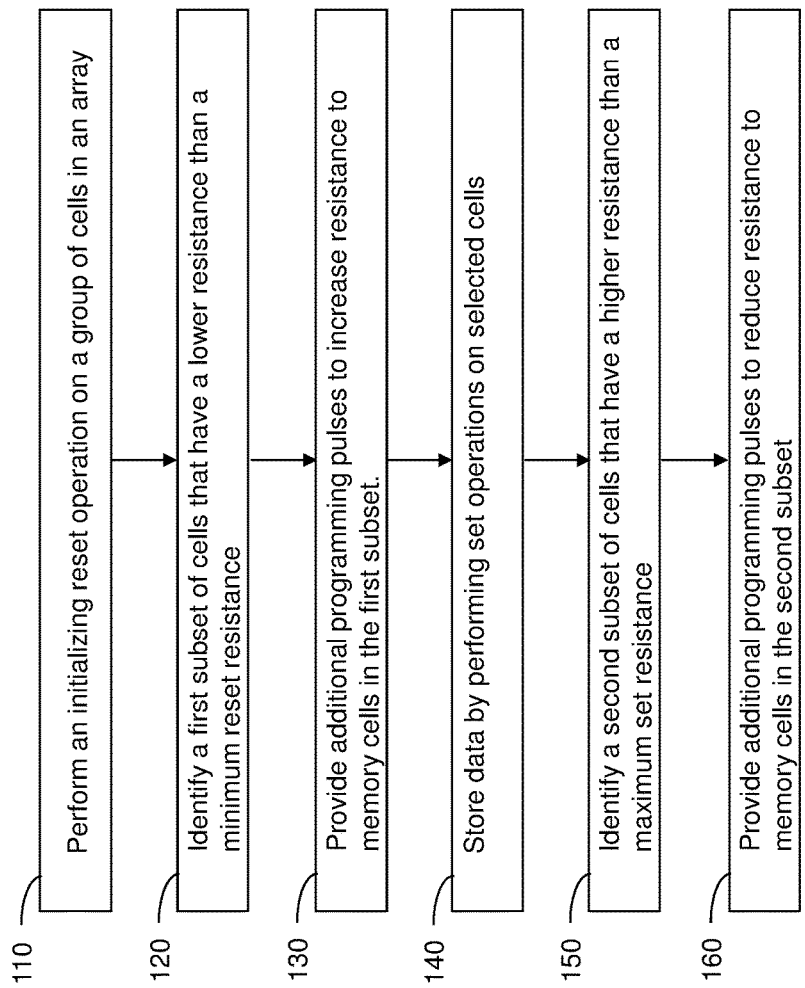
FIG. 22 is a flow chart illustrating an exemplary programming sequence according to an embodiment of the present disclosure.

Referring to FIG. 22, a first exemplary method of repeatedly applying a corrective reset programming pulse is illustrated, which can be employed to induce deep reset states from shallow reset states and/or to induce deep set states from shallow set states. Referring to step 110, an initializing reset operation can be performed on a group of resistive memory cells in an array of resistive memory cells. The group of cells on which the initializing reset operation is performed can include the entire set of resistive memory cells within the array, or a subset of the resistive memory cells within the array that is less than the entire set of resistive memory cells. The initializing reset operation can be initiated by application of a positive voltage pulse (i.e., a voltage pulse that applies a positive voltage to the second electrode 90 relative to the first electrode 30) to the resistive memory cells. In an illustrative example, a block of resistive memory cells, a page of resistive memory cells, a plane of resistive memory cells, or all resistive memory cells within a memory chip may be selected as the group of resistive memory cells. The selected group of resistive memory cells can include all resistive memory cells that are subsequently employed to store a set of data.

Referring to step 120, a first subset of resistive memory cells having a lower resistance than a minimum reset resistance is identified among the group of resistive memory cells that are programmed into the reset states at step 110. The minimum reset resistance may be the same as, or may be greater than, the threshold resistance above which a resistive memory cell is deemed to be in a reset state by a sense circuitry. In one embodiment, the minimum reset resistance can be a minimum deep reset resistance, which is higher than the threshold resistance above which a resistive memory cell is deemed to be in a reset state by a sense circuitry. The minimum deep reset resistance defines the minimum resistance above which a resistive memory cell is deemed to be in a deep reset state, i.e., has a high enough resistance value that does not warrant further attempts to increase the resistance of the resistive memory cell. In other words, the first subset of resistive memory cells includes all resistive memory cells that warrant, i.e., justify, further attempts to increase the resistance through application of additional programming pulses.

Referring to step 130, additional programming pulses (e.g., positive reset pulses) can be applied to the resistive memory cells within the first subset to increase resistance of the resistive memory cells within the first subset. Details of the additional programming pulses that can be applied at step 130 are described in a subsequent section. More than 90%, 99%, 99.9%, 99.99%, 99.999%, and/or 99.9999% of all resistive memory cells within the group of resistive memory cells selected at step 110 can be in a deep reset state after application of the additional programming pulses at step 130. Any remainder of the resistive memory cells within the selected group, if present, may be in a shallow reset state, which corresponds to cases in which the reset resistance cannot be increased above the minimum deep reset resistance because of inherent structural defect of the corresponding resistive memory cell(s).

Referring to step 140, data can be stored in the group of resistive memory cells by programming selected resistive memory cells into set states. For example, if the data includes 1's and 0's, the group of resistive memory cells can be programmed such that each reset state corresponds to a data value of 1 and each set state corresponds to a data value of 0, or vice versa. The selection of resistive memory cells to be programmed may corresponds to the "0" values in the data to be stored, or may correspond to the "1" values in the data to be stored. Correspondingly, a set operation is performed on each resistive memory cell that is selected to store the data corresponding to the set state (which may be the "1" data value or the "0" data value depending on the convention employed to store the data). Specifically, a negative voltage pulse (i.e., a voltage pulse that applies a negative voltage to the second electrode 90 relative to the first electrode 30) to the resistive memory cells that are selected for programming into a set state.

Referring to step 150, a second subset of resistive memory cells having a higher resistance than a maximum set resistance is identified among the resistive memory cells that are programmed into the set states at step 140. The maximum set resistance may be the same as, or may be lower than, the threshold resistance above which a resistive memory cell is deemed to be in a set state by a sense circuitry. In one embodiment, the maximum set resistance can be a maximum deep set resistance, which is lower than the threshold resistance above which a resistive memory cell is deemed to be in a set state by a sense circuitry. The maximum deep set resistance defines the maximum resistance below which a resistive memory cell is deemed to be in a deep set state, i.e., has a low enough resistance value that does not warrant further attempts to decrease the resistance of the resistive memory cell. In other words, the second subset of resistive memory cells includes all resistive memory cells that warrant, i.e., justify, further attempts to decrease the resistance through application of additional programming pulses.

Referring to step 160, additional programming pulses can be applied to the resistive memory cells within the second subset to decrease resistance of the resistive memory cells within the second subset. Details of the additional programming pulses that can be applied at step 160 are described in a subsequent section. More than 90%, 99%, 99.9%, 99.99%, 99.999%, and/or 99.9999% of all resistive memory cells on which an initial programming pulse for a set operation is applied at step 140 can be in a deep set state after application of additional programming pluses at step 160. Any remainder of the resistive memory cells within the second subset, if present, may be in a shallow set state, which corresponds to cases in which the set resistance cannot be decreased below the maximum deep set resistance because of inherent structural defect of the corresponding resistive memory cell(s).

According to another aspect of the present disclosure, a positive corrective bias voltage pulse can be applied to any set of resistive memory cells that do not exhibit sufficiently high resistance after application of an initial positive programming bias voltage pulse in a reset programming operation. For example, a set of resistive memory cells that do not exhibit sufficiently high resistance after application of an initial positive programming bias voltage pulse can be identified at step 120 in the flowchart of FIG. 22. Such application of positive corrective bias pulses can be effected by a control program that controls the sense circuitry. In an illustrative example, a subset of resistive memory cells having a resistance that is lower than a predetermined minimum reset resistance can be identified and selected, for example, as in step 120 in the flowchart of FIG. 22, after applying a respective positive bias voltage pulse to a respective second electrode 90 during a first step of the reset operation, which can occur, for example, at step 110 in FIG. 22.

Figure 23:
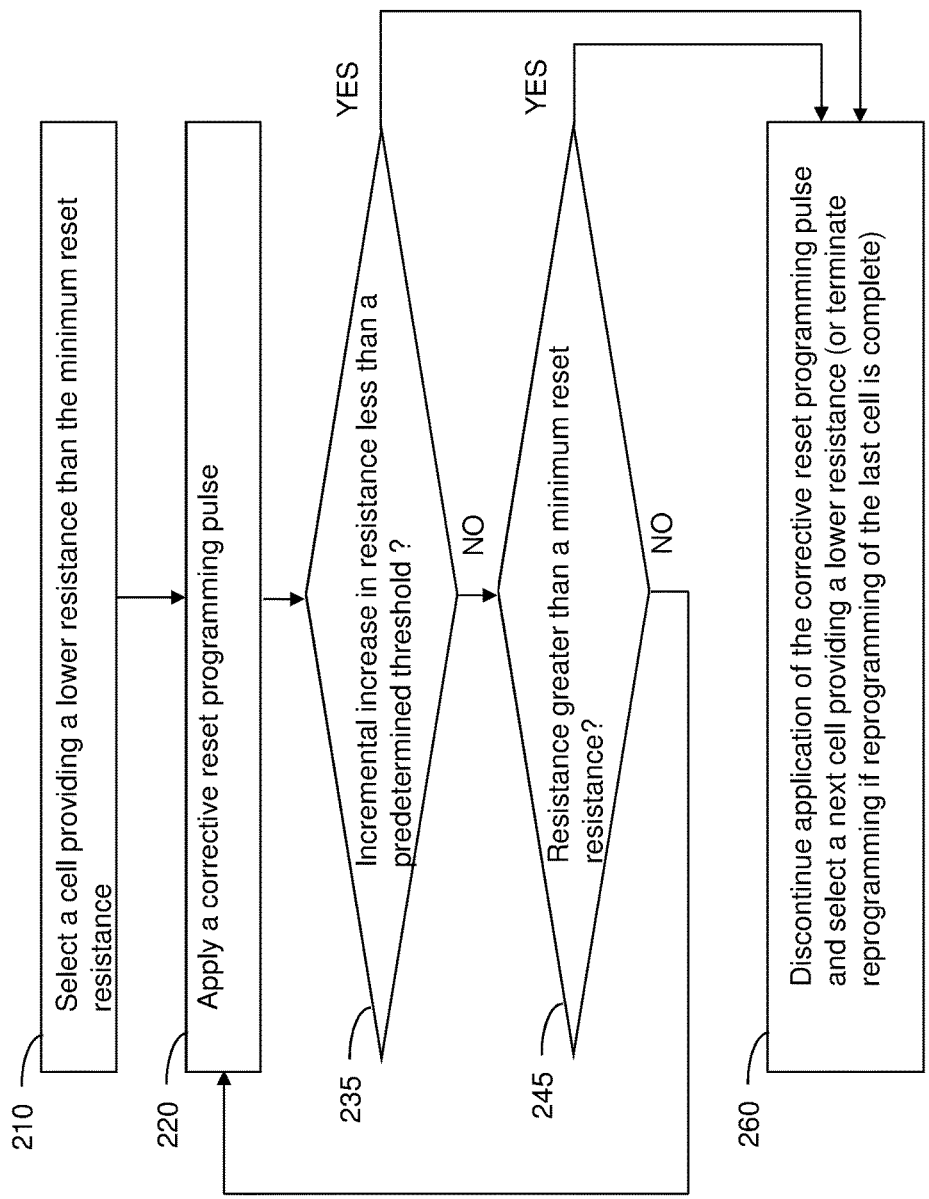
FIG. 23 is a flow chart for a first exemplary method of repeatedly applying a corrective reset programming pulse according to an embodiment of the present disclosure.

FIG. 23 illustrates a processing sequence for such cases. Referring to step 210, a resistive memory cell having a lower resistance than the minimum reset resistance is selected for application of additional reset programming pulses. The selected resistive memory cell may be any one of the resistive memory cells within the first subset of resistive memory cells as identified at step 120 in FIG. 22.

Referring to step 220 of FIG. 23, a positive corrective bias voltage pulse can be applied to the respective second electrode 90 at least once during a second step of each reset operation for each resistive memory cell within the selected subset.

Referring to step 235, the sense circuitry can determine whether the incremental increase in resistance after application of the corrective reset programming pulse achieves a predetermined resistance target, i.e., whether the incremental increase is less than a predetermined threshold for incremental increase in resistance through application of an additional reset programming pulse. The predetermined threshold for the incremental increase can be a predetermined shift in resistance in a linear scale (for example, given in Ohms), a predetermined shift in resistance in a log scale, a predetermined percentage for change in resistance, and/or a more complex formula based on sequential changes in resistance over at least two additional reset programming pulses.

In one embodiment, more than two corrective reset programming pulses can be applied, and a first incremental increase in resistance after a first corrective reset programming pulse can be compared with a second incremental increase in resistance after a second corrective reset programming pulse. In this case, the second incremental increase can be compared with the first incremental increase. If the second incremental increase is at least a predetermined percentage of the first incremental increase (for example, 80%, 65%, 50%, or 35%), another corrective reset programming pulse can be applied. Otherwise, application of the corrective reset programming pulse can be discontinued.

If the incremental increase in resistance after application of the corrective reset programming pulse does not achieve the predetermined resistance target (i.e., less than the predetermined threshold), application of the additional reset programming pulse to the selected resistive memory cell is deemed to be ineffective, and the process flow proceeds to step 260. If the incremental increase in resistance after application of the corrective reset programming pulse achieves the predetermined resistance target (i.e., more than the predetermined threshold), application of the additional reset programming pulse to the selected resistive memory cell is deemed to be potentially effective, and the process flow proceeds to step 245.

At step 245, the sense circuitry determines whether the most recently measured resistance is greater than a minimum reset resistance, which can be the minimum deep reset resistance. If the most recently measured resistance is greater than a minimum reset resistance, then application of more corrective reset programming pulses is deemed to be unnecessary, and the process flow proceeds to step 260. If the most recently measured resistance is less than the minimum reset resistance, then application of more corrective reset programming pulses is deemed to be necessary, and the process flow proceeds to step 220.

At step 260, application of the corrective reset programming pulse is discontinued, and a next cell providing a lower reset resistance than the minimum reset resistance can be selected, for example, from the first subset of resistive memory cells as provided at step 120 of FIG. 22. Alternatively, the reprogramming sequence can be terminated if the previously selected resistive memory cell is the last resistive memory cell that is subjected to reprogramming through application of the corrective reset programming pulses.

Figure 24:
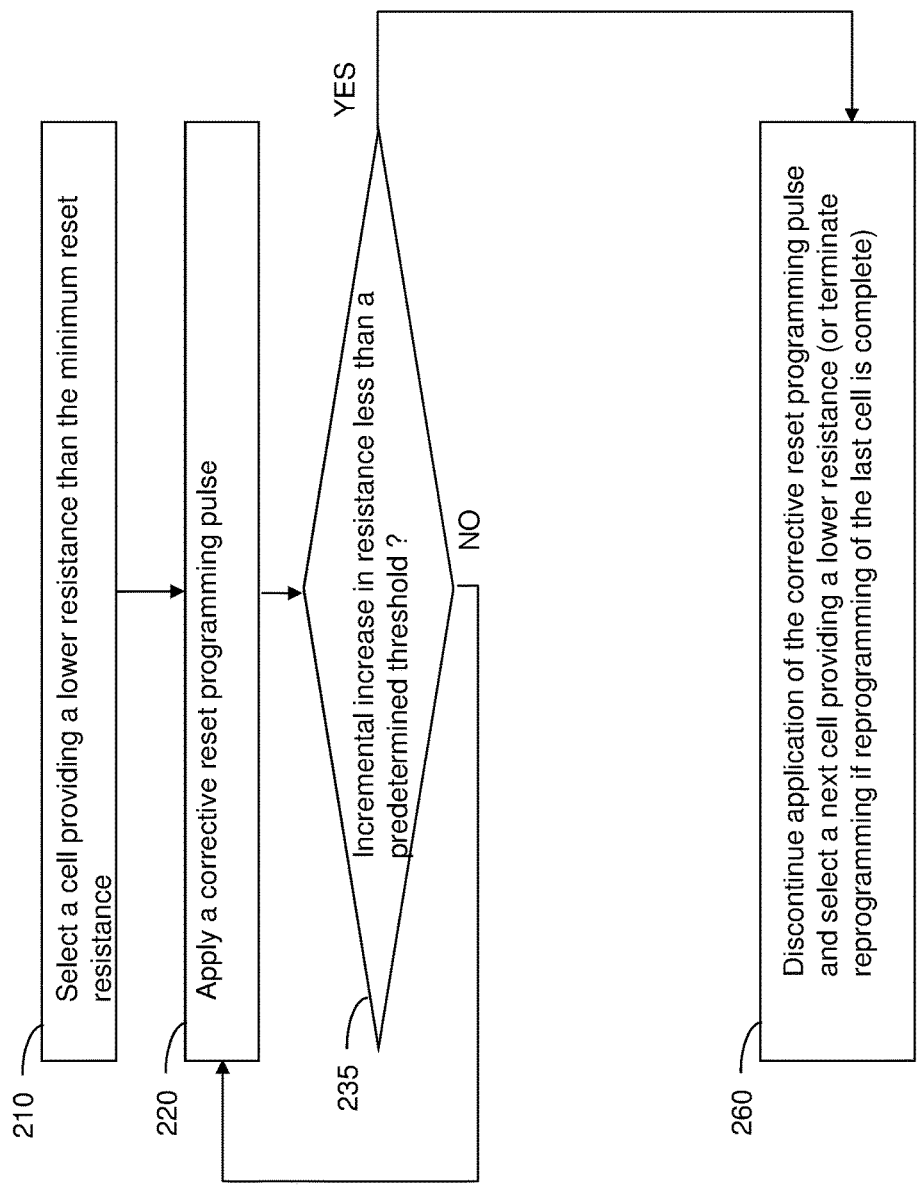
FIG. 24 is a flow chart for a second exemplary method of repeatedly applying a corrective reset programming pulse according to an embodiment of the present disclosure.

Referring to FIG. 24, a modified flow chart is illustrated, which is derived from the flow chart of FIG. 23 by removing step 245. In this case, the criterion employed at step 235 may be the sole criterion for determining whether to continue or discontinue application of additional corrective reset programming pulses.

Generally, the positive corrective bias voltage pulse may be applied to the second electrode 90 (with respect to the first electrode 30) multiple times for each resistive memory cell within the selected subset, i.e., for each resistive memory cell that provides a resistance that is lower than a minimum reset resistance after an initial programming pulse for reset programming. Unlike the incremental step pulse programming (ISPP) methods, the magnitude and the duration of the positive corrective bias voltage pulse can be the same throughout application of the positive corrective bias voltage pulses. Thus, the energy applied to the resistive memory cell can be the same for each application of the positive corrective bias voltage pulse, and breakdown of the resistive memory cell can be avoided. Thus, the methods of present disclosure protect the resistive memory cells from breakdown through application of excess energy, which can occur during the ISPP method.

In this case, resistance of each resistive memory cell within the selected subset can be measured across the respective first electrode 30 and the respective second electrode 90 after each application of the positive corrective bias voltage for each resistive memory cell within the selected subset. An incremental increase in resistance can be determined for each measured value of resistance relative to an immediately preceding measured value of resistance for each resistive memory cell within the selected subset. In other words, increase in resistance caused by each round of application of the positive corrective bias voltage can be measured for each resistive memory cell within the selected subset.

If a resistive memory cell within the selected subset achieves a predetermined resistance target, application of the positive corrective bias voltage pulses can be discontinued for such a resistive memory cell. For example, the sense circuitry can determine whether the incremental increase in resistance is less than a predetermined threshold for incremental increase in resistance (which defines a minimum improvement in resistance that is a necessary condition for continued application of additional positive corrective bias voltage pulses) after each application of the positive corrective bias voltage pulse for each resistive memory cell within the selected subset. Additionally or alternatively, the sense circuitry can determine whether resistance as measured after application of the positive corrective bias voltage is higher than a minimum reset resistance for each resistive memory cell within the selected subset, i.e., whether the newly measured resistance value is higher than the minimum reset resistance which is a criterion for determining whether the reset programming is satisfactorily performed or not.

In one embodiment, application of the positive corrective bias voltage can be discontinued if the incremental increase in resistance is less than a predetermined threshold for incremental increase in resistance (i.e., the increase in resistance through the previously applied positive corrective bias voltage pulse is insignificant and further application of the positive corrective bias voltage is likely to be futile) and/or if the resistance as measured after application of the positive corrective bias voltage is greater than a minimum reset resistance for each resistive memory cell within the selected subset (i.e., the reset resistance is already high enough and there is no need for continued application of the positive corrective bias voltage pulses).

According to another aspect of the present disclosure, a negative corrective bias voltage pulse can be applied to a subset of resistive memory cells that do not exhibit sufficiently high resistance after application of an initial negative programming bias voltage pulse in any set programming operation. For example, the negative corrective bias voltage pulse can be applied to the resistive memory cells in the second subset generated at step 150 in the flow chart of FIG. 22. Such application of negative corrective bias pulses can be effected by a control program that controls the sense circuitry. In an illustrative example, a subset of resistive memory cells having a resistance that is higher than a predetermined maximum set resistance can be identified and selected, for example, as in step 150 in the flow chart of FIG. 22, after applying a respective negative bias voltage pulse to a respective second electrode 90 during a first step of the set operation, which can occur, for example, at step 140 in the flowchart of FIG. 22.

Figure 25:
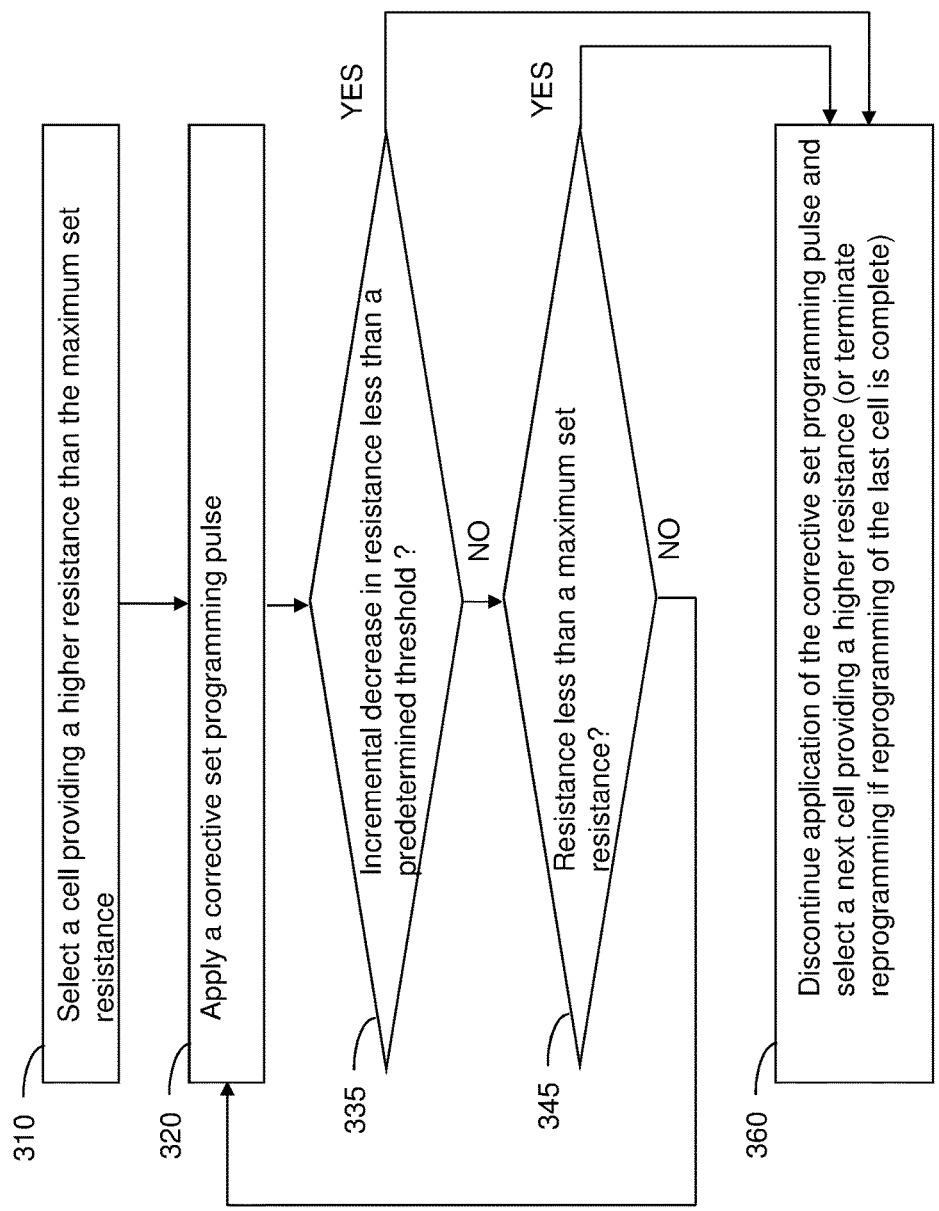
FIG. 25 is a flow chart for a first exemplary method of repeatedly applying a corrective set programming pulse according to an embodiment of the present disclosure.

FIG. 25 illustrates a processing sequence for such cases. Referring to step 310, a resistive memory cell having a higher resistance than the maximum set resistance is selected for application of additional set programming pulses. The selected resistive memory cell may be any one of the resistive memory cells within the second subset of resistive memory cells as identified at step 150 in FIG. 22.

Referring to step 320 of FIG. 25, a negative corrective bias voltage pulse can be applied to the respective second electrode 90 at least once during a second step of each set operation for each resistive memory cell within the selected subset.

Referring to step 335, the sense circuitry can determine whether the incremental decrease in resistance after application of the corrective set programming pulse achieves a predetermined resistance target, i.e., whether the incremental decrease is less than a predetermined threshold for incremental decrease in resistance through application of an additional set programming pulse. The predetermined threshold for the incremental decrease can be a predetermined shift in resistance in a linear scale (for example, given in Ohms), a predetermined shift in resistance in a log scale, a predetermined percentage for change in resistance, and/or a more complex formula based on sequential changes in resistance over at least two additional set programming pulses.

In one embodiment, more than two corrective set programming pulses can be applied, and a first incremental decrease in resistance after a first corrective set programming pulse can be compared with a second incremental decrease in resistance after a second corrective reset programming pulse. In this case, the second incremental decrease can be compared with the first incremental decrease. If the second incremental decrease is at least a predetermined percentage of the first incremental decrease (for example, 80%, 65%, 50%, or 35%), another corrective set programming pulse can be applied. Otherwise, application of the corrective set programming pulse can be discontinued.

If the incremental decrease in resistance after application of the corrective set programming pulse does not achieve the predetermined resistance target (i.e., less than the predetermined threshold), application of the additional set programming pulse to the selected resistive memory cell is deemed to be ineffective, and the process flow proceeds to step 360. If the incremental decrease in resistance after application of the corrective set programming pulse achieves the predetermined resistance target (i.e., more than the predetermined threshold), application of the additional set programming pulse to the selected resistive memory cell is deemed to be potentially effective, and the process flow proceeds to step 345.

At step 345, the sense circuitry determines whether the most recently measured resistance is smaller than a maximum set resistance, which can be the maximum deep set resistance. If the most recently measured resistance is smaller than a maximum set resistance, then application of more corrective set programming pulses is deemed to be unnecessary, and the process flow proceeds to step 360. If the most recently measured resistance is less than the maximum set resistance, then application of more corrective set programming pulses is deemed to be necessary, and the process flow proceeds to step 320.

At step 360, application of the corrective set programming pulse is discontinued, and a next cell providing a lower set resistance than the maximum set resistance can be selected, for example, from the second subset of resistive memory cells as provided at step 150 of FIG. 22. Alternatively, the reprogramming sequence can be terminated if the previously selected resistive memory cell is the last resistive memory cell that is subjected to reprogramming through application of the corrective set programming pulses.

Figure 26:
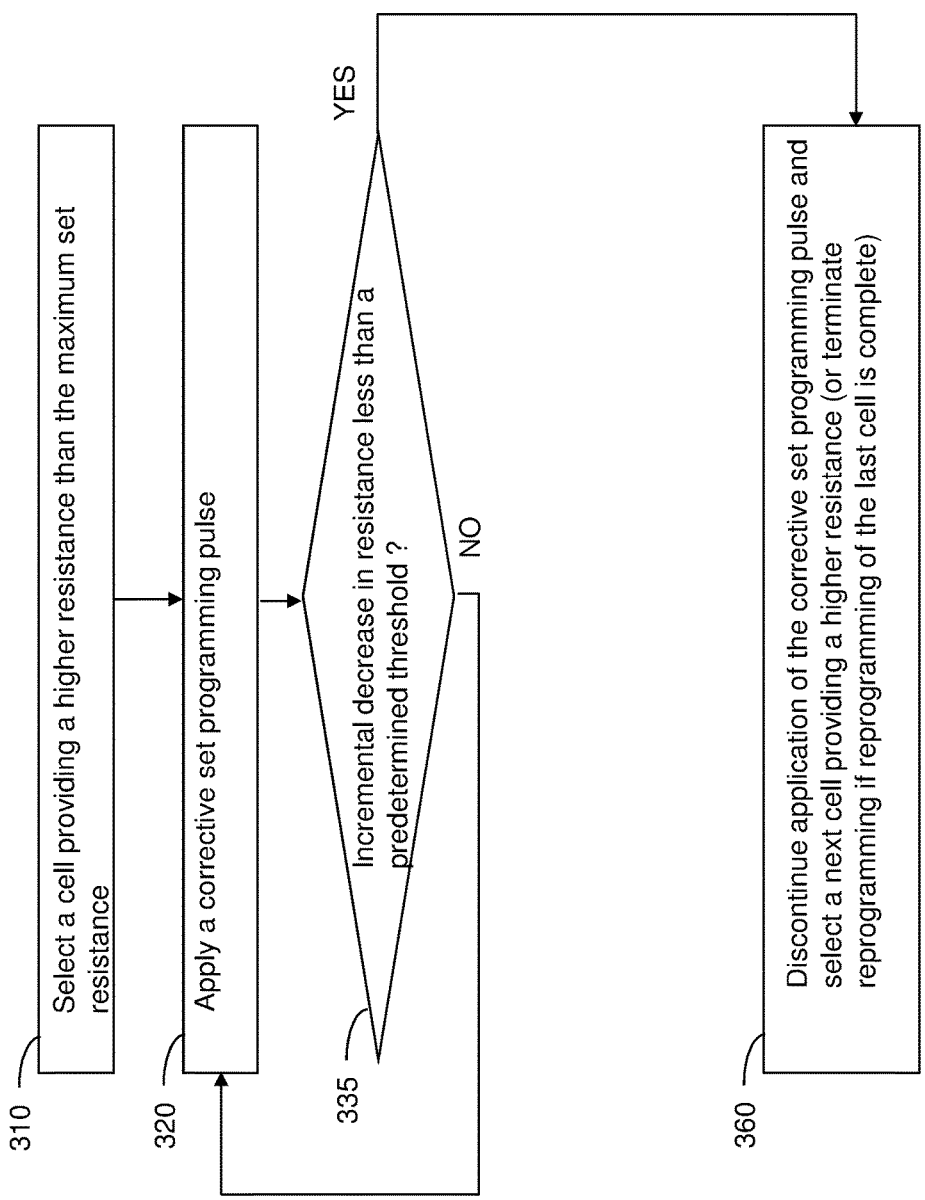
FIG. 26 is a flow chart for a second exemplary method of repeatedly applying a corrective set programming pulse according to an embodiment of the present disclosure.

Referring to FIG. 26, a modified flow chart is illustrated, which is derived from the flow chart of FIG. 25 by removing step 345. In this case, the criterion employed at step 335 may be the sole criterion for determining whether to continue or discontinue application of additional corrective set programming pulses.

Generally, the negative corrective bias voltage pulse may be applied to the second electrode 90 (with respect to the first electrode 30) multiple times for each resistive memory cell within the selected subset, i.e., for each resistive memory cell that provides a resistance that is higher than a maximum set resistance after an initial programming pulse for set programming. Unlike the incremental step pulse programming (ISPP) methods, the magnitude and the duration of the negative corrective bias voltage pulse can be the same throughout application of the negative corrective bias voltage pulses. Thus, the energy applied to the resistive memory cell can be the same for each application of the negative corrective bias voltage pulse, and breakdown of the resistive memory cell can be avoided. Thus, the methods of present disclosure protect the resistive memory cells from breakdown through application of excess energy, which can occur during the ISPP method.

In this case, resistance of each resistive memory cell within the selected subset can be measured across the respective first electrode 30 and the respective second electrode 90 after each application of the negative corrective bias voltage for each resistive memory cell within the selected subset. An incremental decrease in resistance can be determined for each measured value of resistance relative to an immediately preceding measured value of resistance for each resistive memory cell within the selected subset. In other words, decrease in resistance caused by each round of application of the negative corrective bias voltage can be measured for each resistive memory cell within the selected subset.

If a resistive memory cell within the selected subset achieves a predetermined resistance target, application of the negative corrective bias voltage pulses can be discontinued for such a resistive memory cell. For example, the sense circuitry can determine whether the incremental decrease in resistance is less than a predetermined threshold for incremental decrease in resistance (which defines a minimum improvement in resistance that is a necessary condition for continued application of additional negative corrective bias voltage pulses) after each application of the negative corrective bias voltage pulse for each resistive memory cell within the selected subset. Additionally or alternatively, the sense circuitry can determine whether resistance as measured after application of the negative corrective bias voltage is lower than a maximum set resistance for each resistive memory cell within the selected subset, i.e., whether the newly measured resistance value is lower than the maximum set resistance which is a criterion for determining whether the set programming is satisfactorily performed or not.

In one embodiment, application of the negative corrective bias voltage can be discontinued if the incremental decrease in resistance is less than a predetermined threshold for incremental decrease in resistance (i.e., the decrease in resistance through the previously applied negative corrective bias voltage pulse is insignificant and further application of the negative corrective bias voltage is likely to be futile) and/or if the resistance as measured after application of the negative corrective bias voltage is less than a maximum set resistance for each resistive memory cell within the selected subset (i.e., the set resistance is already low enough and there is no need for continued application of the negative corrective bias voltage pulses).

In some embodiment, an initializing reset operation can be performed on each resistive memory cell within the array prior to performing the reset operations on the first plurality of resistive memory cells and prior to performing the set operations on the second plurality of resistive memory cells. Such a global reset operation can be performed, for example, prior to performing step 110 in the flow chart of FIG. 22 in order to initialize each resistive memory cell within the array. Alternatively, such a global reset operation may replace steps 110-130 in the flow chart of FIG. 22.

In some embodiments, an initializing reset operation can be performed on at least some, such as on all resistive memory cells in the array that are not in active use for storage of data in a background operation while a subset of the array is employed to store data. In this case, the extent of the initializing operation can be limited to a subset of data blocks that are not in active use for storage of data.

In some embodiments, an initializing reset operation can be periodically performed on each resistive memory cell within the array at a predetermined time interval that is in a range from 1 hour to 336 hours (2 weeks). In this case, data stored in the array can be temporarily stored in a data buffer (which may be located inside a memory chip or outside the memory chip that contains the array of resistive memory cells), for example, block by block, and can be re-written after the initializing reset operation block by block. In this case, the initializing reset operation may be performed block by block.

The methods of the present disclosure can be employed to prolonging on-off cycling by avoiding cycling failures. Reliance on incremental step pulse programming is optional, and may be eliminated in some embodiments. If incremental step pulse programming is not employed, on-off operations can be sped up. Further, retention characteristic can be maximized through use of deepest reset. Thus, the methods of the present disclosure can enhance both endurance and retention.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A resistive memory cell, comprising:
    a barrier material layer containing at least one of silicon and germanium; and
    a metal oxide layer including an oxide of a metal element that provides a reversible chemical reaction under a bidirectional electrical bias at an interface with the barrier material layer, wherein the reversible chemical reaction is selected from silicidation reaction between the barrier layer and the metal element, germanidation reaction between the barrier material layer and the metal element, oxidation of the metal element, and reduction of the metal element,
wherein:
    the barrier material layer comprises germanium; and
    the metal oxide layer includes nickel oxide.

2. The resistive memory cell of claim 1, wherein the metal element is nickel.

3. The resistive memory cell of claim 1, wherein the reversible chemical reaction comprises:
    a forward endothermic chemical reaction in which the memory cell transitions into a high resistance state under an electrical field from the metal oxide layer toward the barrier material layer; and
    a reverse exothermic chemical reaction in which the memory cell transitions into a low resistance state under an electrical field from the barrier material layer to the metal oxide layer.

4. The resistive memory cell of claim 3, further comprising:
    a first electrode electrically connected to the barrier material layer and spaced from the metal oxide layer by the barrier material layer; and
    a second electrode electrically connected to the metal oxide layer and spaced from the barrier material layer by the metal oxide layer,
wherein:
    a positive bias voltage pulse applied to the second electrode relative to the first electrode induces the high resistance state of the memory cell; and
    a negative bias voltage pulse applied to the second electrode relative to the first electrode induces the low resistance state of the memory cell.

5. The resistive memory cell of claim 1, wherein the memory cell is configured to be programmed by:
    performing a reset operation that induces a high resistance state on a first plurality of resistive memory cell within the array at least by applying a positive bias voltage pulse to the respective second electrode relative to the respective first electrode; and
    performing a set operation that induces a low resistance state on a second plurality of resistive memory cells within the array at least by applying a negative bias voltage pulse to the respective second electrode relative to the respective first electrode,
    wherein an integral of an amplitude the positive bias voltage pulse over time has a greater absolute value than an integral of an amplitude of the negative bias voltage pulse over time.

6. The resistive memory cell of claim 1, wherein a forward chemical reaction of the reversible chemical reaction is germanidation.

7. A method of operating an array of resistive memory cells, comprising:
    providing an array of resistive memory cells, wherein each resistive memory cell within the array comprises a barrier material layer containing at least one of silicon or germanium electrically connected to a respective first electrode, and a metal oxide layer including an oxide of a metal element that provides a reversible chemical reaction under a bidirectional electrical bias at an interface with the barrier material layer electrically connected to a respective second electrode, wherein the reversible chemical reaction is selected from silicidation reaction between the barrier material layer and the metal element, germanidation reaction between the barrier material layer and the metal element, oxidation of the metal element, and reduction of the metal element;
    performing a reset operation that induces a high resistance state on a first plurality of resistive memory cells within the array at least by applying a positive bias voltage pulse to the respective second electrode relative to the respective first electrode;
    performing a set operation that induces a low resistance state on a second plurality of resistive memory cells within the array at least by applying a negative bias voltage pulse to the respective second electrode relative to the respective first electrode;
    selecting a subset of resistive memory cells having a resistance that is lower than a predetermined minimum reset resistance after applying a respective positive bias voltage pulse to a respective second electrode;
    applying a positive corrective bias voltage pulse to the respective second electrode at least once during each reset operation for each resistive memory cell within the selected subset of resistive memory cells, wherein the positive corrective bias voltage pulse is applied to the second electrode multiple times for each resistive memory cell within the selected subset;
    measuring the resistance of the memory cell after each application of the positive corrective bias voltage for each resistive memory cell within the selected subset;
    determining an incremental increase in the resistance of the memory cell for each measured value of the resistance of the memory cell relative an immediately preceding measured value of the resistance of the memory cell for each resistive memory cell within the selected subset;

determining whether the incremental increase in resistance is less than a predetermined threshold for incremental increase in resistance after each application of the positive corrective bias voltage pulse for each resistive memory cell within the selected subset;

determining whether resistance as measured after application of the positive corrective bias voltage is greater than a minimum reset resistance for each resistive memory cell within the selected subset; and discontinuing application of the positive corrective bias voltage if the incremental increase in resistance is less than a predetermined threshold for incremental increase in resistance and if the resistance as measured after application of the positive corrective bias voltage is greater than a minimum reset resistance for each resistive memory cell within the selected subset, wherein at least one of an absolute value of amplitude and duration of the positive bias voltage pulses employed during the reset operation is greater than that employed during the set operation.

8. The method of claim 7, wherein the reversible chemical reaction comprises:
a forward endothermic chemical reaction in which the memory cell transitions into a high resistance state under an electrical field from the metal oxide layer toward the barrier material layer; and
a reverse exothermic chemical reaction in which the memory cell transitions into a low resistance state under an electrical field from the barrier material layer to the metal oxide layer.

9. The method claim 8, further comprising:
a first electrode electrically connected to the barrier material layer and spaced from the metal oxide layer by the barrier material layer; and
a second electrode electrically connected to the metal oxide layer and spaced from the barrier material layer by the metal oxide layer,
wherein:
the positive bias voltage pulse applied to the second electrode relative to the first electrode induces the high resistance state of the memory cell; and
the negative bias voltage pulse applied to the second electrode relative to the first electrode induces the low resistance state of the memory cell.

10. The method claim 7, wherein:
the barrier material layer comprises silicon;
the metal oxide layer includes a material selected from cobalt oxide, nickel oxide, and vanadium oxide; and
a forward chemical reaction of the reversible chemical reaction is silicidation.

11. The method claim 7, wherein:
the barrier material layer comprises germanium;
the metal oxide layer includes a material selected from titanium oxide, cobalt oxide, nickel oxide, and vanadium oxide; and
a forward chemical reaction of the reversible chemical reaction is germanidation.

12. The method of claim 7, further comprising performing an initializing reset operation on each resistive memory cell within the array prior to performing the reset operations on the first plurality of resistive memory cells and prior to performing the set operations on the second plurality of resistive memory cells.

13. The method of claim 7, further comprising performing an initializing reset operation on at least some resistive memory cells in the array that are not in active use for storage of data in a background operation while a subset of the array is employed to store data.

14. The method of claim 7, further comprising periodically performing an initializing reset operation on each resistive memory cell within the array at a predetermined time interval that is in a range from 1 hour to 336 hours.

15. The method of claim 7, wherein an integral of an amplitude the positive bias voltage pulse over time has a greater absolute value than an integral of an amplitude of the negative bias voltage pulse over time.

16. A method of operating an array of resistive memory cells, comprising:
providing an array of resistive memory cells, wherein each resistive memory cell within the array comprises a barrier material layer containing at least one of silicon or germanium electrically connected to a respective first electrode, and a metal oxide layer including an oxide of a metal element that provides a reversible chemical reaction under a bidirectional electrical bias at an interface with the barrier material layer electrically connected to a respective second electrode, wherein the reversible chemical reaction is selected from silicidation reaction between the barrier material layer and the metal element, germanidation reaction between the barrier material layer and the metal element, oxidation of the metal element, and reduction of the metal element;
performing a reset operation that induces a high resistance state on a first plurality of resistive memory cells within the array at least by applying a positive bias voltage pulse to the respective second electrode relative to the respective first electrode;
performing a set operation that induces a low resistance state on a second plurality of resistive memory cells within the array at least by applying a negative bias voltage pulse to the respective second electrode relative to the respective first electrode;
selecting a subset of resistive memory cells having a resistance that is higher than a predetermined maximum set resistance after applying a respective negative bias voltage pulse to a respective second electrode;
applying a negative corrective bias voltage pulse to the respective second electrode at least once during each set operation for each resistive memory cell within the selected subset, wherein the negative corrective bias voltage pulse is applied to the second electrode multiple times for each resistive memory cell within the selected subset;
measuring the resistance of the memory cell after each application of the negative corrective bias voltage for each resistive memory cell within the selected subset;
determining an incremental decrease in the resistance of the memory cell for each measured value of the resistance of the memory cell relative an immediately preceding measured value of the resistance of the memory cell for each resistive memory cell within the selected subset of resistive memory cells;
determining whether the incremental decrease in resistance is less than a predetermined threshold for incremental decrease in resistance after each application of the positive corrective bias voltage pulse for each resistive memory cell within the selected subset;
determining whether resistance as measured after application of the negative corrective bias voltage is less than a maximum set resistance for each resistive memory cell within the selected subset; and discontinuing application of the positive corrective bias voltage if the incremental decrease in resistance is less than a predetermined threshold for incremental decrease in resistance and if the resistance as measured after application of the negative corrective bias voltage is less than a maximum set resistance for each resistive memory cell within the selected subset, wherein at least one of an absolute value of amplitude and duration of the positive bias voltage pulses employed during the reset operation is greater than that employed during the set operation.

17. A method of operating an array of resistive memory cells, comprising:

providing an array of resistive memory cells, wherein each resistive memory cell within the array comprises a barrier material layer containing at least one of silicon or germanium electrically connected to a respective first electrode, and a metal oxide layer including an oxide of a metal element that provides a reversible chemical reaction under a bidirectional electrical bias at an interface with the barrier material layer electrically connected to a respective second electrode, wherein the reversible chemical reaction is selected from silicidation reaction between the barrier material layer and the metal element, germanidation reaction between the barrier material layer and the metal element, oxidation of the metal element, and reduction of the metal element;

performing a reset operation that induces a high resistance state on a first plurality of resistive memory cells within the array at least by applying a positive bias voltage pulse to the respective second electrode relative to the respective first electrode;

performing a set operation that induces a low resistance state on a second plurality of resistive memory cells within the array at least by applying a negative bias voltage pulse to the respective second electrode relative to the respective first electrode; and performing an initializing reset operation selected from at least one of:

performing the initializing reset operation on at least some resistive memory cells in the array that are not in active use for storage of data in a background operation while a subset of the array is employed to store data; or periodically performing the initializing reset operation on each resistive memory cell within the array at a predetermined time interval that is in a range from 1 hour to 336 hours, wherein at least one of an absolute value of amplitude and duration of the positive bias voltage pulses employed during the reset operation is greater than that employed during the set operation.

18. The method of claim 17, further comprising:

selecting a subset of resistive memory cells having a resistance that is lower than a predetermined minimum reset resistance after applying a respective positive bias voltage pulse to a respective second electrode;

applying a positive corrective bias voltage pulse to the respective second electrode at least once during each reset operation for each resistive memory cell within the selected subset of resistive memory cells, wherein the positive corrective bias voltage pulse is applied to the second electrode multiple times for each resistive memory cell within the selected subset;

measuring the resistance of the memory cell after each application of the positive corrective bias voltage for each resistive memory cell within the selected subset;

determining an incremental increase in the resistance of the memory cell for each measured value of the resistance of the memory cell relative an immediately preceding measured value of the resistance of the memory cell for each resistive memory cell within the selected subset;

determining whether the incremental increase in resistance is less than a predetermined threshold for incremental increase in resistance after each application of the positive corrective bias voltage pulse for each resistive memory cell within the selected subset;

determining whether resistance as measured after application of the positive corrective bias voltage is greater than a minimum reset resistance for each resistive memory cell within the selected subset; and discontinuing application of the positive corrective bias voltage if the incremental increase in resistance is less than a predetermined threshold for incremental increase in resistance and if the resistance as measured after application of the positive corrective bias voltage is greater than a minimum reset resistance for each resistive memory cell within the selected subset.

19. The method of claim 17, further comprising:

selecting a subset of resistive memory cells having a resistance that is higher than a predetermined maximum set resistance after applying a respective negative bias voltage pulse to a respective second electrode;

applying a negative corrective bias voltage pulse to the respective second electrode at least once during each set operation for each resistive memory cell within the selected subset, wherein the negative corrective bias voltage pulse is applied to the second electrode multiple times for each resistive memory cell within the selected subset;

measuring the resistance of the memory cell after each application of the negative corrective bias voltage for each resistive memory cell within the selected subset;

determining an incremental decrease in the resistance of the memory cell for each measured value of the resistance of the memory cell relative an immediately preceding measured value of the resistance of the memory cell for each resistive memory cell within the selected subset of resistive memory cells;

determining whether the incremental decrease in resistance is less than a predetermined threshold for incremental decrease in resistance after each application of the positive corrective bias voltage pulse for each resistive memory cell within the selected subset;

determining whether resistance as measured after application of the negative corrective bias voltage is less than a maximum set resistance for each resistive memory cell within the selected subset; and discontinuing application of the positive corrective bias voltage if the incremental decrease in resistance is less than a predetermined threshold for incremental decrease in resistance and if the resistance as measured after application of the negative corrective bias voltage is less than a maximum set resistance for each resistive memory cell within the selected subset.

20. The method of claim 17, wherein the reversible chemical reaction comprises:

a forward endothermic chemical reaction in which the memory cell transitions into a high resistance state under an electrical field from the metal oxide layer toward the barrier material layer; and a reverse exothermic chemical reaction in which the memory cell transitions into a low resistance state under an electrical field from the barrier material layer to the metal oxide layer.

21. The method claim 20, further comprising:

a first electrode electrically connected to the barrier material layer and spaced from the metal oxide layer by the barrier material layer; and a second electrode electrically connected to the metal oxide layer and spaced from the barrier material layer by the metal oxide layer, wherein:

the positive bias voltage pulse applied to the second electrode relative to the first electrode induces the high resistance state of the memory cell; and the negative bias voltage pulse applied to the second electrode relative to the first electrode induces the low resistance state of the memory cell.

22. The method claim 17, wherein:

the barrier material layer comprises silicon;

the metal oxide layer includes a material selected from cobalt oxide, nickel oxide, and vanadium oxide; and a forward chemical reaction of the reversible chemical reaction is silicidation.

23. The method claim 17, wherein:

the barrier material layer comprises germanium;

the metal oxide layer includes a material selected from titanium oxide, cobalt oxide, nickel oxide, and vanadium oxide; and a forward chemical reaction of the reversible chemical reaction is germanidation.

24. The method of claim 17, wherein an integral of an amplitude the positive bias voltage pulse over time has a greater absolute value than an integral of an amplitude of the negative bias voltage pulse over time.

25. The method of claim 17, wherein performing the initializing reset operation comprises performing the initializing reset operation on at least some resistive memory cells in the array that are not in active use for storage of data in the background operation while the subset of the array is employed to store data.

26. The method of claim 17, wherein performing the initializing reset operation comprises periodically performing the initializing reset operation on each resistive memory cell within the array at the predetermined time interval that is in the range from 1 hour to 336 hours.

27. The method of claim 17, wherein an integral of an amplitude the positive bias voltage pulse over time has a greater absolute value than an integral of an amplitude of the negative bias voltage pulse over time.

* * * * *